(12) United States Patent
Kurokawa

(10) Patent No.: US 10,582,141 B2
(45) Date of Patent: Mar. 3, 2020

(54) IMAGING DEVICE AND ELECTRONIC DEVICE

(71) Applicant: Semiconductor Energy Laboratory Co., Ltd., Kanagawa-ken (JP)

(72) Inventor: Yoshiyuki Kurokawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 16/540,343

(22) Filed: Aug. 14, 2019

(65) Prior Publication Data

US 2019/0373201 A1    Dec. 5, 2019

Related U.S. Application Data

(63) Continuation of application No. 15/091,752, filed on Apr. 6, 2016, now Pat. No. 10,389,961.

(30) Foreign Application Priority Data

Apr. 9, 2015    (JP) .................................. 2015-080201

(51) Int. Cl.
*H04N 5/3745*    (2011.01)
*H01L 27/146*    (2006.01)
*H04N 5/378*    (2011.01)

(52) U.S. Cl.
CPC ... *H04N 5/37452* (2013.01); *H01L 27/14616* (2013.01); *H01L 27/14636* (2013.01);
(Continued)

(58) Field of Classification Search
CPC ........... H04N 5/37452; H04N 5/37455; H04N 5/378; H04N 5/3745; H01L 27/146;
(Continued)

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

EP    1737044 A    12/2006
EP    2226847 A    9/2010
(Continued)

OTHER PUBLICATIONS

Aslam-Siddiqi.A et al., "A 16 + 16 Nonvolatile Programmable Analog Vector-Matrix Multiplier", IEEE Journal of Solid-State Circuits, Oct. 1, 1998, vol. 33, No. 10, pp. 1502-1509.
(Continued)

*Primary Examiner* — Pritham D Prabhakher
(74) *Attorney, Agent, or Firm* — Husch Blackwell LLP

(57) ABSTRACT

A semiconductor device with an arithmetic processing function is provided. In the semiconductor device, an imaging portion and an arithmetic portion are electrically connected to each other through an analog processing circuit 24. The imaging portion includes a pixel array 21 in which pixels 20 used for imaging and reference pixels 22 used for image processing are arranged in a matrix, and a row decoder 25. The arithmetic portion includes a memory element array 31 in which memory elements 30 and reference memory elements 32 are arranged in a matrix, an analog processing circuit 34, a row decoder 35, and a column decoder 36.

18 Claims, 45 Drawing Sheets

(52) U.S. Cl.
CPC .. *H01L 27/14667* (2013.01); *H01L 27/14692* (2013.01); *H04N 5/378* (2013.01); *H04N 5/37455* (2013.01)

(58) Field of Classification Search
CPC ......... H01L 27/14636; H01L 27/14616; H01L 27/14667; H01L 27/14692; H01L 27/14643; H01L 27/14609; H01L 27/14612; H01L 27/14623; H01L 29/24; H01L 29/7869; H01L 31/0272; H01L 31/0322
USPC ....................................................... 348/308
See application file for complete search history.

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,858,827 B2 | 2/2005 | Sugiyama et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,271,834 B2* | 9/2007 | Kasuga | H04N 5/335 257/E27.132 |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,356,189 B2 | 4/2008 | Kondo et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,521,656 B2 | 4/2009 | Sugiyama et al. | |
| 7,579,576 B2 | 8/2009 | Sugiyama et al. | |
| 7,674,650 B2 | 3/2010 | Akimoto et al. | |
| 7,691,715 B2* | 4/2010 | Kaji | H01L 21/02554 257/E21.005 |
| 7,732,819 B2 | 6/2010 | Akimoto et al. | |
| 7,868,283 B2* | 1/2011 | Mabuchi | H01L 27/14634 250/208.1 |
| 7,883,934 B2* | 2/2011 | Kaji | H01L 21/02554 257/E21.005 |
| 7,990,436 B2 | 8/2011 | Mabuchi | |
| 8,378,391 B2 | 2/2013 | Koyama et al. | |
| 8,916,869 B2 | 12/2014 | Koyama et al. | |
| 8,981,277 B2 | 3/2015 | He | |
| 9,008,445 B2 | 4/2015 | Murata et al. | |
| 9,087,758 B2* | 7/2015 | Mabuchi | H01L 27/14632 |
| 9,578,267 B2 | 2/2017 | Slovick et al. | |
| 9,666,626 B2* | 5/2017 | Kishi | H01L 27/14634 |
| 9,712,772 B2 | 7/2017 | Kim et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0095495 A1* | 5/2004 | Inokuma | H04N 5/2253 348/308 |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0042046 A1* | 2/2008 | Mabuchi | H01L 27/14634 250/208.1 |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0109311 A1 | 4/2009 | Mabuchi | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0276572 A1* | 11/2010 | Iwabuchi | H01L 23/481 250/208.1 |
| 2011/0101351 A1 | 5/2011 | Yamazaki | |
| 2012/0120293 A1* | 5/2012 | Mabuchi | H01L 27/14632 348/302 |
| 2012/0293698 A1* | 11/2012 | Sukegawa | H01L 27/14643 348/294 |
| 2012/0307030 A1* | 12/2012 | Blanquart | H04N 5/37455 348/76 |
| 2013/0069132 A1 | 3/2013 | Atsumi et al. | |
| 2013/0083227 A1 | 4/2013 | Murata et al. | |
| 2013/0229555 A1 | 9/2013 | Hashimoto et al. | |
| 2014/0175592 A1* | 6/2014 | Iwabuchi | H01L 23/481 257/443 |
| 2014/0313382 A1 | 10/2014 | Jang et al. | |
| 2015/0048366 A1 | 2/2015 | Koyama et al. | |

(56) References Cited

U.S. PATENT DOCUMENTS

| | | |
|---|---|---|
| 2015/0049232 A1 | 2/2015 | Kim et al. |
| 2015/0091629 A1 | 4/2015 | Ishizu et al. |
| 2015/0281613 A1 | 10/2015 | Vogelsang et al. |
| 2015/0294992 A1 | 10/2015 | Kato |
| 2015/0319386 A1* | 11/2015 | Brady .............. H01L 27/14638 348/302 |
| 2015/0332568 A1 | 11/2015 | Kurokawa |
| 2016/0021314 A1 | 1/2016 | Kurokawa et al. |
| 2016/0037106 A1 | 2/2016 | Ohmaru |
| 2016/0172410 A1 | 6/2016 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-354568 A | 12/2005 |
| JP | 2006-333493 A | 12/2006 |
| JP | 2007-096055 A | 4/2007 |
| JP | 2007-123861 A | 5/2007 |
| JP | 2011-119711 A | 6/2011 |
| JP | 2011-171702 A | 9/2011 |
| WO | WO-2004/114391 | 12/2004 |

OTHER PUBLICATIONS

Kawahito.S et al., "A CMOS Image Sensor with Analog Two-Dimensional DCT-Based Compression Circuits for One-Chip Cameras", IEEE Journal of Solid-State Circuits, Dec. 1, 1997, vol. 32, No. 12, pp. 2030-2041.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 38, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phase for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

(56) References Cited

OTHER PUBLICATIONS

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

(56) References Cited

OTHER PUBLICATIONS

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

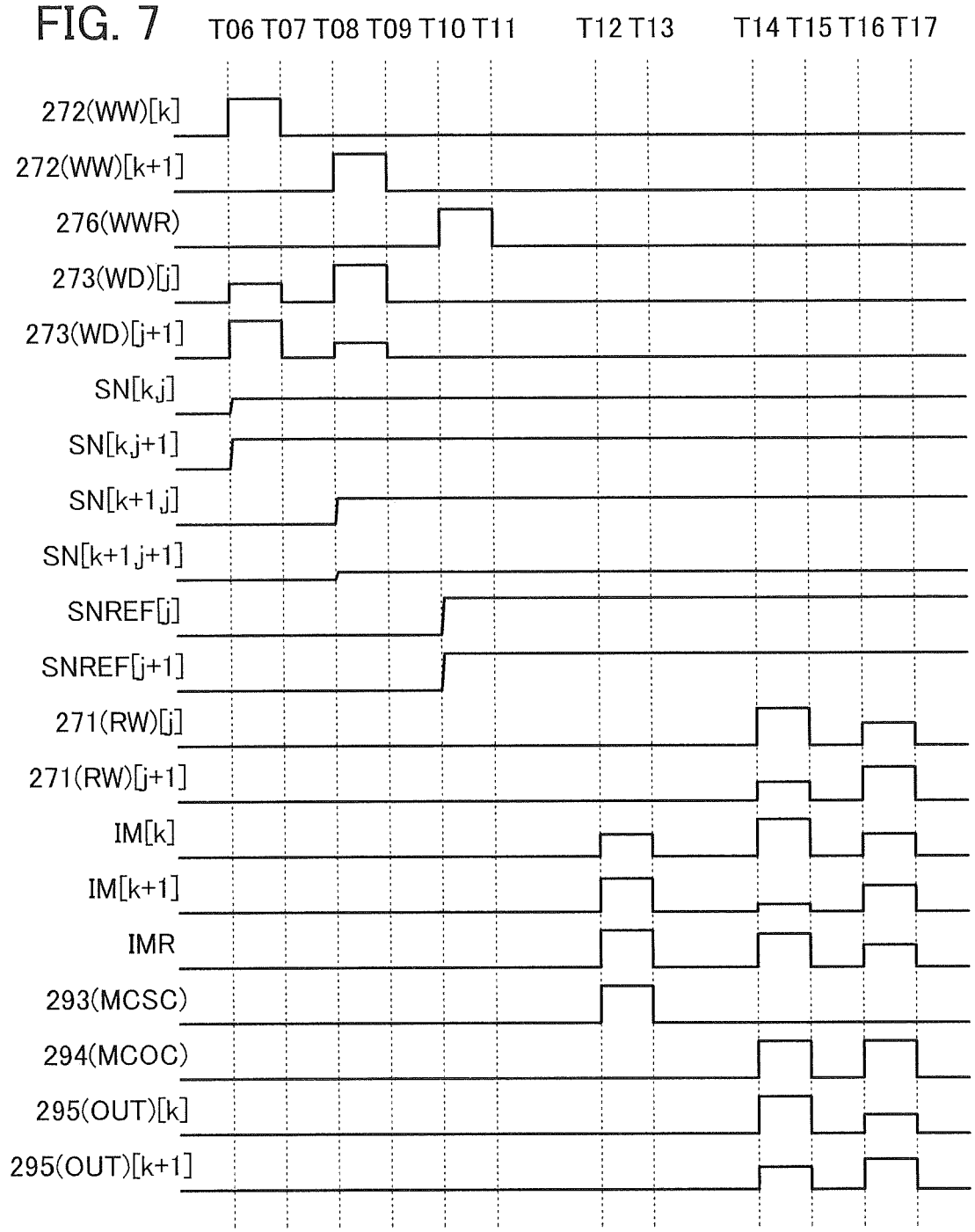

FIG. 32A1
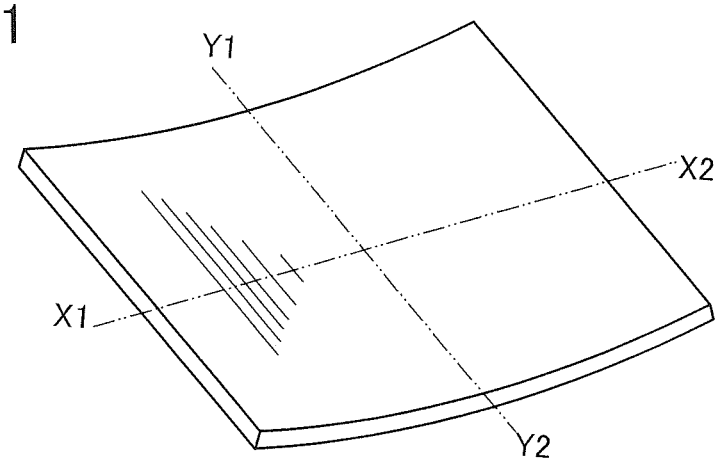
FIG. 32A2
FIG. 32A3
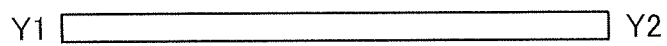
FIG. 32B1
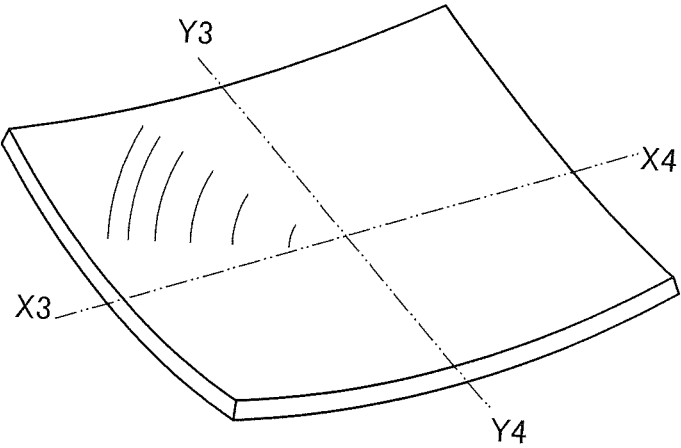
FIG. 32B2
FIG. 32B3
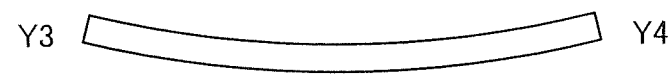

FIG. 34A
FIG. 34B
FIG. 34C
FIG. 34D
FIG. 34E
FIG. 34F
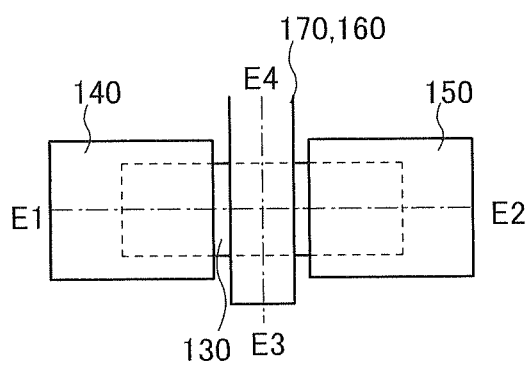
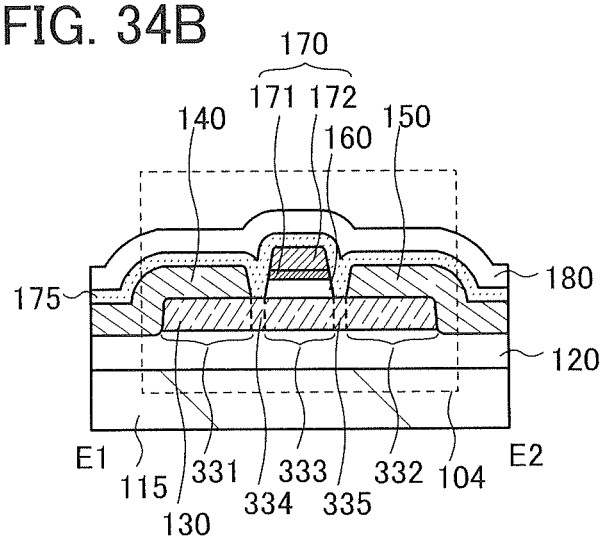
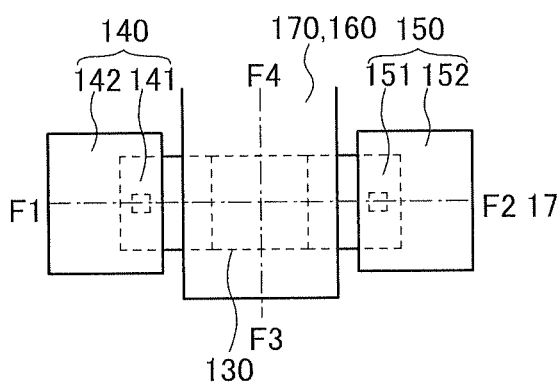
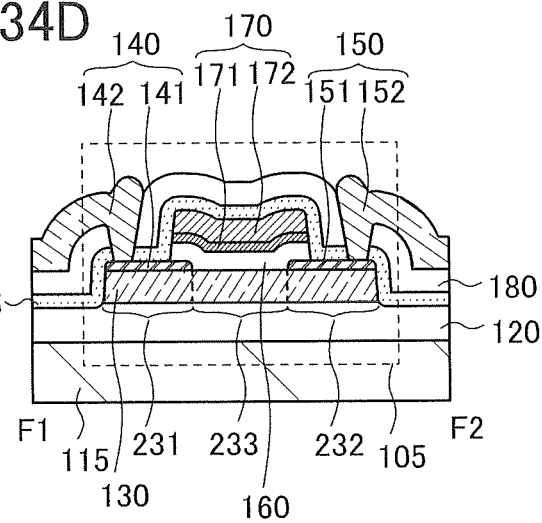
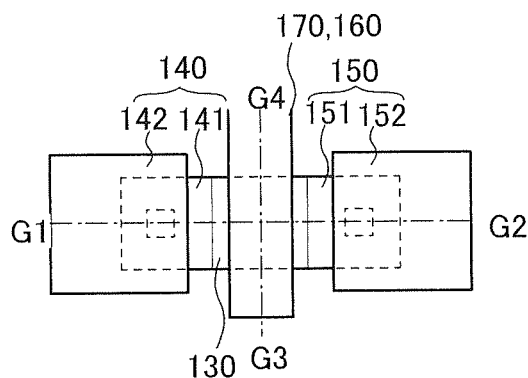
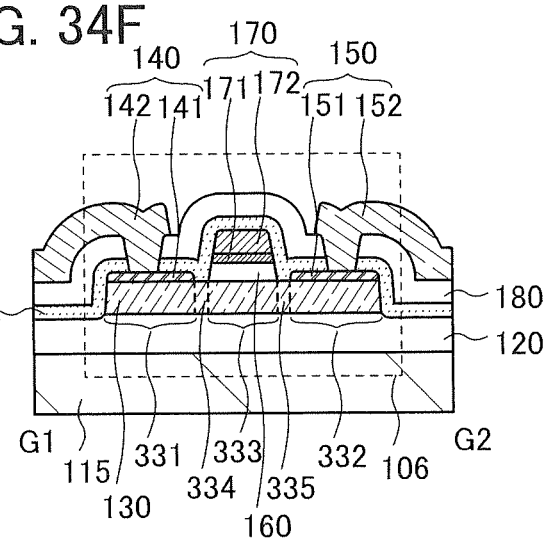

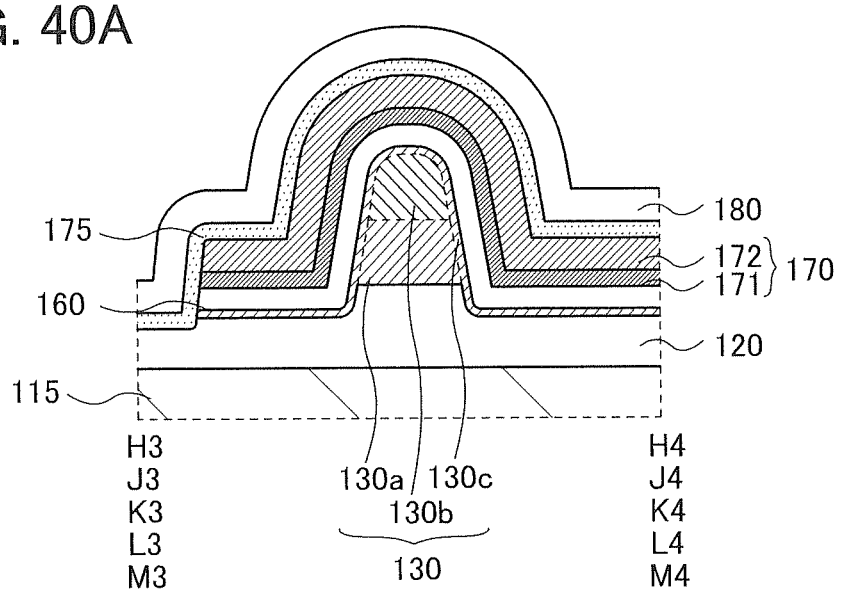
FIG. 40A
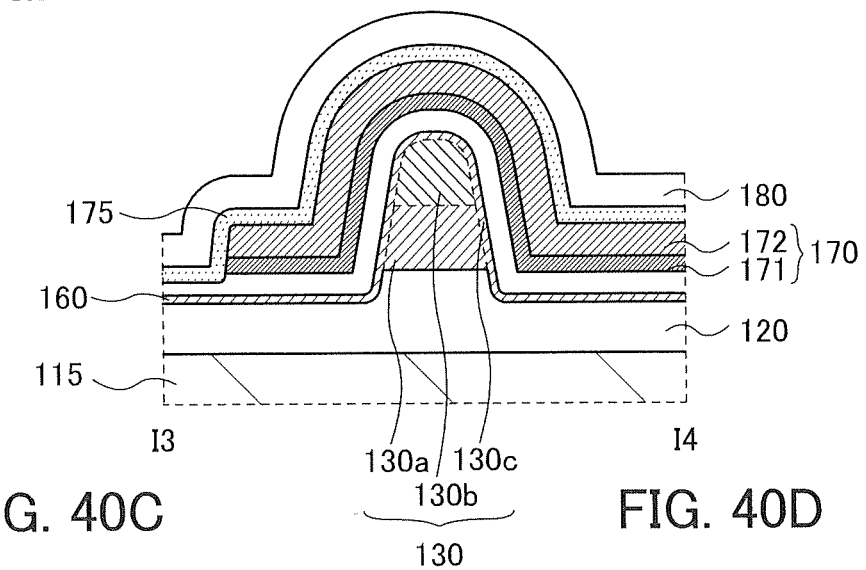
FIG. 40B
FIG. 40C
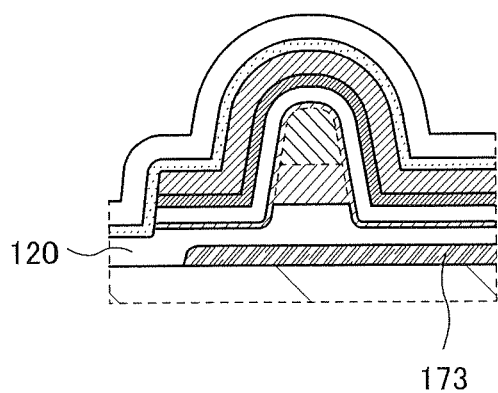
FIG. 40D
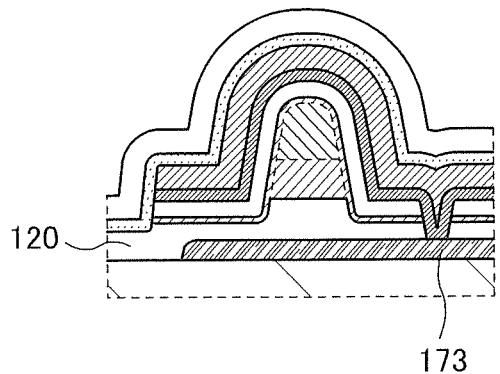

IMAGING DEVICE AND ELECTRONIC DEVICE

BACKGROUND OF THE INVENTION

This application is a continuation of copending U.S. application Ser. No. 15/091,752, filed on Apr. 6, 2016 which is incorporated herein by reference.

1. FIELD OF THE INVENTION

One embodiment of the present invention relates to an imaging device including an oxide semiconductor.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

2. DESCRIPTION OF THE RELATED ART

A technique by which a transistor is formed using a semiconductor thin film formed over a substrate having an insulating surface has been attracting attention. The transistor is used in a wide range of electronic devices such as an integrated circuit (IC) and a display device. A silicon-based semiconductor is widely known as a semiconductor material applicable to the transistor. As another material, an oxide semiconductor has been attracting attention.

For example, a technique for forming a transistor using zinc oxide or an In—Ga—Zn-based oxide semiconductor as an oxide semiconductor is disclosed (see Patent Documents 1 and 2).

Patent Document 3 discloses an imaging device in which a transistor containing an oxide semiconductor and having extremely low off-state current is used in part of a pixel circuit and a transistor containing silicon with which a complementary metal oxide semiconductor (CMOS) circuit can be formed is used in a peripheral circuit.

REFERENCE

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-119711

SUMMARY OF THE INVENTION

In the case of transmitting data obtained with an imaging device, the amount of transmission data can be reduced by compression of the data. Note that general still image compression is, for example, JPEG compression where data is compressed by a discrete cosine transform. General moving image compression is, for example, MPEG compression where a discrete cosine transform is performed on a captured image for every several frames and a discrete cosine transform of differential data is performed between the frames.

Although the compression of data obtained with an imaging device reduces a load of data transmission, a large amount of power is required for digital image processing for the data compression.

In view of the above, an object of one embodiment of the present invention is to provide an imaging device with an image processing function. Another object is to provide an imaging device capable of outputting data subjected to image processing. Another object is to provide an imaging device in which a discrete cosine transform can be performed without performing A/D conversion for converting imaging data into digital data. Another object is to provide an imaging device with low power consumption. Another object is to provide an imaging device suitable for high-speed operation. Another object is to provide an imaging device with high resolution. Another object is to provide a highly integrated imaging device. Another object is to provide an imaging device capable of imaging under a low illuminance condition. Another object is to provide an imaging device with a wide dynamic range. Another object is to provide an imaging device that can be used in a wide temperature range. Another object is to provide an imaging device with a high aperture ratio. Another object is to provide a highly reliable imaging device. Another object is to provide a novel imaging device or the like. Another object is to provide a novel semiconductor device or the like.

Note that the descriptions of these objects do not preclude the existence of other objects. In one embodiment of the present invention, there is no need to achieve all the objects. Other objects will be apparent from and can be derived from the description of the specification, the drawings, the claims, and the like.

One embodiment of the present invention relates to an imaging device with an image processing function.

One embodiment of the present invention is an imaging device including a pixel array and a memory element array. The pixel array includes first pixels arranged in a matrix and second pixels that are shielded from light and arranged in a column at an edge. The first pixels are electrically connected to a first row decoder through first wirings. The first pixels are electrically connected to a first analog processing circuit through second wirings. The second pixels are electrically connected to the first row decoder through the first wirings. The second pixels are electrically connected to the first analog processing circuit through a third wiring. The memory element array includes first memory elements arranged in a matrix and second memory elements arranged in a row at an edge. The first memory elements are electrically connected to the first analog processing circuit through fourth wirings. The first memory elements are electrically connected to a column decoder through fifth wirings. The first memory elements are electrically connected to a second row decoder through sixth wirings. The first memory elements are electrically connected to a second analog processing circuit through seventh wirings. The second memory elements are electrically connected to the first analog processing circuit through the fourth wirings. The second memory elements are electrically connected to the column decoder through the fifth wirings. The second memory elements are electrically connected to the second row decoder through an eighth wiring. The second memory elements are electrically connected to the second analog processing circuit through a ninth wiring.

The first pixels and the second pixels may each include a first transistor, a second transistor, a third transistor, a first capacitor, and a photoelectric conversion element. One electrode of the photoelectric conversion element may be electrically connected to one of a source electrode and a drain electrode of the first transistor. The other of the source electrode and the drain electrode of the first transistor may be electrically connected to one of a source electrode and a drain electrode of the second transistor. The other of the source electrode and the drain electrode of the first transistor may be electrically connected to a gate electrode of the third transistor. The other of the source electrode and the drain electrode of the first transistor may be electrically connected to one electrode of the first capacitor.

The first memory elements and the second memory elements may each include a fourth transistor, a fifth transistor, and a second capacitor. One of a source electrode and a drain electrode of the fourth transistor may be electrically connected to a gate electrode of the fifth transistor. The gate electrode of the fifth transistor may be electrically connected to one electrode of the second capacitor.

The imaging device may include a region where one of the first pixels overlaps with one of the first memory elements.

The first transistor, the second transistor, the third transistor, and the fourth transistor can each contain an oxide semiconductor in an active layer. The oxide semiconductor preferably contains In, Zn, and M (M is Al, Ti, Ga, Sn, Y, Zr, La, Ce, Nd, or Hf).

The photoelectric conversion element can contain selenium or a compound containing selenium in a photoelectric conversion layer. As selenium, for example, amorphous selenium or crystalline selenium can be used.

According to one embodiment of the present invention, an imaging device with an image processing function can be provided. An imaging device capable of outputting data subjected to image processing can be provided. An imaging device in which a discrete cosine transform can be performed without performing A/D conversion for converting imaging data into digital data can be provided. An imaging device with low power consumption can be provided. An imaging device suitable for high-speed operation can be provided. An imaging device with high resolution can be provided. A highly integrated imaging device can be provided. An imaging device capable of imaging under a low illuminance condition can be provided. An imaging device with a wide dynamic range can be provided. An imaging device that can be used in a wide temperature range can be provided. An imaging device with a high aperture ratio can be provided. A highly reliable imaging device can be provided. A novel imaging device or the like can be provided. A novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce the above effects.

BRIEF DESCRIPTION OF THE DRAWINGS

FIG. 7 is a timing chart illustrating operations of imaging and image processing.
FIGS. 32A1, 32A2, 32A3, 32B1, 32B2, and 32B3 illustrate bent imaging devices.
FIGS. 34A to 34F are top views and cross-sectional views illustrating transistors.

FIGS. 40A to 40D each illustrate a cross section of a transistor in a channel width direction.

DETAILED DESCRIPTION OF THE INVENTION

Figure 1:
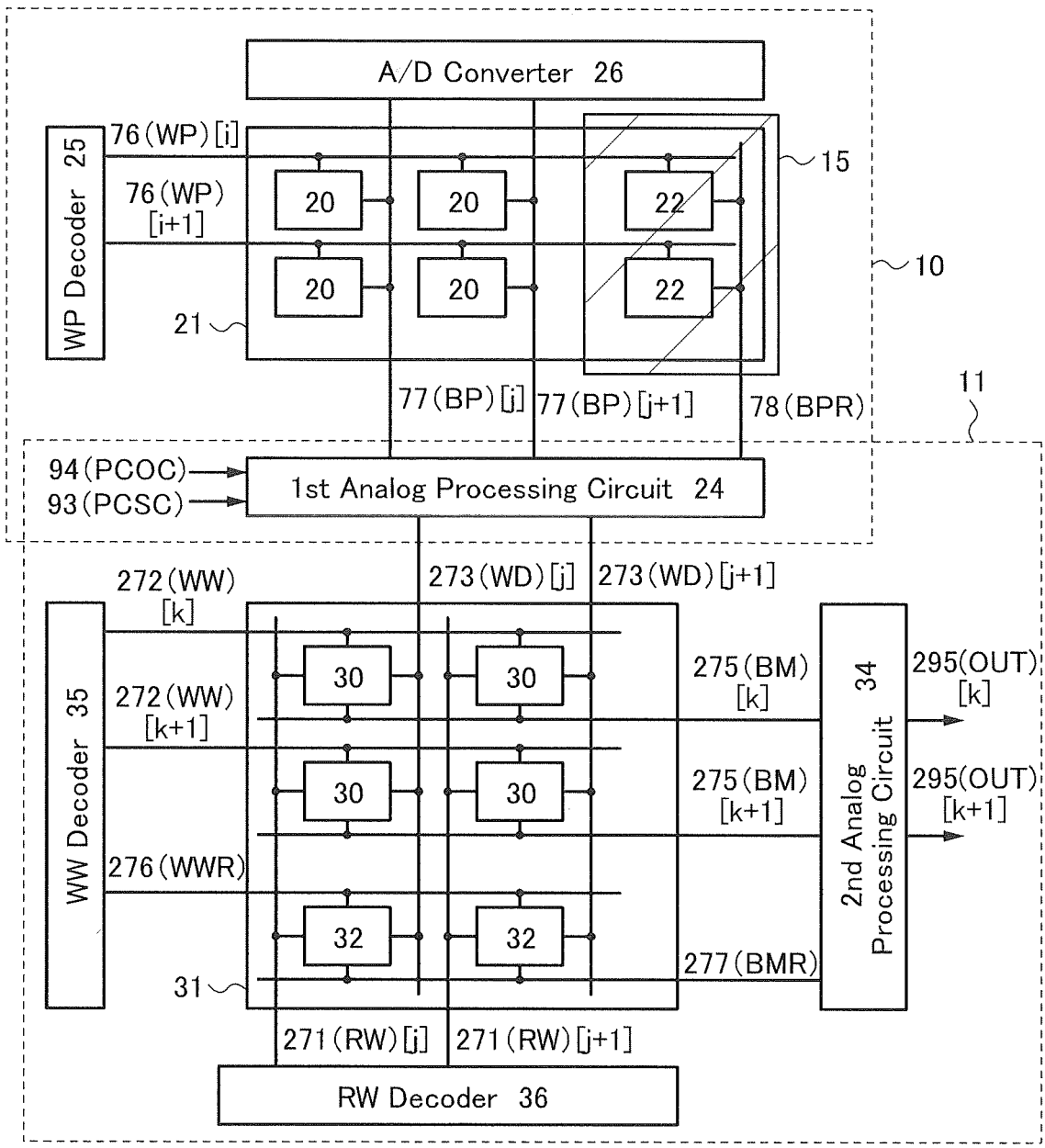
FIG. 1 is a block diagram illustrating an imaging device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be construed as being limited to the description of the embodiments below. Note that in structures of the invention described below, the same portions or portions having similar functions are denoted by the same reference numerals in different drawings, and description thereof is not repeated in some cases. The same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. The term "insulating film" can be changed into the term "insulating layer" in some cases.

Note that in general, a potential (voltage) is relative and is determined depending on the amount relative to a certain potential. Therefore, even when the expression "ground", "GND", or the like is used, the potential is not necessarily 0 V. For example, the "ground potential" or "GND" may be defined using the lowest potential in a circuit as a reference. Alternatively, the "ground potential" or "GND" may be defined using an intermediate potential in a circuit as a reference. In those cases, a positive potential and a negative potential are set using the potential as a reference.

Embodiment 1

In this embodiment, an imaging device that is one embodiment of the present invention will be described with reference to drawings.

FIG. 1 is a block diagram illustrating an imaging device of one embodiment of the present invention. The imaging device includes an imaging portion 10 that mainly performs an imaging operation and an arithmetic portion 11 that mainly performs a data conversion operation.

The imaging portion 10 includes a pixel array 21 in which pixels 20 used for imaging and reference pixels 22 used for image processing are arranged in a matrix, a row decoder 25, and an A/D converter 26. The arithmetic portion 11 includes a memory element array 31 in which memory elements 30 and reference memory elements 32 are arranged in a matrix, an analog processing circuit 34, a row decoder 35, and a column decoder 36. Note that the imaging portion 10 and the arithmetic portion 11 are electrically connected to each other through an analog processing circuit 24. In other words, the analog processing circuit 24 is a component of both the imaging portion 10 and the arithmetic portion 11.

It is preferable that there be a region where the imaging portion 10 and the arithmetic portion 11 overlap with each other. For example, the imaging portion can be provided in a first tier and the arithmetic portion can be provided in a second tier, and the first tier and the second tier can overlap with each other. Alternatively, some components of the imaging portion, such as the pixel array 21, can be provided in the first tier, and the arithmetic portion and the rest of the components of the imaging portion can be provided in the second tier. Further alternatively, components may be provided in three or more tiers. With such a structure, the imaging device can be downsized. In addition, each component can have a suitable device structure.

The row decoder 25 can output a signal WP, and is electrically connected to the pixels 20 and the reference pixels 22 through wirings 76. The row decoder 35 can output a signal WW, and is electrically connected to the memory elements 30 through wirings 272. The row decoder 35 can also output a signal WWR, and is electrically connected to the reference memory elements 32 through a wiring 276. The column decoder 36 can output a signal RW, and is electrically connected to the memory elements 30 and the reference memory elements 32 through wirings 271.

The imaging device of one embodiment of the present invention can output imaging data from the pixels 20 and perform digital conversion of the imaging data with the A/D converter 26. Note that the A/D converter 26 is not necessary provided.

Note that circuits included in the pixels 20 and the reference pixels 22 have the same configurations. In the pixel array 21 including a plurality of pixels arranged in a matrix, pixels arranged in a column at an edge serve as the reference pixels 22 and the other pixels serve as the pixels 20. The reference pixels 22 are shielded from light by a light-blocking layer 15.

In the imaging device of one embodiment of the present invention illustrated in FIG. 1, the pixels 20 each have a function of retaining imaging data. When selection signals with different potentials are supplied to the rows of the pixels 20, a current dependent on the product of the potential of the imaging data and the potential of a selection signal flows from each of the pixels 20. Then, first output data based on the sum of the currents is obtained.

The memory elements 30 each have a function of retaining the first output data. When selection signals with different potentials are supplied to the rows of the memory elements 30, a current dependent on the product of the potential of the first output data and the potential of a selection signal flows from each of the memory elements 30. Then, second output data based on the sum of the currents is obtained.

The first output data is data obtained by performing a one-dimensional discrete cosine transform on the imaging data along the X-axis direction. The second output data is data obtained by performing a one-dimensional discrete cosine transform on the first output data along the Y-axis direction, that is, data obtained by performing a two-dimensional discrete cosine transform on the imaging data along the X- and Y-axes directions.

Figure 2:
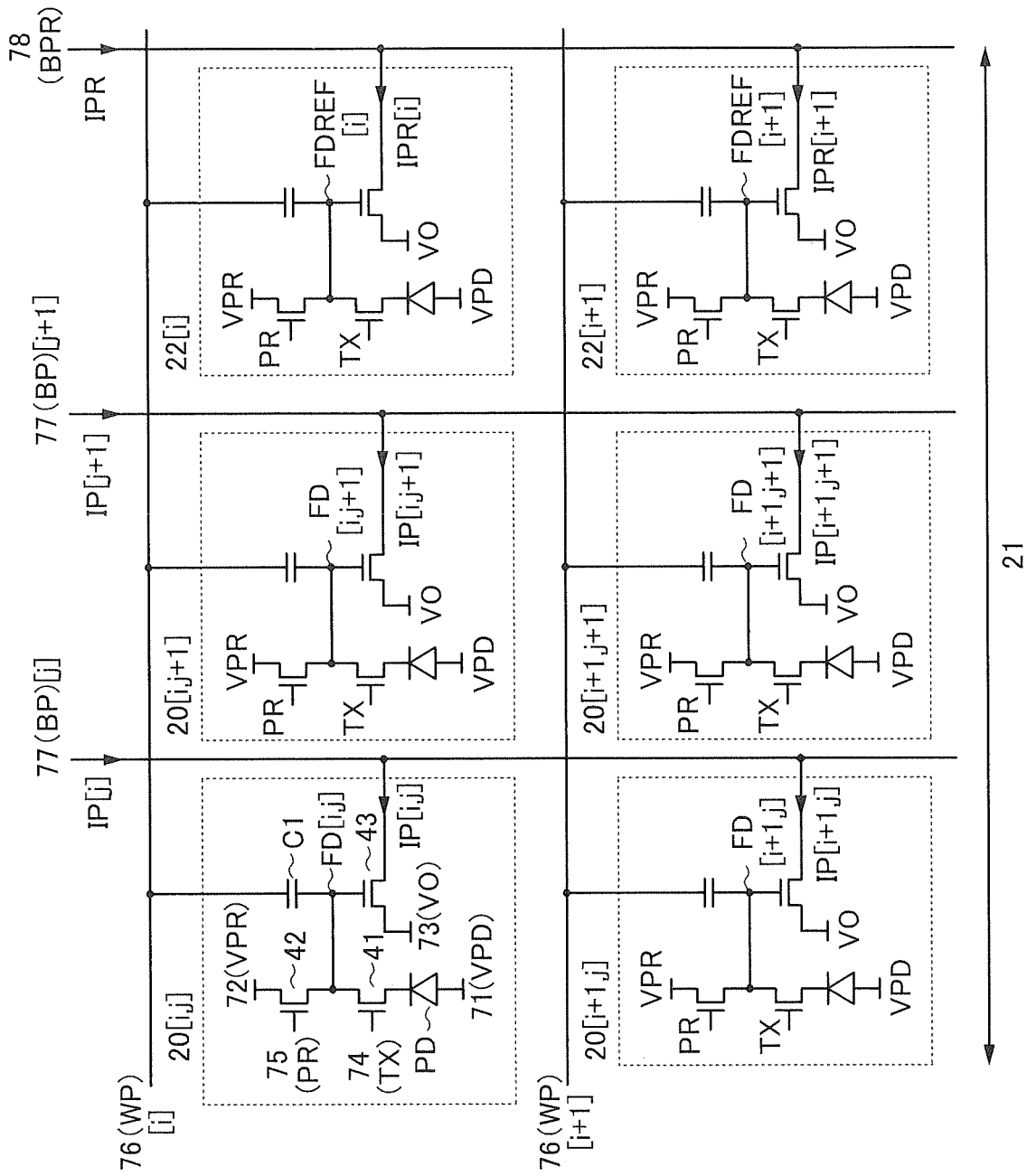
FIG. 2 is a circuit diagram illustrating pixels and reference pixels.

FIG. 2 is a circuit diagram illustrating the specific configuration of the pixel array 21. The circuits included in the pixels 20 and the reference pixels 22 each include a photoelectric conversion element PD, a transistor 41, a transistor 42, a transistor 43, and a capacitor C1.

One electrode of the photoelectric conversion element PD (photodiode) is electrically connected to one of a source electrode and a drain electrode of the transistor 41. The other of the source electrode and the drain electrode of the transistor 41 is electrically connected to one of a source electrode and a drain electrode of the transistor 42. The other of the source electrode and the drain electrode of the transistor 41 is electrically connected to a gate electrode of the transistor 43. The other of the source electrode and the drain electrode of the transistor 41 is electrically connected to one electrode of the capacitor C1.

The other electrode of the photoelectric conversion element PD is electrically connected to a wiring 71 (VPD). The other of the source electrode and the drain electrode of the transistor 42 is electrically connected to a wiring 72 (VPR). One of a source electrode and a drain electrode of the transistor 43 is electrically connected to a wiring 73 (VO). The wiring 71 (VPD), the wiring 72 (VPR), and the wiring 73 (VO) can each function as a power line; for example, the wiring 71 (VPD) and the wiring 73 (VO) can function as low potential power supply lines and the wiring 72 (VPR) can function as a high potential power supply line. A wiring 74 (TX) and a wiring 75 (PR) can function as signal lines for controlling the on/off states of transistors.

The other electrode of the capacitor C1 is electrically connected to the wiring 76. The other of the source electrode and the drain electrode of the transistor 43 is electrically connected to a wiring 77 (a wiring 78 in the case of the reference pixels 22). The wiring 76 can function as a signal line for supplying a given potential to a charge accumulation portion (FD). The wirings 77 and 78 can each function as a signal line for supplying a signal current based on the potential of the charge accumulation portion (FD) from the transistor 43.

The transistor 41 can function as a transfer transistor for controlling the potential of the charge accumulation portion (FD) in accordance with the output of the photoelectric conversion element PD. The transistor 42 can function as a reset transistor for initializing the potential of the charge accumulation portion (FD). The transistor 43 can function as an amplifying transistor for outputting a signal based on the potential of the charge accumulation portion (FD).

Although FIG. 2 illustrates, as an example, a 2×3 pixel array 21 (2 rows and 3 columns) including a pixel 20[i, j], a pixel 20[i, j+1], a pixel 20[i+1, j], a pixel 20[i+1, j+1], a reference pixel 22[i], and a reference pixel 22[i+1], an n×m pixel array 21 (n rows and m columns, where n and m are each a natural number of two or more) can be used. Note that the reference pixels 22 are arranged in a column at an edge of the pixel array 21.

When potentials are supplied from the wiring 71 (VPD), the wiring 72 (VPR), and the wiring 73 (VO) and control signals are supplied from the wiring 74 (TX), the wiring 75 (PR), a wiring 76[i], and a wiring 76[i+1], imaging data of any of the pixels 20 and the reference pixels 22 is output to a wiring 77[j], a wiring 77[j+1], or the wiring 78.

In each of a charge accumulation portion (FD)[i, j], a charge accumulation portion (FD)[i, j+1], a charge accumulation portion (FD)[i+1, j], a charge accumulation portion (FD)[i+1, j+1], a charge accumulation portion (FDREF)[i], and a charge accumulation portion (FDREF)[i+1], charge corresponding to the imaging data is accumulated. Note that the reference pixel 22[i] and the reference pixel 22[i+1] are shielded from light as described above, so that light does not enter the photoelectric conversion elements PD therein.

Figure 3:
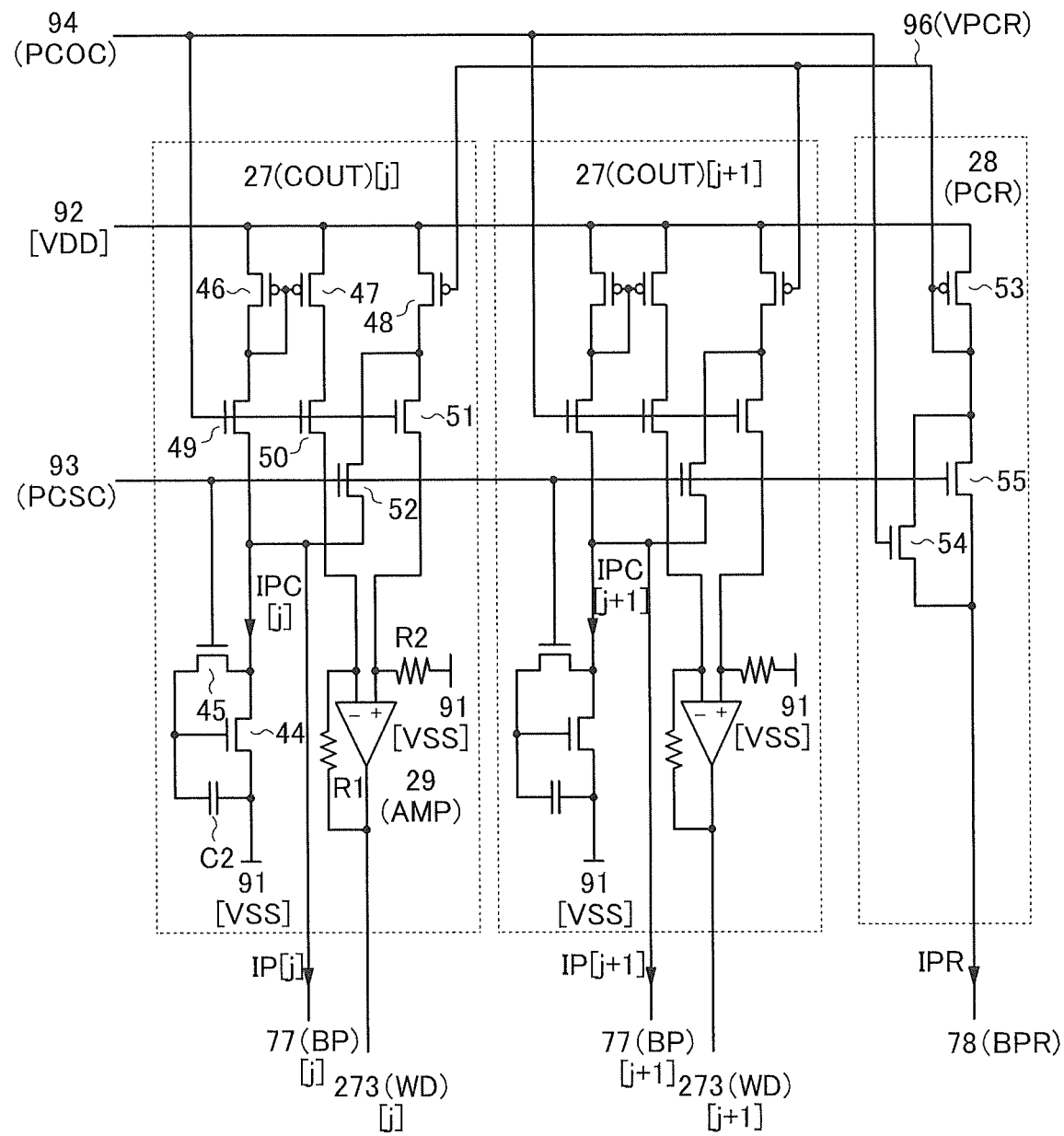
FIG. 3 illustrates an analog processing circuit.

FIG. 3 illustrates a configuration example of the analog processing circuit 24 illustrated in FIG. 1. The analog processing circuit 24 includes a plurality of column output circuits (COUT) 27 and a reference current circuit (PCR) 28. FIG. 3 illustrates an example where a column output circuit (COUT) 27[j] and a column output circuit (COUT) 27[j+1] are provided in accordance with the number of columns of the pixels 20 illustrated as an example in FIG. 1.

The column output circuits (COUT) 27 each include a transistor 44, a transistor 45, a transistor 46, a transistor 47, a transistor 48, a transistor 49, a transistor 50, a transistor 51, a transistor 52, a capacitor C2, a resistor R1, a resistor R2, and an operational amplifier 29. One of a source electrode and a drain electrode of the transistor 44 is electrically connected to one of a source electrode and a drain electrode of the transistor 45. The other of the source electrode and the drain electrode of the transistor 44 is electrically connected to one electrode of the capacitor C2. The other of the source electrode and the drain electrode of the transistor 44 is electrically connected to a wiring 91. The other of the source electrode and the drain electrode of the transistor 45 is electrically connected to a gate electrode of the transistor 44. The other of the source electrode and the drain electrode of the transistor 45 is electrically connected to the other electrode of the capacitor C2. A gate electrode of the transistor 45 is electrically connected to a wiring 93 (PCSC). The wiring 91 can function as a power line and can supply, for example, a low power supply potential (VSS). The wiring 93 (PCSC) can function as a signal line for controlling the on/off states of the transistors 45 and 52 and a transistor 55 described later.

Gate electrodes of the transistors 46 and 47 are electrically connected to one of a source electrode and a drain electrode of the transistor 46 so that the transistors 46 and 47 form a current mirror circuit. The transistor 46 can be referred to as an input transistor and the transistor 47 can be referred to as an output transistor.

The one of the source electrode and the drain electrode of the transistor 46 is electrically connected to the one of the source electrode and the drain electrode of the transistor 44 and the wiring 77 (BP) through the transistor 49. One of a source electrode and a drain electrode of the transistor 47 is electrically connected to one input terminal (-) of the operational amplifier 29 through the transistor 50. The one input terminal of the operational amplifier 29 is electrically connected to an output terminal of the operational amplifier 29 and a wiring 273 (WD) through the resistor R1.

The other of the source electrode and the drain electrode of the transistor 46 and the other of the source electrode and the drain electrode of the transistor 47 are electrically connected to a wiring 92. Gate electrodes of the transistors 49 and 50 are electrically connected to a wiring 94 (PCOC). The wiring 92 can function as a power line and can supply, for example, a high power supply potential (VDD). The wiring 94 (PCOC) can function as a signal line for controlling the on/off states of the transistors 49, 50, and 51 and a transistor 54 described later.

One of a source electrode and a drain electrode of the transistor 48 is electrically connected to the wiring 92. The other of the source electrode and the drain electrode of the transistor 48 is electrically connected to the other input terminal of the operational amplifier 29 through the transistor 51. The other input terminal of the operational amplifier 29 is electrically connected to the wiring 91 through the resistor R2. The other of the source electrode and the drain electrode of the transistor 48 can be electrically connected to the one of the source electrode and the drain electrode of the transistor 44 and the wiring 77 (BP) through the transistor 52.

The reference current circuit (PCR) 28 includes a transistor 53, the transistor 54, and the transistor 55. One of a source electrode and a drain electrode of the transistor 53 is electrically connected to the wiring 92. The other of the source electrode and the drain electrode of the transistor 53 is electrically connected to the wiring 78 (BPR) through the transistor 55. One of a source electrode and a drain electrode of the transistor 55 is electrically connected to one of a source electrode and a drain electrode of the transistor 54. The other of the source electrode and the drain electrode of the transistor 55 is electrically connected to the other of the source electrode and the drain electrode of the transistor 54. Note that the transistor 53 and the transistor 48 form a current mirror circuit. The transistor 53 can be referred to as an input transistor and the transistor 48 can be referred to as an output transistor.

Note that in the above configuration, the transistors 46, 47, 48, and 53 can be p-channel transistors.

When a potential is supplied from the wiring 92 and a control signal is supplied from the wiring 93 (PCSC) or the wiring 94 (PCOC), current flows from the wiring 78 (BPR) to the reference pixels 22, and current source bias voltage (VPCR) can be obtained in a wiring 96.

When a potential is supplied from the wiring 91 and a control signal is supplied from the wiring 93 (PCSC) or the wiring 94 (PCOC), current flows from the wiring 77 (BP)[j] and the wiring 77 (BP)[j+1] to the pixels 20 in each column, and output signals are output to a wiring 273 (WD)[j] and a wiring 273 (WD)[j+1] each electrically connected to the output terminal of the operational amplifier 29.

Note that the pixel array 21 and the analog processing circuit 24 are electrically connected to each other through the wirings 77 (BP) and the wiring 78 (BPR).

Figure 4:
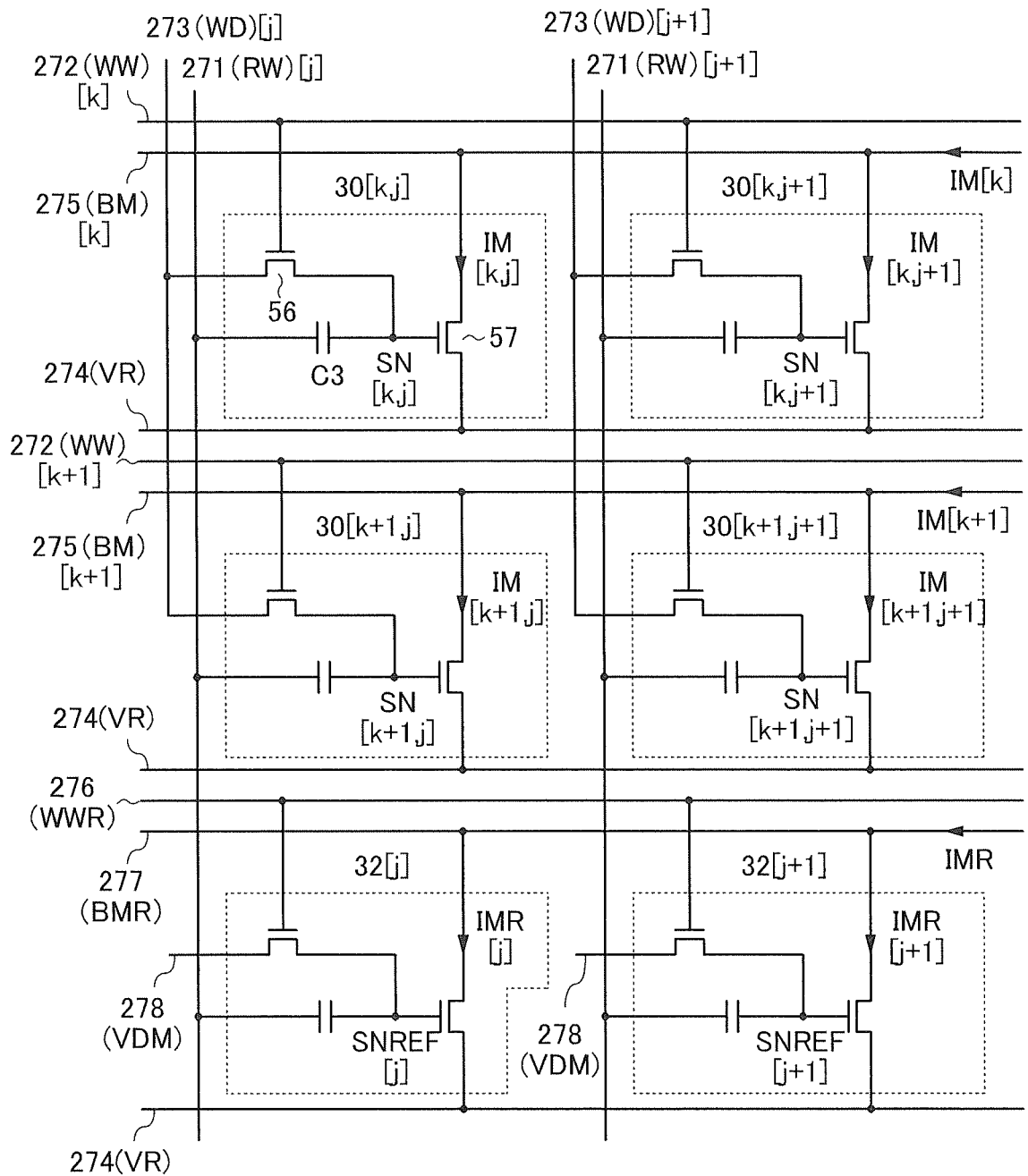
FIG. 4 is a circuit diagram illustrating memory elements and reference memory elements.

FIG. 4 is a circuit diagram illustrating the specific configuration of the memory element array 31. Circuits included in the memory elements 30 and the reference memory elements 32 each include a transistor 56, a transistor 57, and a capacitor C3.

One of a source electrode and a drain electrode of the transistor 56 is electrically connected to a gate electrode of the transistor 57. The gate electrode of the transistor 57 is electrically connected to one electrode of the capacitor C3.

The other electrode of the capacitor C3 is electrically connected to the wiring 271 (RW). A gate electrode of the transistor 56 is electrically connected to the wiring 272 (WW) or the wiring 276 (WWR). The other of the source electrode and the drain electrode of the transistor 56 is electrically connected to the wiring 273 (WD) or a wiring 278 (VDM). One of a source electrode and a drain electrode of the transistor 57 is electrically connected to a wiring 274 (VR). The other of the source electrode and the drain electrode of the transistor 57 is electrically connected to a wiring 275 (BM) or a wiring 277 (BMR).

The wirings 271 (RW), 272 (WW), and 276 (WWR) can function as signal lines for controlling the on/off states of transistors, for example. The wirings 273 (WD) can function as signal lines for supplying potentials of data written to the memory elements 30. The wirings 274 (VR) and 278 (VDM) can function as power lines. The wirings 275 (BM) and 277 (BMR) can function as signal lines for outputting data from the memory elements 30 or the reference memory elements 32, for example.

The transistor 56 can function as a write transistor for writing data to a charge accumulation portion (SN). The transistor 57 can function as a read transistor for outputting a signal based on the potential of the charge accumulation portion (SN).

Although FIG. 4 illustrates, as an example, a 3×2 memory element array 31 (3 rows and 2 columns) including a memory element 30[k, j], a memory element 30[k, j+1], a memory element 30[k+1, j], a memory element 30[k+1, j+1], a reference memory element 32[j], and a reference memory element 32[j+1], an n×m memory element array 31 (n rows and m columns, where n and m are each a natural number of two or more) can be used. Note that the reference memory elements 32 are arranged in a row at an edge of the memory element array 31.

When potentials are supplied from the wirings 274 (VR) and 278 (VDM); control signals are supplied from a wiring 271 (RW)[j], a wiring 271 (RW)[j+1], a wiring 272 (WW)[k], a wiring 272 (WW)[k+1], and the wiring 276 (WWR); and data is input from the wiring 273 (WD)[j] and the wiring 273 (WD)[j+1], data of any of the memory elements 30 and the reference memory elements 32 is output to a wiring 275 (BM)[k], a wiring 275 (BM)[k+1], or the wiring 277 (BMR).

In each of a charge accumulation portion (SN)[k, j], a charge accumulation portion (SN)[k, j+1], a charge accumulation portion (SN)[k+1, j], and a charge accumulation portion (SN)[k+1, j+1], charge corresponding to the potential of one of the wirings 273 (WD) is accumulated. In each of a charge accumulation portion (SNREF)[j] and a charge accumulation portion (SNREF)[j+1], charge corresponding to the potential of the wiring 278 (VDM) is accumulated.

Note that the analog processing circuit 24 and the memory element array 31 are electrically connected to each other through the wirings 273 (WD).

Figure 5:
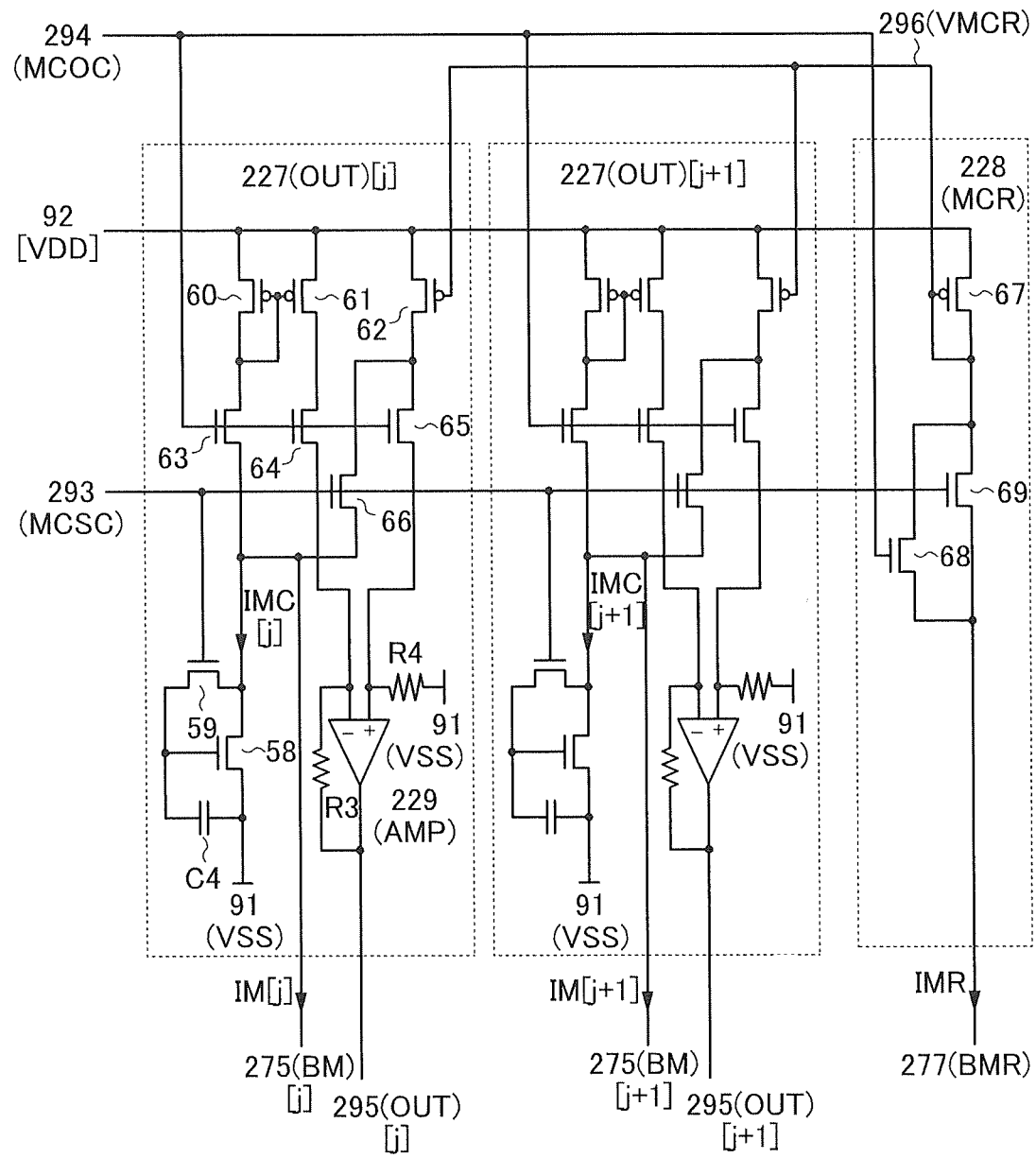
FIG. 5 illustrates an analog processing circuit.

FIG. 5 illustrates a configuration example of the analog processing circuit 34 illustrated in FIG. 1. The analog processing circuit 34 includes a plurality of column output circuits (OUT) 227 and a reference current circuit (MCR) 228. FIG. 5 illustrates an example where a column output circuit (OUT) 227[j] and a column output circuit (OUT) 227[j+1] are provided in accordance with the number of columns of the memory elements 30 illustrated as an example in FIG. 1.

The column output circuits (COUT) 27 each include a transistor 58, a transistor 59, a transistor 60, a transistor 61, a transistor 62, a transistor 63, a transistor 64, a transistor 65, a transistor 66, a capacitor C4, a resistor R3, a resistor R4, an operational amplifier 229. One of a source electrode and a drain electrode of the transistor 58 is electrically connected to one of a source electrode and a drain electrode of the transistor 59. The other of the source electrode and the drain electrode of the transistor 58 is electrically connected to one electrode of the capacitor C4. The other of the source electrode and the drain electrode of the transistor 58 is electrically connected to the wiring 91. The other of the source electrode and the drain electrode of the transistor 59 is electrically connected to a gate electrode of the transistor 58. The other of the source electrode and the drain electrode of the transistor 59 is electrically connected to the other electrode of the capacitor C4. A gate electrode of the transistor 59 is electrically connected to a wiring 293 (MCSC). The wiring 293 (MCSC) can function as a signal line for controlling the on/off states of the transistors 59 and 66 and a transistor 69 described later.

Gate electrodes of the transistors 60 and 61 are electrically connected to one of a source electrode and a drain electrode of the transistor 60 so that the transistors 60 and 61 form a current mirror circuit. The transistor 60 can be referred to as an input transistor and the transistor 61 can be referred to as an output transistor.

The one of the source electrode and the drain electrode of the transistor 60 is electrically connected to the one of the source electrode and the drain electrode of the transistor 58 and the wiring 275 (BM) through the transistor 63. One of a source electrode and a drain electrode of the transistor 61 is electrically connected to one input terminal (-) of the operational amplifier 229 through the transistor 64. The one input terminal of the operational amplifier 229 is electrically connected to an output terminal of the operational amplifier 229 and a wiring 295 (OUT) through the resistor R3.

The other of the source electrode and the drain electrode of the transistor 60 and the other of the source electrode and the drain electrode of the transistor 61 are electrically connected to the wiring 92. Gate electrodes of the transistors 63 and 64 are electrically connected to a wiring 294 (MCOC). The wiring 294 (MCOC) can function as a signal line for controlling the on/off states of the transistors 63, 64, and 65 and a transistor 68 described later.

One of a source electrode and a drain electrode of the transistor 62 is electrically connected to the wiring 92. The other of the source electrode and the drain electrode of the transistor 62 is electrically connected to the other input terminal of the operational amplifier 229 through the transistor 65. The other input terminal of the operational amplifier 229 is electrically connected to the wiring 91 through the resistor R4. The other of the source electrode and the drain electrode of the transistor 62 is electrically connected to the one of the source electrode and the drain electrode of the transistor 58 and the wiring 275 (BM) through the transistor 66.

The reference current circuit (MCR) 228 includes a transistor 67, the transistor 68, and the transistor 69. One of a source electrode and a drain electrode of the transistor 67 is electrically connected to the wiring 92. The other of the source electrode and the drain electrode of the transistor 67 is electrically connected to the wiring 277 (BMR) through the transistor 69. One of a source electrode and a drain electrode of the transistor 69 is electrically connected to one of a source electrode and a drain electrode of the transistor 68. The other of the source electrode and the drain electrode of the transistor 69 is electrically connected to the other of the source electrode and the drain electrode of the transistor 68. Note that the transistor 67 and the transistor 62 form a current mirror circuit. The transistor 67 can be referred to as an input transistor and the transistor 62 can be referred to as an output transistor.

Note that in the above configuration, the transistors 60, 61, 62, and 67 can be p-channel transistors.

When a potential is supplied from the wiring 92 and a control signal is supplied from the wiring 293 (MCSC) or the wiring 294 (MCOC), current flows from the wiring 277 (BMR) to the reference memory elements 32, and current source bias voltage (VMCR) can be obtained in a wiring 296.

When a potential is supplied from the wiring 91 and a control signal is supplied from the wiring 293 (MCSC) or the wiring 294 (MCOC), current flows from the wiring 275 (BM)[j] and the wiring 275 (BM)[j+1] to the memory elements 30 in each column, and output signals are output to a wiring 295 (OUT)[j] and a wiring 295 (OUT)[j+1] each electrically connected to the output terminal of the operational amplifier 229.

Note that the memory element array 31 and the analog processing circuit 34 are electrically connected to each other through the wirings 275 (BM).

The configurations of the pixels 20, the reference pixels 22, the memory elements 30, the reference memory elements 32, the analog processing circuit 24, and the analog processing circuit 34 are only examples, and some circuits, some transistors, some capacitors, some wirings, or the like might not be included. Alternatively, a circuit, a transistor, a capacitor, a wiring, or the like that is not included in the above configurations might be included. A connection of some wirings might be different from the above connection.

Figure 6:
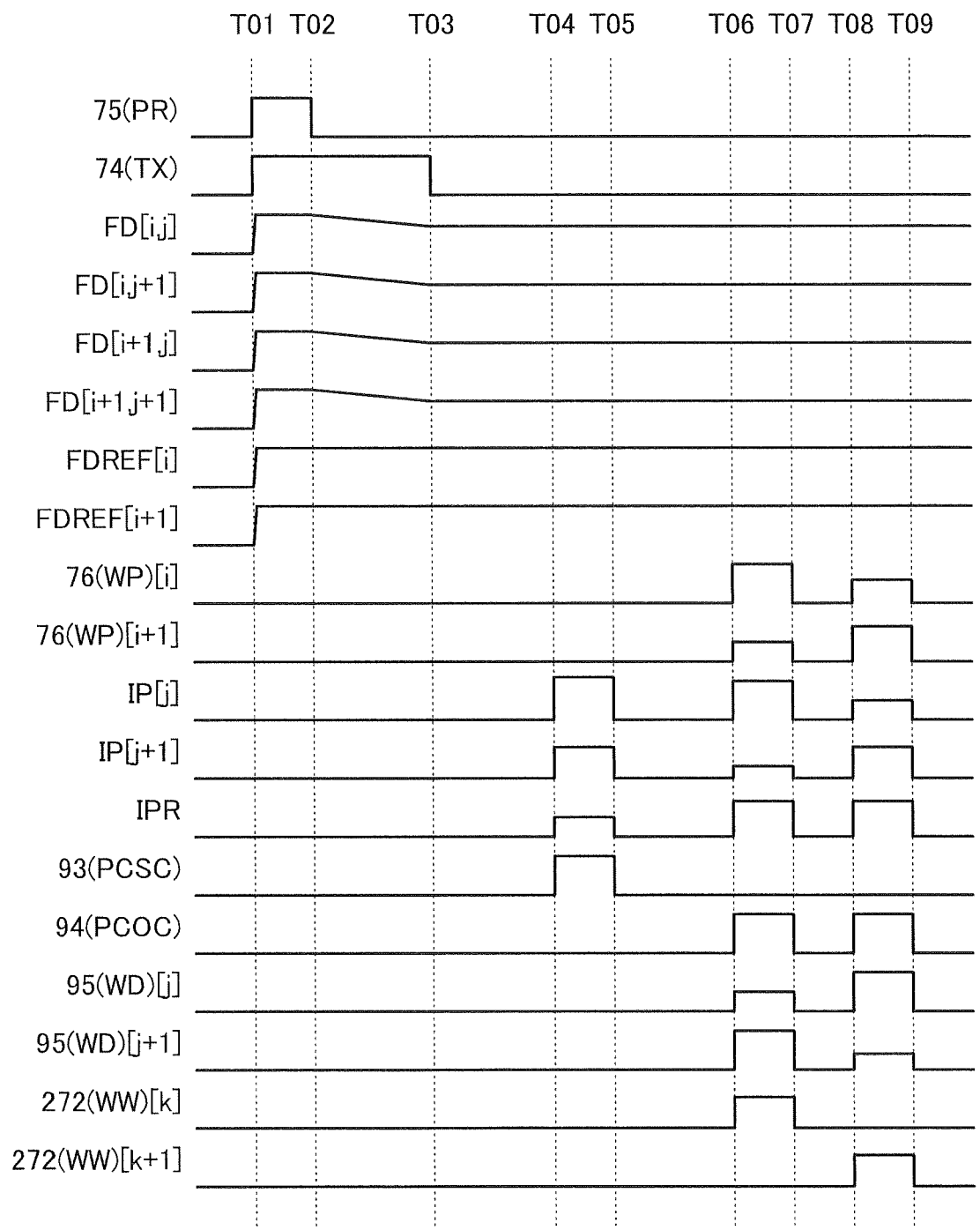
FIG. 6 is a timing chart illustrating operations of imaging and image processing.

Next, operation examples of the imaging device of one embodiment of the present invention are described with reference to timing charts in FIG. 6 and FIG. 7. Note that IP[j], IP[j+1], and IPR in FIG. 6 are a current signal supplied to the wiring 77 (BP)[j], a current signal supplied to the wiring 77 (BP)[j+1], and a current signal supplied to the wiring 78 (BPR), respectively. Furthermore, IM[k], IM[k+1], and IMR in FIG. 7 are a current signal supplied to the wiring 275 (BM)[k], a current signal supplied to the wiring 275 (BM)[k+1], and a current signal supplied to the wiring 277 (BMR), respectively. The wiring 71 (VPD) is set to a low potential, the wiring 72 (VPR) is set to a high potential, the wiring 73 (VO) is set to a low potential, the wiring 91 is set to a low potential, the wiring 92 is set to a high potential, the wiring 274 (VR) is set to a low potential, and the wiring 278 (VDM) is set to a given potential.

In FIG. 6, an operation from Time T01 to Time T03 corresponds to an operation of obtaining imaging data of each pixel 20 and each reference pixel 22. An operation from Time T04 to Time T05 corresponds to an operation of setting correction voltage for the column output circuits (COUT) 27. An operation from Time T06 to Time T09 corresponds to an operation of obtaining first output data that is arithmetic processed imaging data of each pixel.

In FIG. 7, an operation from Time T06 to Time T11 corresponds to an operation of storing the first output data in each memory element 30. An operation from Time T12 to Time T13 corresponds to an operation of setting correction voltage for the column output circuits 227 (OUT). An operation from Time T14 to Time T17 corresponds to an operation of obtaining second output data that is arithmetic processed data of the memory elements 30 in each column.

Note that the transistors 43, 44, 46, 47, 48, 52, 57, 58, 60, 61, 62, and 67 operate in a saturation region unless otherwise specified. In other words, gate voltage, source voltage, and drain voltage of the transistors are set to a voltage at which the transistors operate in a saturation region. Note that even when the operations of the transistors deviate from ideal operations in a saturation region, the gate voltage, source voltage, and drain voltage of the transistors are regarded as being appropriately set as long as the accuracy of output data is within a desired range. The other transistors may each have a switch function for controlling the on/off state.

From Time T01 to Time T02, the potential of the wiring 75 (PR) is set to "H" and the potential of the wiring 74 (TX) is set to "H". At this time, the potentials of the charge accumulation portion (FD) and the charge accumulation portion (FDREF) are set to the potential of the wiring 72 (VPR).

From Time T02 to Time T03, the potential of the wiring 75 (PR) is set to "L" and the potential of the wiring 74 (TX) is set to "H". At this time, the potential of the charge accumulation portion (FD) is decreased in accordance with light that enters the photoelectric conversion element PD. Here, if the potential of the wiring 72 (VPR) is denoted by VPR and a decrease in the potential of the charge accumulation portion (FD) is denoted by VP, the potential of the charge accumulation portion (FD) is VPR−VP. Note that as the intensity of light that enters the photoelectric conversion element PD becomes higher, the potential of the charge accumulation portion (FD) becomes lower.

In each of the reference pixels 22, the photoelectric conversion element PD is shielded from light; thus, ideally, the potential of the charge accumulation portion (FDREF) is maintained at VPR. Note that actually, dark current flows to the photoelectric conversion element PD; thus, the potential of the charge accumulation portion (FDREF) is slightly decreased from VPR. However, a decrease in the potential due to dark current occurs also in the charge accumulation portion (FD) in each of the pixels 20. Furthermore, a potential difference between the charge accumulation portion (FD) in one of the pixels 20 and the charge accumulation portion (FDREF) in one of the reference pixels 22 contributes to output data, so that the decrease in the potential due to dark current is canceled. Consequently, it is not necessary to explicitly consider the decrease in the potential of the charge accumulation portion (FDREF) due to dark current.

If the potential of the wiring 76 (WP)[i] is VWP[i], drain current IP[i, j] of the transistor 43 in the pixel 20[i, j] is $\alpha(\text{VWP}[i]-V_{th}+\text{VPR}-\text{VP}[i, j])^2$. Drain current IPR[i] of the transistor 43 in the reference pixel 22[i] is $\alpha(\text{VWP}[i]-V_{th}+\text{VPR})^2$.

Here, $\alpha$ is a coefficient and $V_{th}$ is the threshold voltage of the transistor 43. Note that the potential of the wiring 76 (WP)[i] is superimposed on the gate potential of the transistor 43 through the capacitor C1; thus, a change in the potential of the wiring 76 (WP)[i] does not correspond to an increase in the gate potential of the transistor 43. Specifically, a potential change obtained by multiplication of a capacitive coupling coefficient that can be calculated from the capacitance of the capacitor C1, the gate capacitance of the transistor 43, and parasitic capacitance by the potential change of the wiring 76 (WP)[i] corresponds to the increase in the gate potential of the transistor 43. Here, for simplicity, a potential obtained by multiplication of the capacitive coupling coefficient is VWP[i]; a potential actually supplied to the wiring 76 (WP)[i] is converted as appropriate using the capacitive coupling coefficient.

Here, if current IP[j] flowing to the wiring 77 (BP)[j] is $\Sigma_i\text{IP}[i, j]$ and current−IPR flowing to the wiring 78 (BPR) is $\Sigma_i\text{IPR}[i]$, a difference $\Delta\text{IP}[j]$ therebetween is IPR−IP[j]=$\Sigma_i\text{IPR}[i]\Sigma_i\text{IP}[i, j]$=$\Sigma_i(\alpha(\text{VWP}[i]-V_{th}+\text{VPR})^2-\alpha$ (VWP[i]$-V_{th}$+VPR−VP[i, j])$^2$)=$2\alpha\Sigma_i(\text{VWP}[i]\cdot\text{VP}[i, j])-2\alpha\Sigma_i(V_{th}-\text{VPR})\cdot\text{VP}[i, j]-\alpha\Sigma_i\text{VP}[i, j]^2$.

The first term $2\alpha\Sigma_i(\text{VWP}[i]\cdot\text{VP}[i, j])$ is the sum of the products of the potential VWP[i] of the wiring 76 (WP)[i] in a j-th column and VP[i, j] corresponding to the potential change in the charge accumulation portion (FD)[i, j] in the pixel 20[i, j]. The first term can be calculated by subtracting the sum of the second Wan and the third term, $-2\alpha\Sigma_i(V_{th}-\text{VPR})\cdot\text{VP}[i, j]-\alpha\Sigma_i\text{VP}[i, j]^2$ (=IPoffset[j]), from the difference $\Delta\text{IP}[j]$ between the current IP[j] flowing to the wiring 77 (BP)[j] and the current IPR flowing to the wiring 78 (BPR).

Note that IPoffset[j] corresponds to the difference between the current IP[j] flowing to the wiring 77 (BP)[j] and the current IPR flowing to the wiring 78 (BPR) when VWP[i], that is, the potential of the wiring 76 (WP)[i], is κ. Note that a potential of the wiring 76 (WP)[i] of 0 corresponds to a given reference potential, and a difference from the reference potential is regarded as the potential of the wiring 76 (WP)[i].

From Time T04 to Time T05, the potential of the wiring 93 (PCSC) is set to "H", the potential of the wiring 76 (WP)[i] is set to 0, and the potential of the wiring 76 (WP)[i+1] is set to 0. At this time, the current IP[j] flows to the wiring 77 (BP)[j], the current IP[j+1] flows to the wiring 77 (BP)[j+1], the current IPR flows to the wiring 78 (BPR), current IPC[j] flows to the transistor 44 in the column output circuit (COUT) 27[j], and current IPC[j+1] flows to the transistor 44 in the column output circuit (COUT) 27[j+1].

Owing to the current mirror circuit formed using the transistors 48 and 53, current flowing through the transistors 48 and 52 is equal to current flowing through the transistors 53 and 55, that is, the current IPR. This means that the current IPR is equal to the sum of the current IP[j] and the current IPC[j] (IPR=IP[j]+IPC[j]).

A potential that can be used to supply the current IPC[j] (=IPR−IP[j]) is stored in the capacitor C2. Note that since IPoffset[j]=IPR−IP[j] as described above, the current IPC[j] is equal to IPoffset[j]. Thus, after the potential of the wiring 93 (PCSC) is set to "L", in the column output circuit (COUT) 27[j], the transistor 44 serves as a current source for supplying IPoffset[j] owing to the potential retained in the capacitor C2.

Similarly, in the column output circuit (COUT) 27[j+1], the transistor 44 serves as a current source for supplying IPoffset[j+1] owing to the potential retained in the capacitor C2.

From Time T06 to Time T07, the potential of the wiring 76 (WP)[i] is set to VWP[i, k], the potential of the wiring 76 (WP)[i+1] is set to VWP[i+1, k], and the potential of the wiring 94 (PCOC) is set to "H". At this time, in the column output circuit (COUT) 27[j], current that is equal to the sum of the current IP[j] and the current IPC[j] (=IPoffset[j]) flows through the transistor 49.

Owing to the current mirror circuit formed using the transistors 46 and 47, current that is equal to current flowing to the transistor 49 flows to the resistor R1 through the transistors 47 and 50. Meanwhile, the current IPR flows to the wiring 78 (BPR) through the transistor 54. Furthermore, owing to the current mirror circuit formed using the transistors 48 and 53, current that is equal to the current IPR flows to the resistor R2 through the transistors 48 and 51.

Here, if the resistance of each of the resistors R1 and R2 is denoted by R and the potential of the wiring 278 (VDM) is denoted by VDM, the output of the operational amplifier (AMP) 29 is equal to the potential VWD[j] of the wiring 273

(WD)[j], that is, VDM+R·(IPR−(IP[j]+IPoffset[j])), and according to the above, VDM+R·2α$\Sigma_i$(VWP[i, k]·VP[i, j])=VDM−F$_j$[k] is satisfied.

Similarly, the output of the operational amplifier (AMP) 29 in the column output circuit (COUT) 27[j+1] is equal to the potential VWD[j+1] of the wiring 273 (WD)[j+1], that is, VDM+R·2α$\Sigma_i$(VWP[i, k]·VP[i, j+1]) (=VDM−F$_{j+1}$[k]).

From Time T08 to Time T09, the potential of the wiring 76 (WP)[i] is set to VWP[i, k+1], the potential of the wiring 76 (WP)[i+1] is set to VWP[i+1, k+1], and the potential of the wiring 94 (PCOC) is set to "H". At this time, similarly to the case from Time T06 to Time T07, the output of the operational amplifier (AMP) 29 in the column output circuit (COUT) 27[j] is equal to the potential VWD[j] of the wiring 273 (WD)[j], that is, VDM+R·2α$\Sigma_i$(VWP[i, k+1]·VP[i, j]) (=VDM−F$_{j+1}$[k+1]). Furthermore, the output of the operational amplifier (AMP) 29 in the column output circuit (COUT) 27[j+1] is equal to the potential VWD[j+1] of the wiring 273 (WD)[j+1], that is, VDM+R·2α$\Sigma_i$(VWP[i, k+1]·VP[i, j+1]) (=VDM−F$_{j+1}$[k+1]).

From Time T06 to Time T07, if the potential of the wiring 272 (WW)[k] is set to "H" and the potential of the wiring 272 (WW)[k+1] is set to "L", the potential VWD[j] (=VDM−F$_j$[k]) of the wiring 273 (WD)[j] and the potential VWD[j+1] (=VDM−F$_{j+1}$[k]) of the wiring 273 (WD)[j+1] are written to the memory element 30[k, j] and the memory element 30[k, j+1], respectively. At this time, the potential of the charge accumulation portion (SN)[k, j] is set to VDM−F$_j$[k], and the potential of the charge accumulation portion (SN)[k, j+1] is set to VDM−F$_{j+1}$[k].

From Time T08 to Time T09, if the potential of the wiring 272 (WW)[k] is set to "L" and the potential of the wiring 272 (WW)[k+1] is set to "H", the potential VWD[j] (=VDM−F$_j$[k+1]) of the wiring 273 (WD)[j] and the potential VWD[j+1] (=VDM−F$_{j+1}$[k+1]) of the wiring 273 (WD)[j+1] are written to the memory element 30[k+1, j] and the memory element 30[k+1, j+1], respectively. At this time, the potential of the charge accumulation portion (SN)[k+1, j] is set to VDM−F$_j$[k+1], and the potential of the charge accumulation portion (SN)[k+1, j+1] is set to VDM−F$_{j+i}$[k+1].

From Time T10 to Time T11, when the potential of the wiring 276 (WWR) is "H", the potential of the charge accumulation portion (SNREF)[j] in the reference memory element 32[j] is set to VDM and the potential of the charge accumulation portion (SNREF)[j+1] in the reference memory element 32[j+1] is set to VDM.

If the potential of the wiring 271 (RW)[j] is VWM[j], drain current IM[k, j] of the transistor 57 in the memory element 30[k, j] is β(VWM[j]−V$_{th}$+VDM−F$_j$[k])$^2$. Furthermore, drain current IMR[i] of the transistor 57 in the reference memory element 32[j] is β(VWM[j]−V$_{th}$+VDM)$^2$. Here, β is a coefficient and V$_{th}$ is the threshold voltage of the transistor 57.

Note that the potential of the wiring 271 (RW)[j] is superimposed on the gate potential of the transistor 57 through the capacitor C3; thus, a change in the potential of the wiring 271 (RW)[j] does not correspond to an increase in the gate potential of the transistor 57. Specifically, a potential change obtained by multiplication of a capacitive coupling coefficient that can be calculated from the capacitance of the capacitor C3, the gate capacitance of the transistor 57, and parasitic capacitance by the potential change of the wiring 271 (RW)[j] corresponds to the increase in the gate potential of the transistor 57. Here, for simplicity, a potential obtained by multiplication of the capacitive coupling coefficient is VWM[j]; a potential actually supplied to the wiring 271 (RW)[/] is converted as appropriate using the capacitive coupling coefficient.

Here, if current IM[k] flowing to the wiring 275 (BM)[k] is $\Sigma_i$IM[k, j] and current IMR flowing to the wiring 277 (BMR) is $\Sigma_i$IMR[j], a difference ΔIM[k] therebetween is IMR−IM[k]=$\Sigma_i$IMR[j]−$\Sigma_i$IM[k, j]=$\Sigma_i$(β(VWM[j]−V$_{th}$+VDM)$^2$−β(VWM[j]−V$_{th}$+VDM−F$_j$[k])$^2$)=2β$\Sigma_i$(VWM[j]·F$_j$[k])−2β$\Sigma_i$(V$_{th}$−VDM)·F$_j$[k]−β$\Sigma_i$F$_j$[k]$^2$.

The first term 2β$\Sigma_i$(VWM[j]·F$_j$[k]) is the sum of the products of the potential VWM[j] of the wiring 271 (RW)[j] in a k-th column and F$_j$[k], which is the difference between the potential of the charge accumulation portion (SN)[k, j] in the memory element 30[k, j] and VDM. In other words, the first term can be calculated by subtracting the sum of the second term and the third tetra, −2β$\Sigma_i$(V$_{th}$−VDM)·F$_j$[k]−β$\Sigma_i$F$_j$[k]$^2$ (=IMoffset[k]), from the difference ΔIM[k] between the current IM[k] flowing to the wiring 275 (BM)[k] and the current IMR flowing to the wiring 277 (BMR). Note that IMoffset[k] corresponds to the difference between the current IM[k] flowing to the wiring 275 (BM)[k] and the current IMR flowing to the wiring 277 (BMR) when VWM[j], that is, the potential of the wiring 271 (RW)[j], is 0. Note that a potential of the wiring 271 (RW)[j] of 0 corresponds to a given reference potential, and a difference from the reference potential is regarded as the potential of the wiring 271 (RW)[j].

From Time T12 to Time T13, the potential of the wiring 293 (MCSC) is set to "H", the potential of the wiring 271 (RW)[j] is set to 0, and the potential of the wiring 271 (RW)[j+1] is set to 0. At this time, the current IM[k] flows to the wiring 275 (BM)[k], the current IMR flows to the wiring 277 (BMR), and current IMC[k] flows to the transistor 58 in a column output circuit (OUT) 227[k]. Furthermore, current IM[j+1] flows to the wiring 275 (BM)[k+1], the current IMR flows to the wiring 277 (BMR), and current IMC[k+1] flows to the transistor 54 in a column output circuit (OUT) 227[k+1].

In the column output circuit (OUT) 227[k], owing to the current mirror circuit formed using the transistors 62 and 67, current (IM[k]+IMC[k]) flowing through the transistors 62 and 66 is equal to current flowing through the transistors 67 and 69, that is, the current IMR. A potential that can be used to supply the current IMC[k] is stored in the capacitor C4. According to the above, the current IMC[k] is equal to IMoffset[k]. Thus, after the potential of the wiring 293 (MCSC) is set to "L", in the column output circuit (OUT) 227[k], the transistor 58 serves as a current source for supplying IMoffset[k] owing to the potential retained in the capacitor C4. Similarly, in the column output circuit (OUT) 227[k+1], the transistor 58 serves as a current source for supplying IMoffset[k+1] owing to the potential retained in the capacitor C4.

From Time T14 to Time T15, the potential of the wiring 271 (RW)[j] is set to VWM[j, 1], the potential of the wiring 271 (RW)[j+1] is set to VWM[j+1, 1], and the potential of the wiring 294 (MCOC) is set to "H". At this time, in the column output circuit (OUT) 227[k], current that is equal to the sum of the current IM[k] and the current IMC[k] (=IMoffset[k]) flows through the transistor 63.

Owing to the current mirror circuit formed using the transistors 60 and 61, current that is equal to current flowing to the transistor 63 flows to the resistor R3 through the transistors 61 and 64. Meanwhile, the current IMR flows to the wiring 277 (BMR) through the transistor 68. Furthermore, owing to the current mirror circuit formed using the transistors 62 and 67, current that is equal to the current IMR flows to the resistor R4 through the transistors 62 and 65.

Here, if the resistance of each of the resistors R3 and R4 is denoted by R, an output potential VOUT[k] of the operational amplifier (AMP) 229 that is output to a wiring 295 (OUT)[k] is equal to R·(IMR−(IM[k]+IMoffset[k])), and according to the above, R·2β$\Sigma_i$(VWM[j, l]·F$_j$[k])=F[k, l] is satisfied.

Similarly, in the column output circuit (OUT) 227[k+1], an output potential VOUT[k+1] of the operational amplifier (AMP) 229 that is output to a wiring 295 (OUT)[k+1] is equal to R·2β$\Sigma_i$(VWM[j, l]·F$_j$[k+1]), that is, F[k+1, l].

From Time T16 to Time T17, the potential of the wiring 271 (RW)[j] is set to VWM[j, l+1], the potential of the wiring 271 (RW)[j+1] is set to VWM[j+1, l+1], and the potential of the wiring 294 (MCOC) is set to "H". At this time, similarly to the case from Time T14 to Time T15, in the column output circuit (OUT) 227[k], the output potential VOUT[k] of the operational amplifier (AMP) 229 that is output to the wiring 295 (OUT)[k] is equal to R·2β$\Sigma_i$(VWM[j, l+1]·F$_j$[k]), that is, F[k, l+1]. Furthermore, in the column output circuit (OUT) 227[k+1], the output potential VOUT[k+1] of the operational amplifier (AMP) 229 that is output to the wiring 295 (OUT)[k+1] is equal to R·2β$\Sigma_i$(VWM[j, l+1]·F$_j$[k+1]), that is, F[k+1, l+1].

When VWP[i, k] and VWM[j, l] are set such that F$_j$[k]=−R·2α$\Sigma_i$(VWP[i, k]·VP[i, j])=C[k]/2·$\Sigma_i$VP[i, j]·cos((2i+1)kπ/2(imax−1)), F[k, l]=R·2β$\Sigma_i$(VWM[j l]·F$_j$[k])=C[l]/2·$\Sigma_i$F$_j$[k]·cos((2j+1)lπ/2(jmax−1)), and C[n]=1/$\sqrt{2}$ (n=0) or C[n]=1 (n≠0) are satisfied, F[k, l] corresponds to a transform coefficient which is obtained as a result of a two-dimensional discrete cosine transform on VP[i, j].

Thus, when the potentials are sequentially applied to the wirings 76 (WP) and 271 (RW), two-dimensional discrete cosine transforms can be performed. This means that one embodiment of the present invention does not require a two-dimensional discrete cosine transform after the output of A/D converted imaging data. Furthermore, data input/output to/from a digital memory during a two-dimensional discrete cosine transform is not needed, which leads to a reduction in power consumption. Note that a two-dimensional discrete sine transform can be performed similarly.

A two-dimensional discrete cosine transform can be performed on a given matrix basis. For example, in the case where a two-dimensional discrete cosine transform is performed on an 8×8 matrix basis, imax and jmax in the above equations are set to 8, and sequential application of a desired potential to eight of the wirings 76 (WP) and sequential application of a desired potential to eight of the wirings 271 (RW) are repeated. In that case, a two-dimensional discrete cosine transform can be performed as long as the memory elements 30 in FIG. 4 are provided in eight rows.

In the pixels 20 in FIG. 2, simultaneous data output from plural pixels 20 is repeated; thus, imaging data is preferably obtained at once. For this reason, a global shutter system described later is preferably used for imaging.

To achieve such a structure, transistors with extremely low off-state current that are formed using an oxide semiconductor are preferably used as the transistors 41 and 42. In addition, to retain offset current, transistors with extremely low off-state current that are formed using an oxide semiconductor are preferably used as the transistors 45 in the analog processing circuit 24 and the transistors 59 in the analog processing circuit 34.

With such a structure, a discrete cosine transform can be performed on analog data without performing A/D conversion for converting imaging data into digital data. Accordingly, an imaging device in which data compression can be performed with low power consumption can be provided.

Figure 8A:
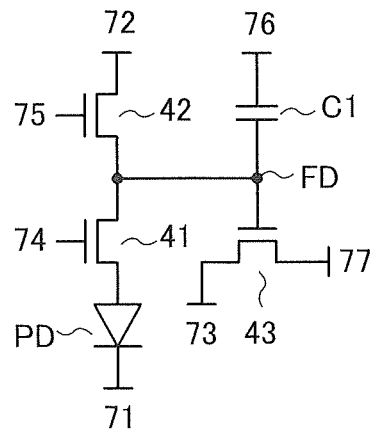
FIGS. 8A to 8F are circuit diagrams each illustrating a pixel.
Figure 8B:
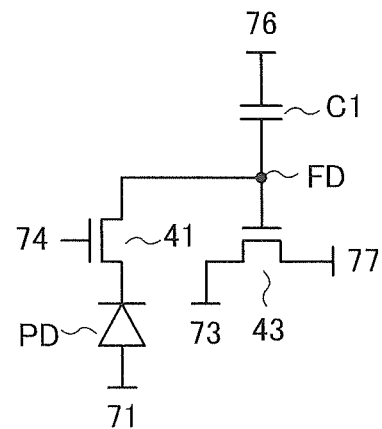
Figure 8C:
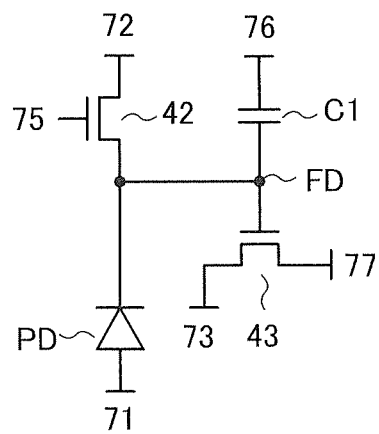
Figure 8D:
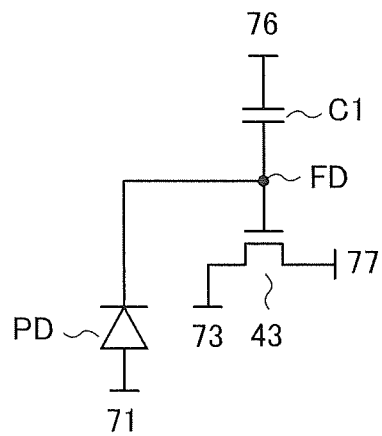
Figure 8E:
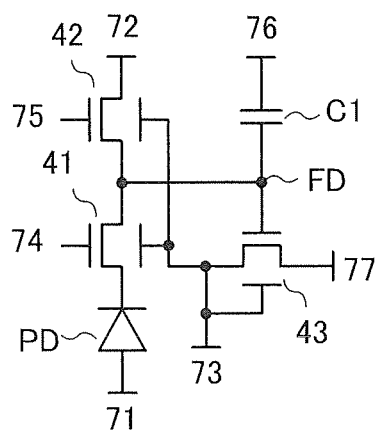
Figure 8F:
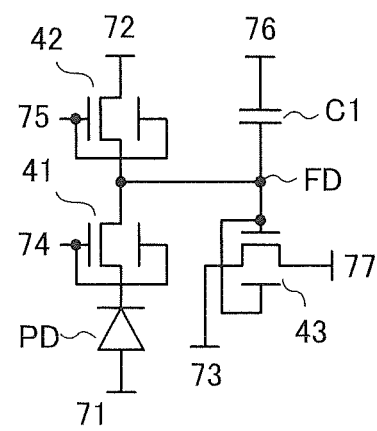

Note that the configurations of the circuits of the pixels 20 and the reference pixels 22 are not limited to the configurations in FIG. 2, and configurations in FIGS. 8A to 8D may be employed. The transistors 41, 42, and 43 in the pixel circuits may each include a back gate as illustrated in FIGS. 8E and 8F. FIG. 8E illustrates a configuration in which a constant potential is applied to the back gates, which enables control of the threshold voltages. FIG. 8F illustrates a configuration in which the same potential is applied to the back gates and front gates, which enables an increase in on-state current. Although the back gates are electrically connected to the wiring 73 in FIG. 8E, the back gates may be electrically connected to a different wiring to which a constant potential is applied. Although FIGS. 8E and 8F each illustrate an example in which back gates are provided in the transistors of the pixel circuits in FIG. 2, the circuits in FIGS. 8A to 8D may have similar configurations. Moreover, a configuration in which the same potential is applied to a front gate and a back gate, a configuration in which a constant potential is applied to a back gate, and a configuration without a back gate may be optionally combined as necessary for the transistors included in one pixel circuit.

Figure 9A:
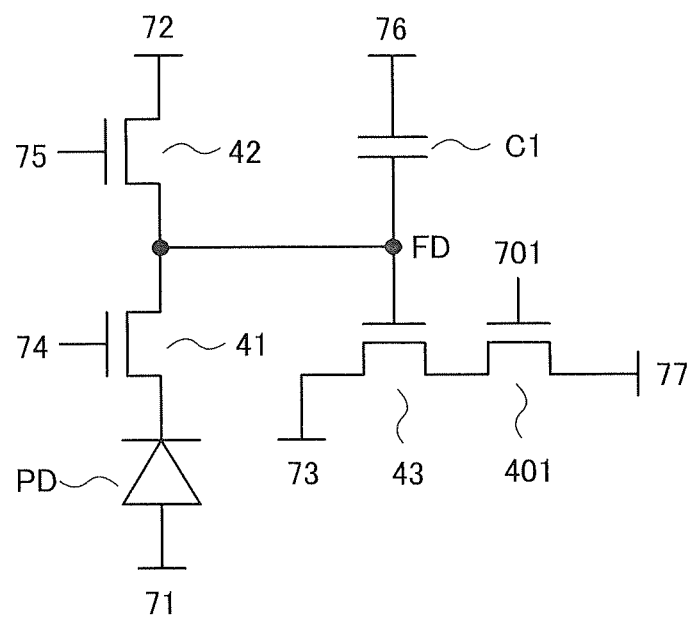
FIGS. 9A and 9B are circuit diagrams each illustrating a pixel.
Figure 9B:
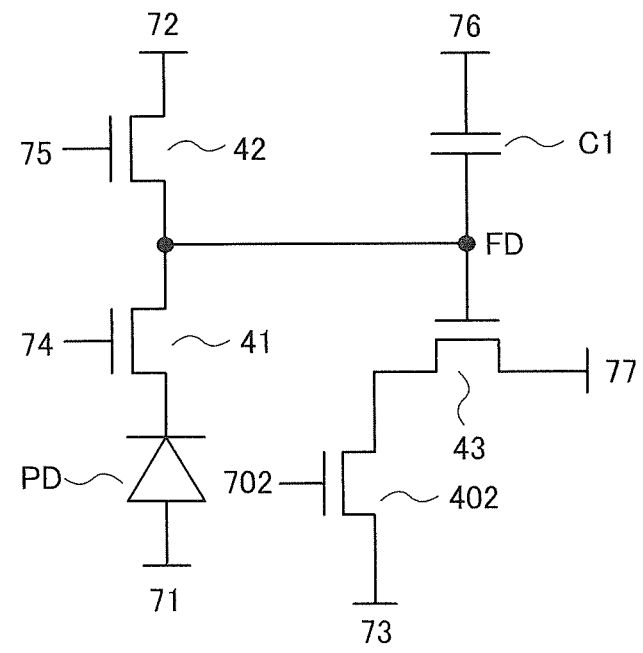

As illustrated in FIG. 9A, a transistor 401 may be provided between the transistor 43 and the wiring 77. The transistor 401 functions as a switching transistor which is controlled by the potential of a wiring 701. As illustrated in FIG. 9B, a transistor 402 may be provided between the transistor 43 and the wiring 73. The transistor 402 functions as a switching transistor which is controlled by the potential of a wiring 702.

Figure 10:
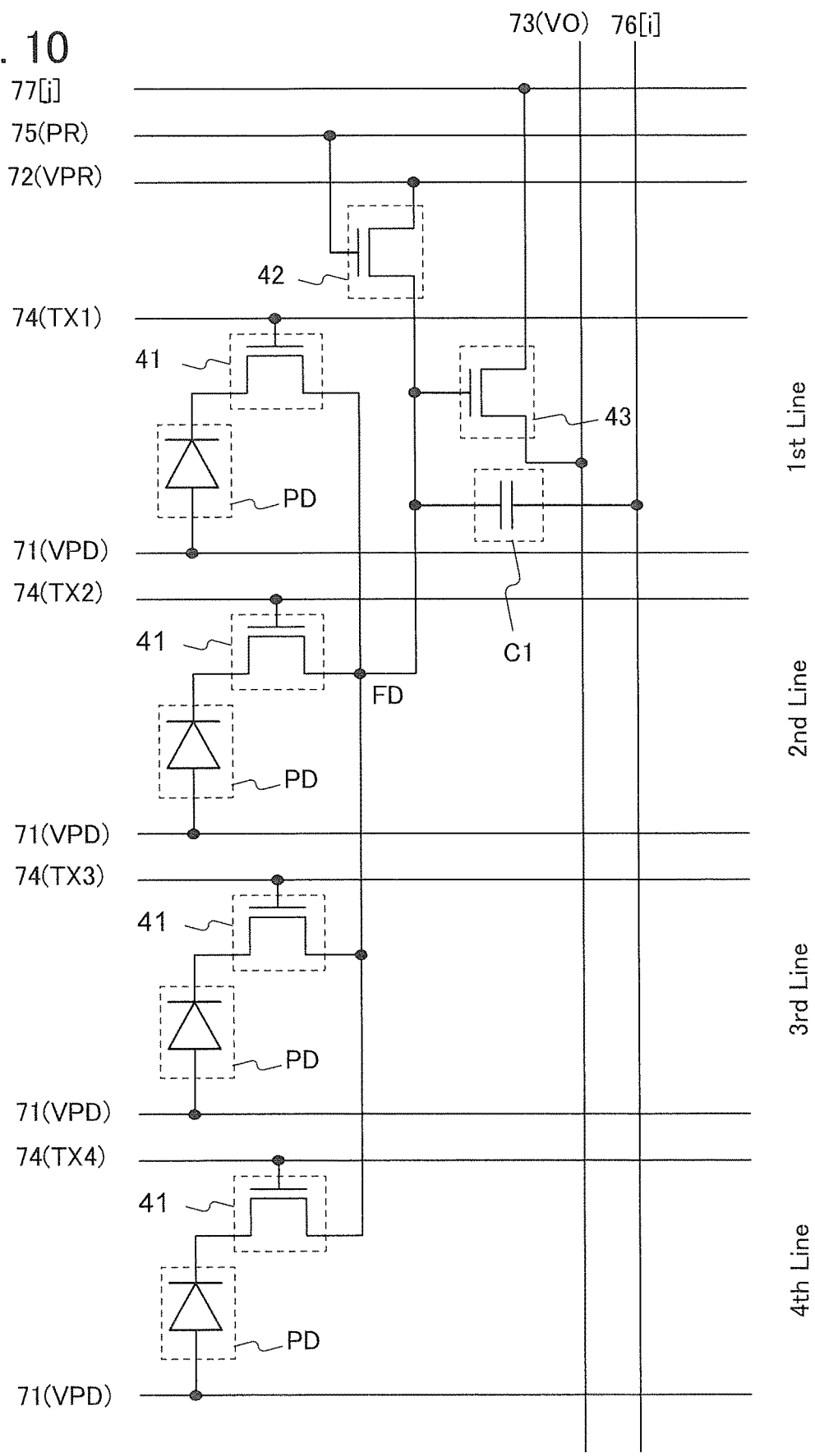
FIG. 10 is a circuit diagram illustrating pixels.

Note that the circuits of the pixels 20 and the reference pixels 22 may have configurations in which the transistors 42 and 43 are shared among a plurality of pixels as illustrated in FIG. 10. FIG. 10 illustrates a configuration in which the transistors 42 and 43 are shared among a plurality of pixels in a perpendicular direction. The transistors 42 and 43 may be shared among a plurality of pixels in a horizontal direction or among a plurality of pixels in horizontal and perpendicular directions. Such a configuration can reduce the number of transistors included in one pixel. Although FIG. 10 illustrates a configuration in which the transistors 42 and 43 are shared among four pixels, the transistors 42 and 43 may be shared among two pixels, three pixels, or five or more pixels. Note that the configuration can be optionally combined with any of the configurations in FIGS. 8A to 8D and the configurations in FIGS. 9A and 9B.

Figure 11A:
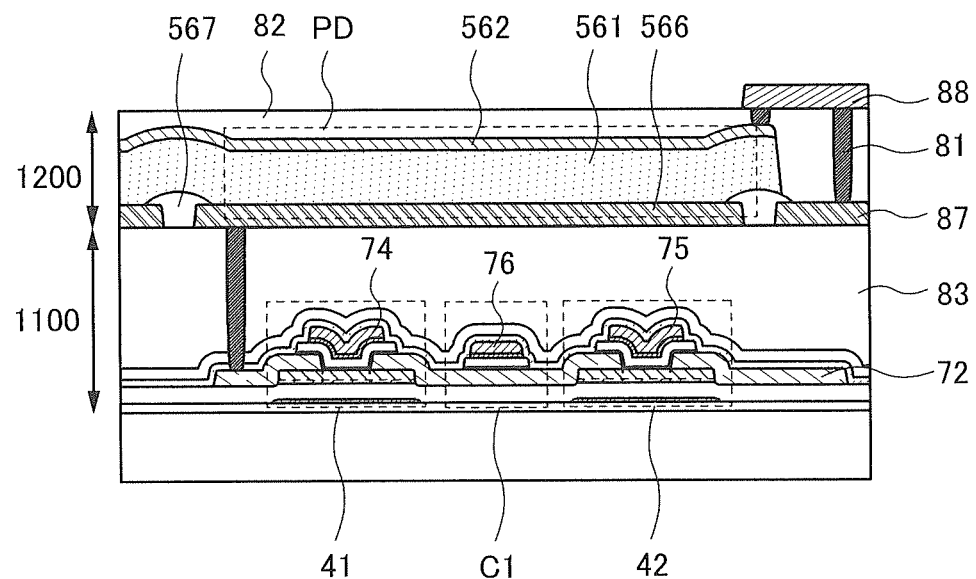
FIGS. 11A to 11C are cross-sectional views each illustrating a structure of an imaging device.

Next, specific structure examples of the imaging device of one embodiment of the present invention are described below with reference to drawings. FIG. 11A illustrates an example of a specific connection between the photoelectric conversion element PD, the transistor 41, the transistor 42, and the capacitor C1 which are included in each of the pixels 20 in FIG. 2. Note that the transistor 43 is not illustrated in FIG. 11A. The pixels 20 each include a tier 1100 including the transistors 41 to 43 and the capacitor C1, and a tier 1200 including the photoelectric conversion element PD.

Although the wirings, electrodes, and conductors are illustrated as independent components in cross-sectional views in this embodiment, some of them are provided as one component in some cases when they are electrically connected to each other. In addition, a structure in which a gate electrode, a source electrode, or a drain electrode of the transistor is connected to the wirings through a conductor is only an example. The gate electrode, the source electrode, and the drain electrode of the transistor might each function as a wiring.

Over the components, an insulating layer 82, an insulating layer 83, and the like that function as protective films, interlayer insulating films, or planarization films are provided. For example, an inorganic insulating film such as a silicon oxide film or a silicon oxynitride film can be used as each of the insulating layers 82 and 83 and the like. Alternatively, an organic insulating film such as an acrylic resin film or a polyimide resin film may be used. Top surfaces of the insulating layers 82 and 83 and the like are preferably planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. In some cases, a layer that is not illustrated in the drawing is included in the stacked-layer structure. One or more of the layers illustrated in the drawing are not included in some cases.

It is particularly preferable to use transistors containing an oxide semiconductor (OS transistor) as the transistors 41 and 43.

Extremely low off-state current of the OS transistor can widen the dynamic range of imaging. In the circuit configuration of each of the pixels 20 in FIG. 2, an increase in the intensity of light entering the photoelectric conversion element PD reduces the potential of the charge accumulation portion (FD). Since the transistor containing an oxide semiconductor has extremely low off-state current, a current based on a gate potential can be accurately output even when the gate potential is extremely low. Accordingly, it is possible to widen the detection range of illuminance, i.e., the dynamic range.

A period during which charge can be held in the charge accumulation portion (FD) can be extremely long owing to the low off-state current of the transistors 41 and 42. Therefore, a global shutter system in which an accumulation operation is performed in all the pixels at the same time can be used without complicated circuit configurations and operation methods.

Figure 12A:
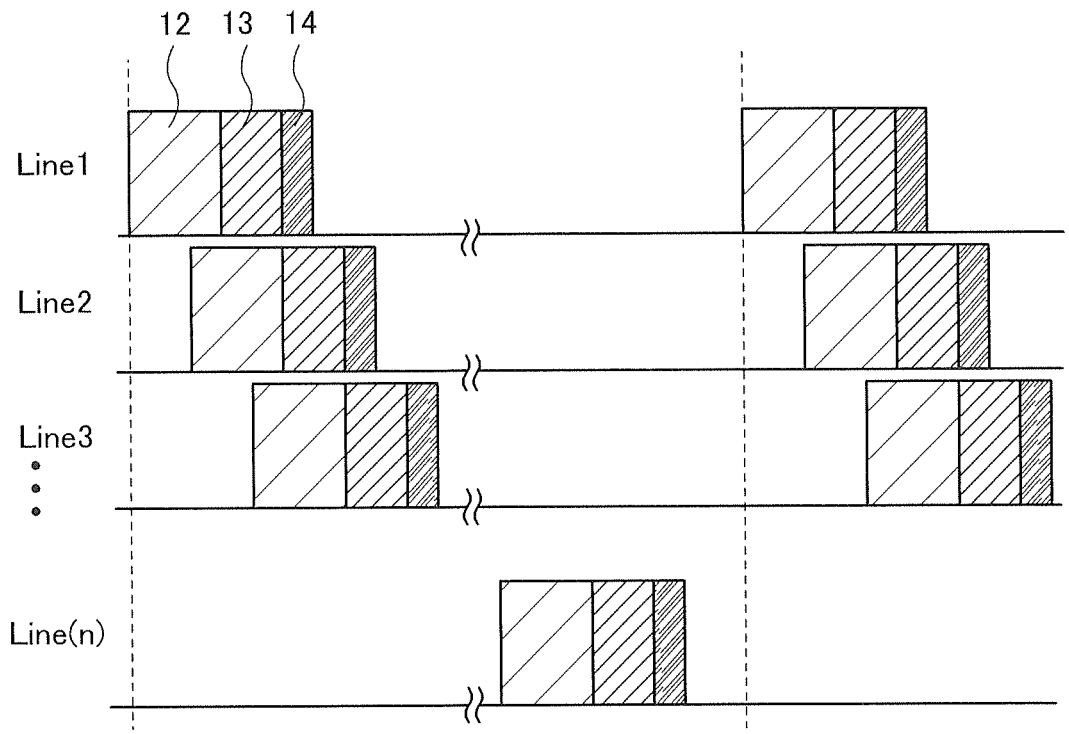
FIGS. 12A and 12B illustrate operations of a global shutter system and a rolling shutter system.

In a general imaging device where pixels are arranged in a matrix, a rolling shutter system is employed in which an imaging operation 12, a retention operation 13, and a read operation 14 are performed row by row as illustrated in FIG. 12A. In the case of employing the rolling shutter system, simultaneousness of imaging is lost. Therefore, when an object moves, an image is distorted.

Figure 12B:
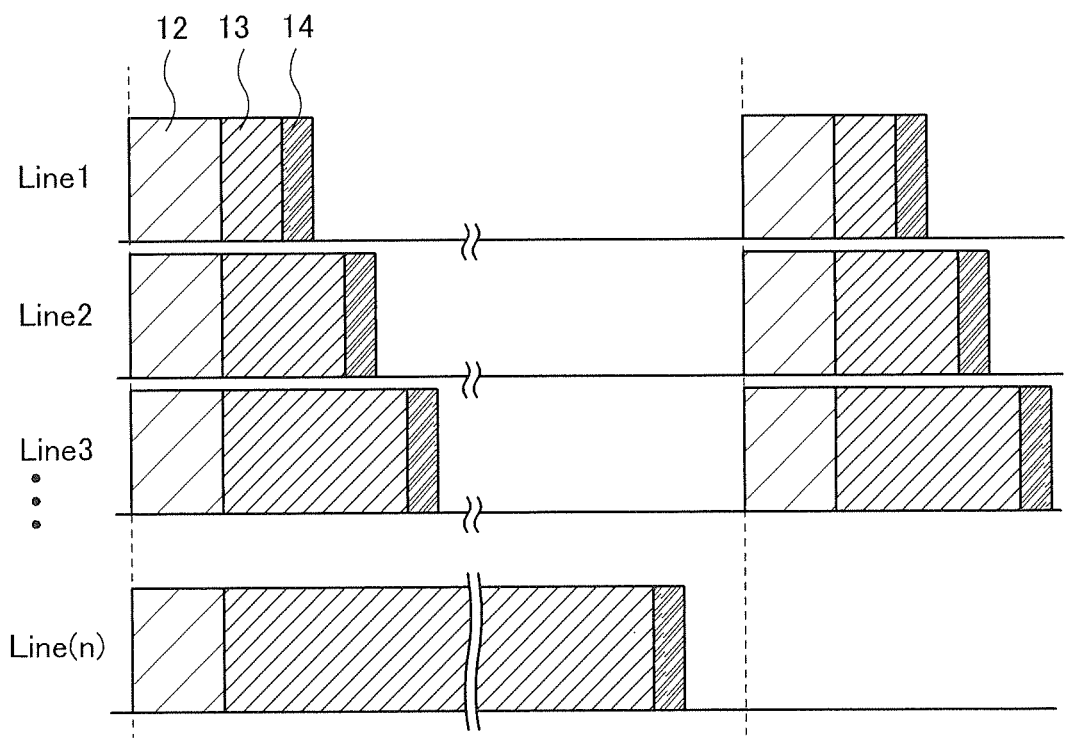

For this reason, in one embodiment of the present invention, it is preferable to employ a global shutter system in which the imaging operation 12 and the retention operation 13 can be performed simultaneously in all the rows and the read operation 14 can be performed row by row as illustrated in FIG. 12B. By employing the global shutter system, simultaneousness of imaging in all the pixels in the imaging device can be secured, and an image with little distortion can be easily obtained even when an object moves. Furthermore, exposure time (a period for conducting a charge accumulation operation) can be long in a global shutter system; thus, the global shutter system is suitable for imaging even in a low illuminance environment.

In addition, the OS transistor has lower temperature dependence of change in electrical characteristics than a transistor containing silicon in an active region or an active layer (hereinafter, such a transistor is referred to as a Si transistor), and thus can be used in an extremely wide range of temperatures. Therefore, an imaging device and a semiconductor device that include OS transistors are suitable for use in automobiles, aircrafts, and spacecrafts.

Moreover, the OS transistor has higher drain breakdown voltage than the Si transistor. In a photoelectric conversion element containing a selenium-based material in a photoelectric conversion layer, a relatively high voltage (e.g., 10 V or higher) is preferably applied so that an avalanche phenomenon is easily caused. Therefore, the combination of the OS transistor and the photoelectric conversion element containing a selenium-based material in the photoelectric conversion layer can provide a highly reliable imaging device.

Figure 11B:
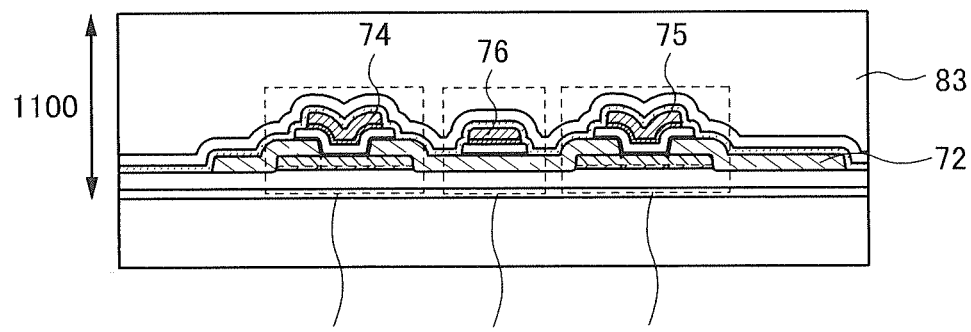
Figure 11C:
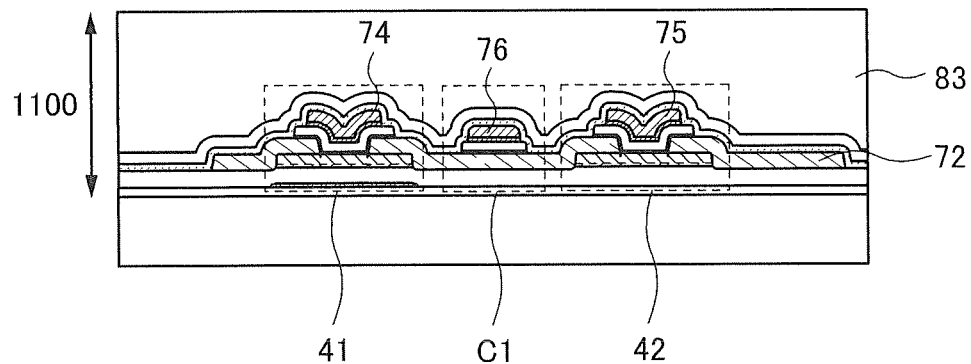

Note that although each transistor includes a back gate in FIG. 11A, each transistor does not necessarily include a back gate as illustrated in FIG. 11B. Alternatively, one or more transistors, for example, only the transistor 41, as illustrated in FIG. 11C, may include a back gate. The back gate might be electrically connected to a front gate of the transistor, which faces the back gate. Note that different fixed potentials might be supplied to the back gate and the front gate. The presence or absence of the back gate can also be applied to another pixel described in this embodiment.

Any of a variety of elements can be used as the photoelectric conversion element PD provided in the tier 1200. FIG. 11A illustrates the photoelectric conversion element PD containing a selenium-based material in a photoelectric conversion layer 561. The photoelectric conversion element PD containing a selenium-based material has high external quantum efficiency with respect to visible light. Such a photoelectric conversion element can be a highly sensitive sensor in which the amount of amplification of electrons with respect to the amount of incident light is large because of an avalanche phenomenon. Furthermore, the selenium-based material has a high light-absorption coefficient, making the photoelectric conversion layer 561 thin easily.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to visible light and a higher absorption coefficient for visible light than amorphous selenium.

Although the photoelectric conversion layer 561 is a single layer, a structure can be employed in which gallium oxide, cerium oxide, or the like is provided for a hole injection blocking layer on a light-receiving surface side of a selenium-based material, and nickel oxide, antimony sulfide, or the like is provided for an electron injection blocking layer on an electrode 566 side.

The photoelectric conversion layer 561 may be a layer containing a compound of copper, indium, and selenium (CIS). Alternatively, a layer containing a compound of copper, indium, gallium, and selenium (CIGS) may be used. A photoelectric conversion element containing CIS or CIGS can also utilize an avalanche phenomenon like the photoelectric conversion element containing selenium alone.

In the photoelectric conversion element PD containing the selenium-based material, for example, the photoelectric conversion layer 561 can be provided between a light-transmitting conductive layer 562 and the electrode 566 formed using a metal material or the like. Since CIS and CIGS are p-type semiconductors, an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to cause the avalanche phenomenon. Since the OS transistor has higher drain breakdown voltage than the Si transistor, the application of a relatively high voltage to the photoelectric conversion element is easy. Thus, the combination of the OS transistor having high drain breakdown voltage and the photoelectric conversion element containing the selenium-based material in the photoelectric conversion layer can provide a highly sensitive and highly reliable imaging device.

Figure 13A:
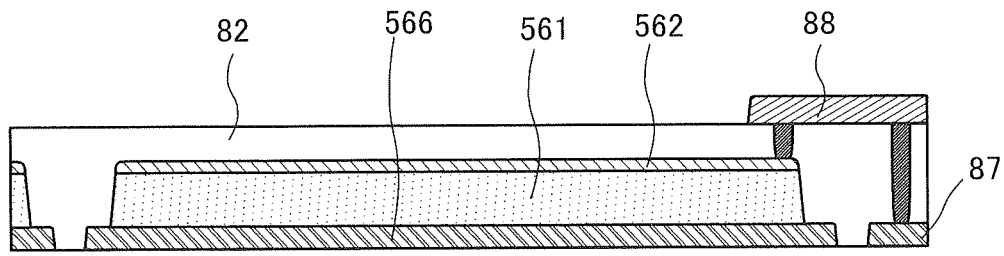
FIGS. 13A to 13D are cross-sectional views each illustrating a connection in a photoelectric conversion element.
Figure 13B:
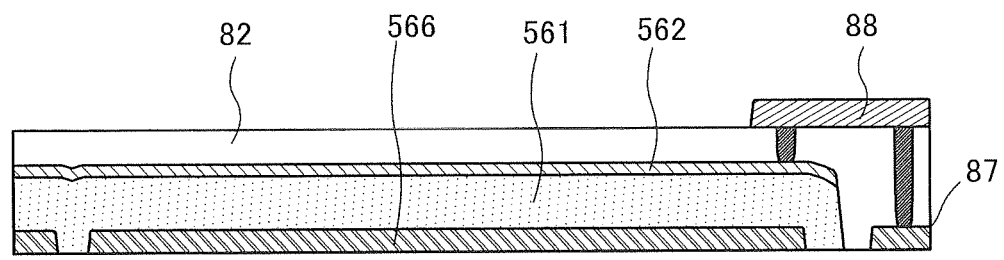
Figure 13C:
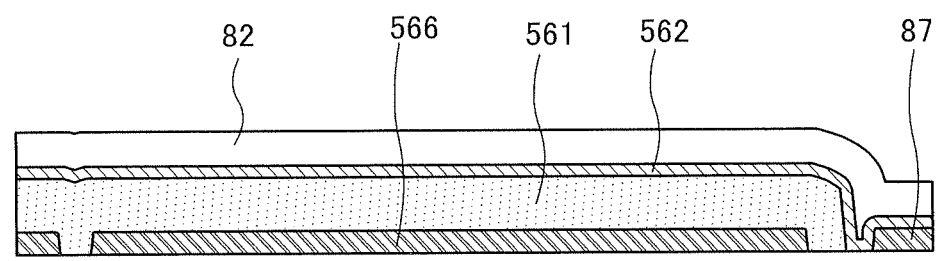
Figure 13D:
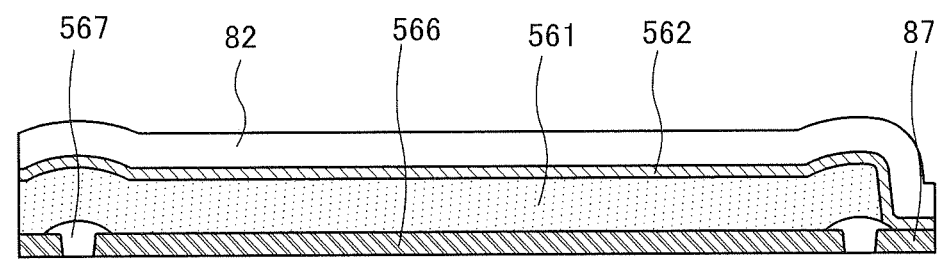

Although the photoelectric conversion layer 561 and the light-transmitting conductive layer 562 are not divided between pixel circuits in FIG. 11A, they may be divided between circuits as illustrated in FIG. 13A. In a region between pixels where the electrode 566 is not provided, a partition wall 567 formed of an insulator is preferably provided, thereby preventing generation of a crack in the photoelectric conversion layer 561 and the light-transmitting conductive layer 562. However, the partition wall 567 is not necessarily provided as illustrated in FIG. 13B. Although the light-transmitting conductive layer 562 and a wiring 87 are connected to each other through a wiring 88 and a conductor 81 in FIG. 11A, the light-transmitting conductive layer 562 and the wiring 87 may be in direct contact with each other as in FIGS. 13C and 13D.

Figure 14A:
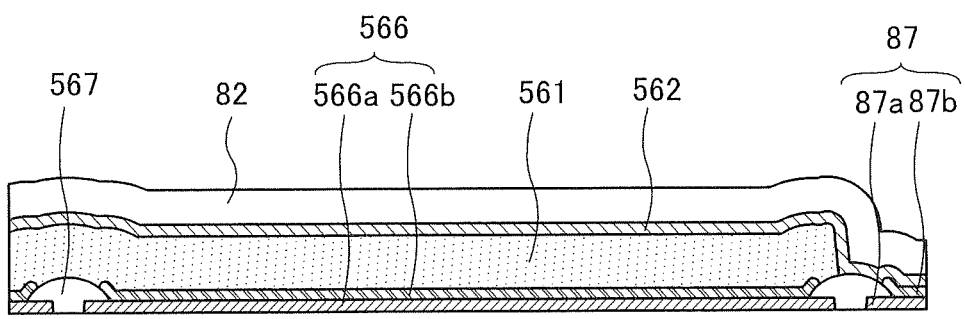
FIGS. 14A and 14B are cross-sectional views each illustrating a connection in a photoelectric conversion element.

The electrode 566, the wiring 87, and the like may each be a multilayer. For example, as illustrated in FIG. 14A, the electrode 566 can include two conductive layers 566a and 566b and the wiring 87 can include two conductive layers 87a and 87b. In the structure in FIG. 14A, for example, the conductive layers 566a and 87a may be made of a low-resistance metal or the like, and the conductive layers 566b and 87b may be made of a metal or the like that exhibits an excellent contact property with the photoelectric conversion layer 561. Such a structure can improve the electrical characteristics of the photoelectric conversion element PD. Furthermore, even when the conductive layer 87a contains a metal that causes electrolytic corrosion by being in contact with the light-transmitting conductive layer 562, the electrolytic corrosion can be prevented because the conductive layer 87b is between the conductive layer 87a and the light-transmitting conductive layer 562.

The conductive layers 566b and 87b can be formed using, for example, molybdenum, tungsten, or the like. The conductive layers 566a and 87a can be formed using, for example, aluminum, titanium, or a stack of titanium, aluminum, and titanium that are layered in this order.

Figure 14B:
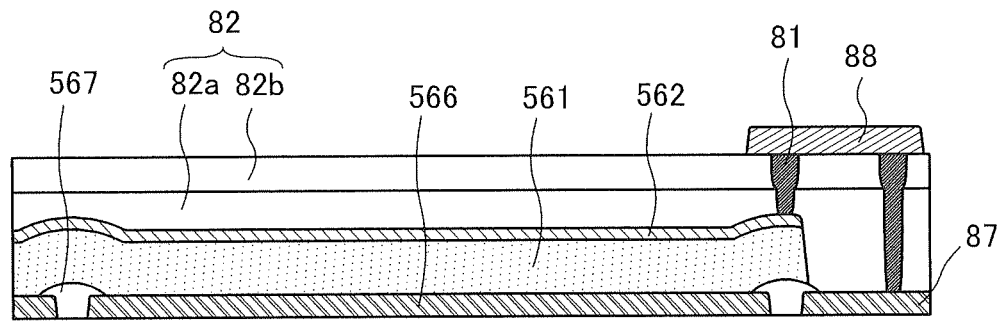

The insulating layer 82 and the like may each be a multilayer. In the case where the insulating layer 82 includes insulating layers 82a and 82b that have different etching rates as illustrated in FIG. 14B, for example, the conductor 81 has a difference in level. In the case where another insulating layer used as an interlayer insulating film or a planarization film is a multilayer, the conductor 81 also has a difference in level. Although the insulating layer 82 is formed using two layers here, the insulating layer 82 and another insulating layer may each be formed using three or more layers.

Note that the partition wall 567 can be formed using an inorganic insulator, an insulating organic resin, or the like. The partition wall 567 may be colored black or the like in order to shield the transistors and the like from light and/or to determine the area of a light-receiving portion in each pixel.

As the photoelectric conversion element PD, a PIN diode element formed using an amorphous silicon film, a microcrystalline silicon film, or the like may be used.

Figure 15:
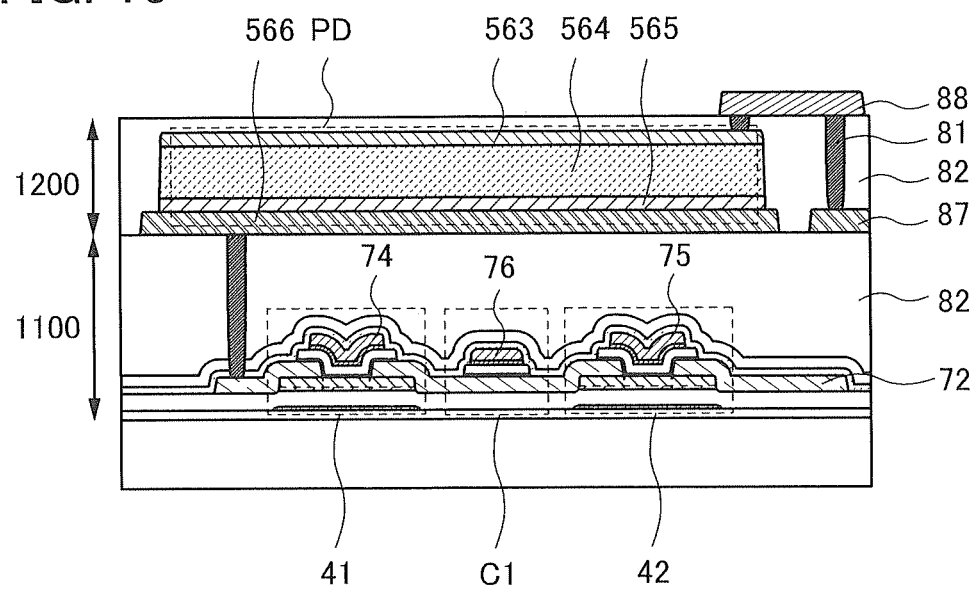
FIG. 15 is a cross-sectional view illustrating an imaging device.

FIG. 15 illustrates an example in which a thin film PIN photodiode is used as the photoelectric conversion element PD. In the photodiode, an n-type semiconductor layer 565, an i-type semiconductor layer 564, and a p-type semiconductor layer 563 are stacked in this order. The i-type semiconductor layer 564 is preferably formed using amorphous silicon. The p-type semiconductor layer 563 and the n-type semiconductor layer 565 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and thus can easily sense weak visible light.

In the photoelectric conversion element PD in FIG. 15, the n-type semiconductor layer 565 serving as a cathode is electrically connected to the electrode 566 that is electrically connected to the transistor 41. Furthermore, the p-type semiconductor layer 563 serving as an anode is electrically connected to the wiring 87 through the conductor 81.

Note that in the circuit diagram in FIG. 2 illustrating the pixels 20, each of the photoelectric conversion elements PD may be connected in a manner opposite to that illustrated in FIG. 2. Thus, in FIG. 15, the anode and the cathode of the photoelectric conversion element PD may be connected to the electrode layer and the wiring, respectively.

In any case, the photoelectric conversion element PD is preferably formed such that the p-type semiconductor layer 563 serves as a light-receiving surface. When the p-type semiconductor layer 563 serves as a light-receiving surface, the output current of the photoelectric conversion element PD can be increased.

FIGS. 16A to 16F show other examples of the structure of the photoelectric conversion element PD having a configuration of a PIN thin film photodiode and the connection between the photoelectric conversion element PD and the wirings. Note that the structure of the photoelectric conversion element PD and the connection between the photoelectric conversion element PD and the wirings are not limited thereto, and other configurations may be applied.

Figure 16A:
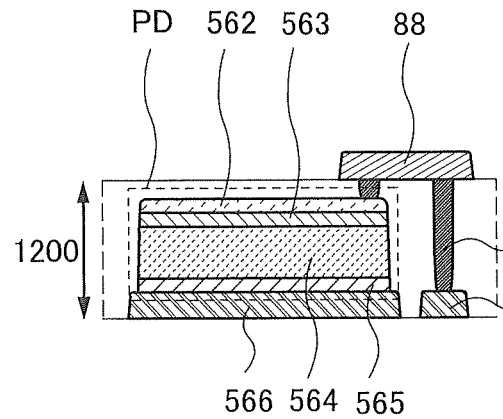
FIGS. 16A to 16F are cross-sectional views each illustrating a connection in a photoelectric conversion element.

FIG. 16A illustrates a structure of the photoelectric conversion element PD that includes the light-transmitting conductive layer 562 in contact with the p-type semiconductor layer 563. The light-transmitting conductive layer 562 serves as an electrode and can increase the output current of the photoelectric conversion element PD.

For the light-transmitting conductive layer 562, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 562 is not limited to a single layer, and may be a stacked layer of different films.

Figure 16B:
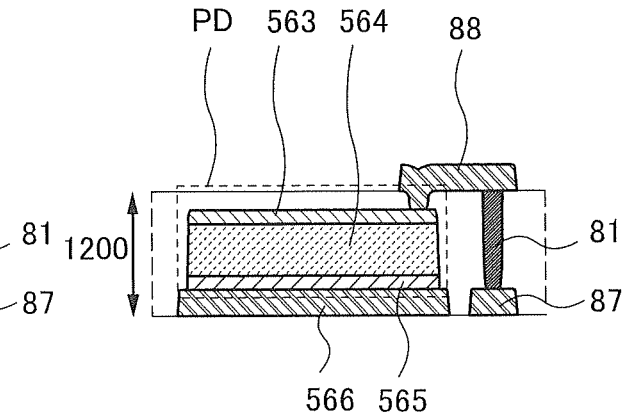

FIG. 16B illustrates a structure in which the p-type semiconductor layer 563 of the photoelectric conversion element PD is electrically connected directly to the wiring 88.

Figure 16C:
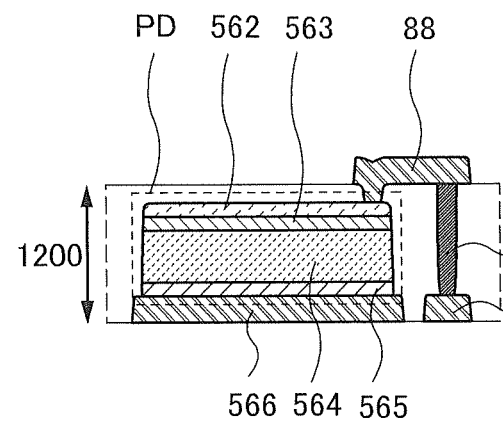

FIG. 16C illustrates a structure of the photoelectric conversion element PD in which the light-transmitting conductive layer 562 is in contact with the p-type semiconductor layer 563 and the wiring 87 is electrically connected to the light-transmitting conductive layer 562.

Figure 16D:
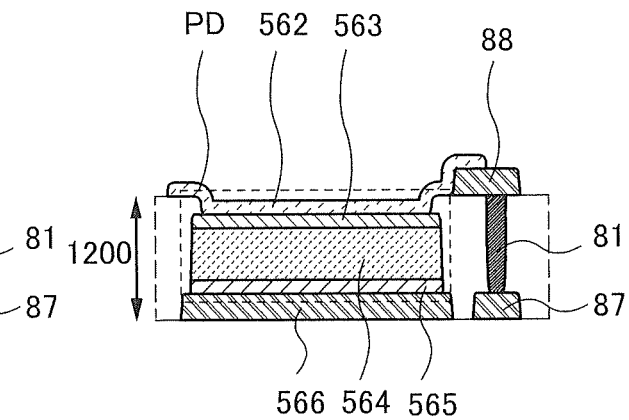

FIG. 16D illustrates a structure in which an opening exposing the p-type semiconductor layer 563 is provided in an insulating layer covering the photoelectric conversion element PD, and the light-transmitting conductive layer 562 that covers the opening is electrically connected to the wiring 88.

Figure 16E:
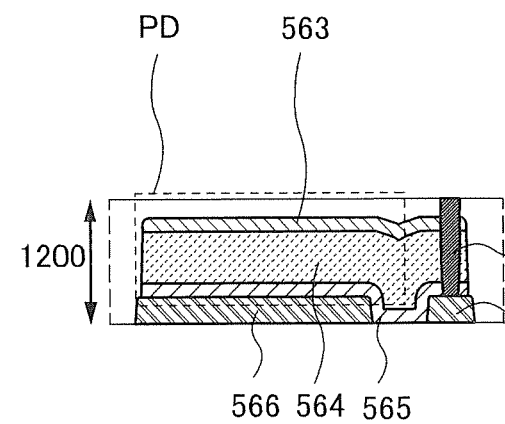

FIG. 16E illustrates a structure including the conductor 81 which penetrates the photoelectric conversion element PD. In the structure, the wiring 87 is electrically connected to the p-type semiconductor layer 563 through the conductor 81. Note that in the drawing, the wiring 87 appears to be electrically connected to the electrode 566 through the n-type semiconductor layer 565. However, because of a high resistance in the lateral direction of the n-type semiconductor layer 565, the resistance between the wiring 87 and the electrode 566 is extremely high when there is an appropriate distance therebetween. Thus, the photoelectric conversion element PD can have diode characteristics without a short circuit between the anode and the cathode. Note that two or more conductors 81 that are electrically connected to the p-type semiconductor layer 563 may be provided.

Figure 16F:
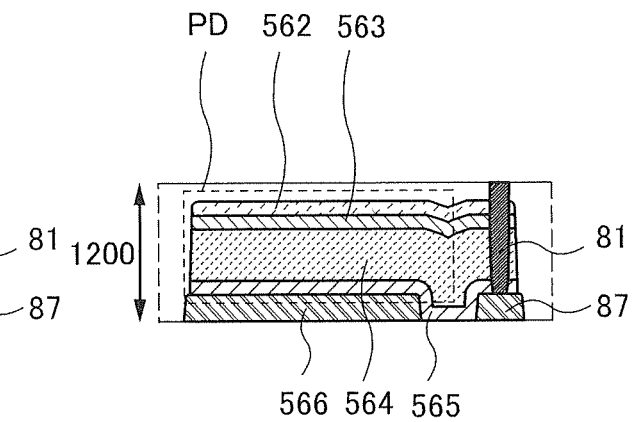

FIG. 16F illustrates a structure in which the photoelectric conversion element PD in FIG. 16E is provided with the light-transmitting conductive layer 562 in contact with the p-type semiconductor layer 563.

Note that each of the photoelectric conversion elements PD illustrated in FIGS. 16D to 16F has an advantage of having a large light-receiving area because wirings and the like do not overlap with a light-receiving region.

Figure 17:
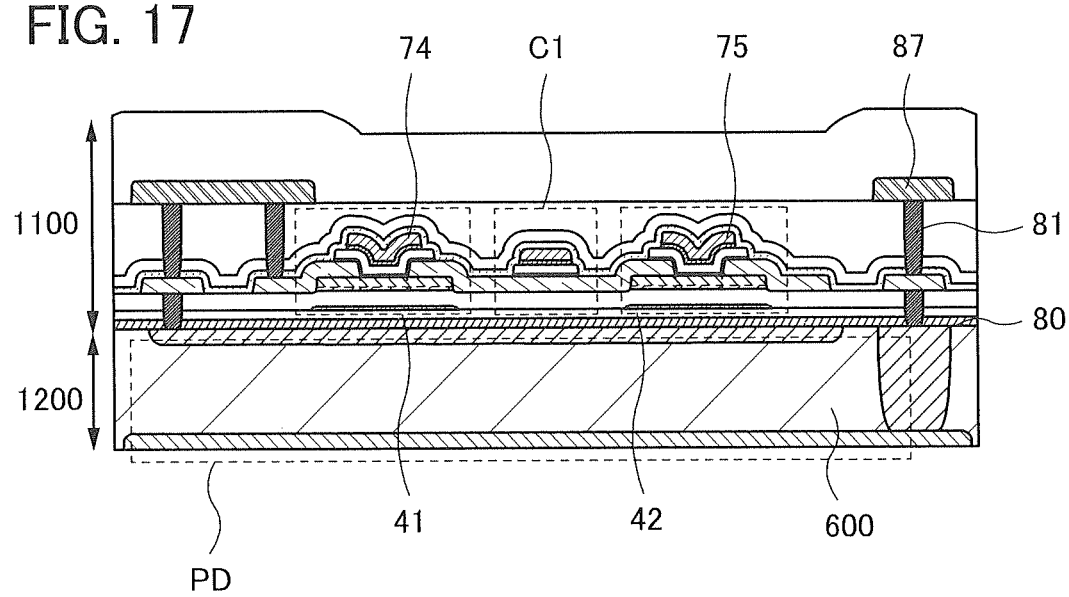
FIG. 17 is a cross-sectional view illustrating an imaging device.

Alternatively, as illustrated in FIG. 17, the photoelectric conversion element PD may be a photodiode including a silicon substrate 600 as a photoelectric conversion layer.

The photoelectric conversion element PD formed using the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 561 does not need to be divided between circuits as illustrated in FIG. 11A. Therefore, the imaging device of one embodiment of the present invention can be manufactured with a high yield at low cost. In contrast, a photodiode including the silicon substrate 600 as the photoelectric conversion layer requires difficult processes such as a polishing process and a bonding process.

Figure 18A:
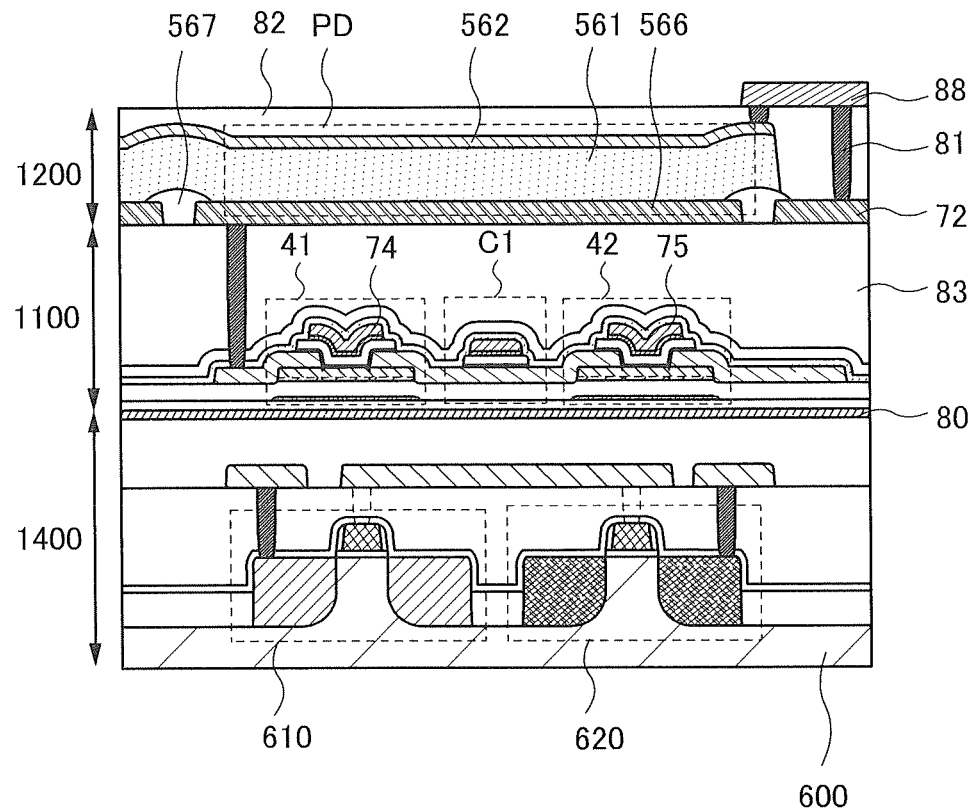
FIGS. 18A and 18B are cross-sectional views each illustrating an imaging device.
Figure 18B:
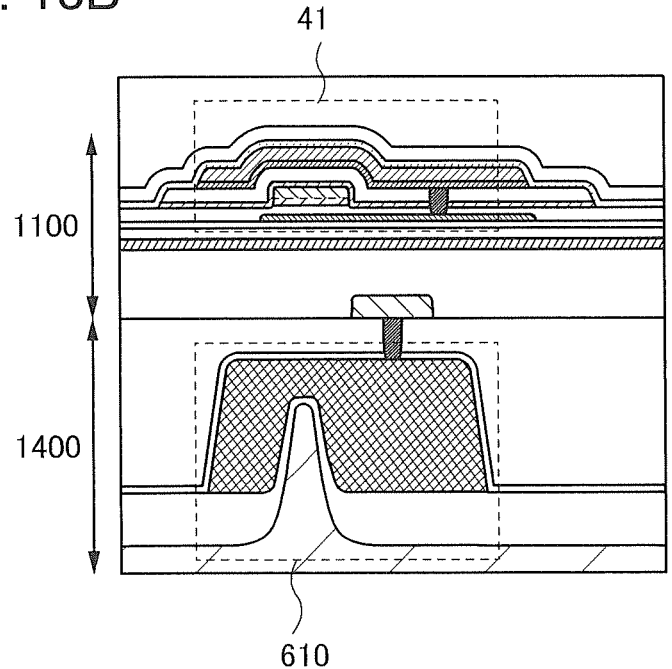

Furthermore, in the imaging device of one embodiment of the present invention, a stack including the silicon substrate 600 in which a circuit is formed may be used. For example, as illustrated in FIG. 18A, the pixel circuit may overlap with a tier 1400 that includes a transistor 610 and a transistor 620 whose active regions are formed in the silicon substrate 600. FIG. 18B is a cross-sectional view illustrating the transistors in the channel width direction.

Figure 19A:
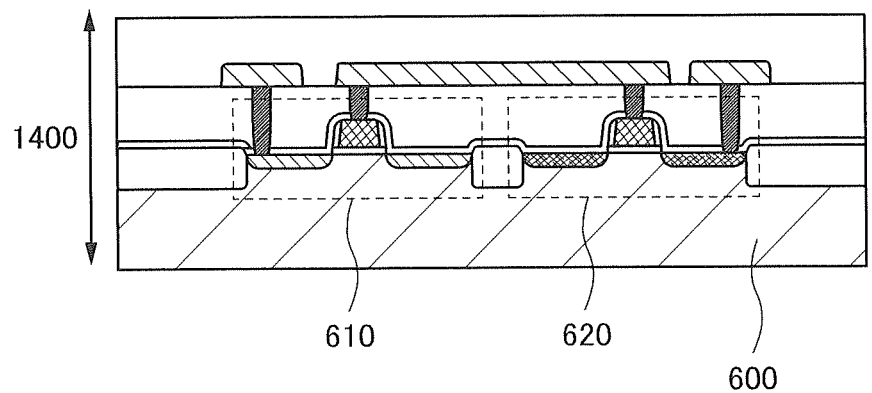
FIGS. 19A to 19C are cross-sectional views and a circuit diagram each illustrating an imaging device.
Figure 19B:
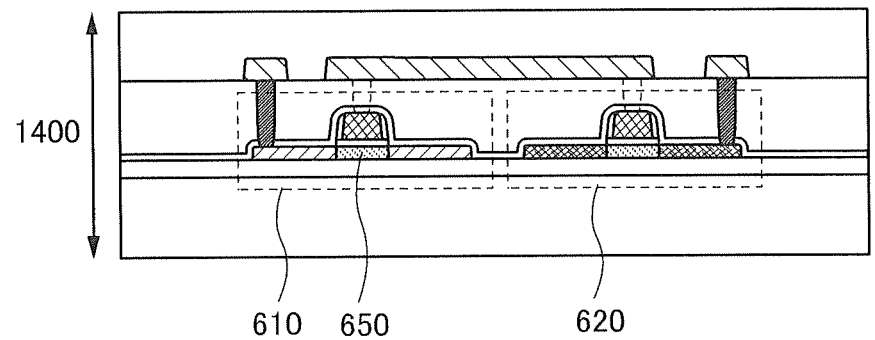

Although FIGS. 18A and 18B show fin type Si transistors, planar type transistors may be used as illustrated in FIG. 19A. Alternatively, as illustrated in FIG. 19B, transistors each including an active layer 650 formed using a silicon thin film may be used. The active layer 650 can be formed using polycrystalline silicon or single crystal silicon of a silicon-on-insulator (SOI) structure.

Figure 19C:
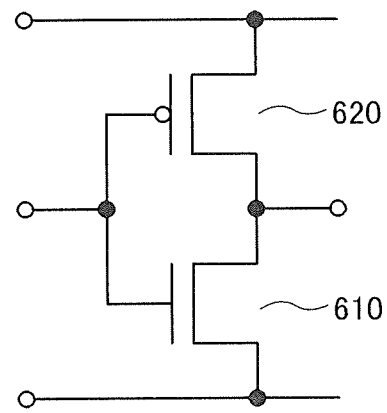

The circuit formed in the silicon substrate 600 is capable of reading a signal output from the pixel circuit and converting the signal, for example. The circuit may include, for example, a CMOS inverter as illustrated in the circuit diagram in FIG. 19C. A gate of the transistor 610 (n-channel transistor) is electrically connected to a gate of the transistor 620 (p-channel transistor). One of a source and a drain of one of the transistors 610 and 620 is electrically connected to one of a source and a drain of the other transistor. The other of the source and the drain of the one transistor and the other of the source and the drain of the other transistor are electrically connected to different wirings.

Examples of the circuit formed in the silicon substrate 600 include the analog processing circuit 24, the row decoder 25, the A/D converter 26, the memory element array 31, the analog processing circuit 34, the row decoder 35, and the column decoder 36 illustrated in FIG. 1.

The silicon substrate 600 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 17 and FIG. 18A, an insulating layer 80 is provided between a region including an oxide semiconductor transistor and a region including a Si device (a Si transistor or a Si photodiode).

Dangling bonds of silicon are terminated with hydrogen in insulating layers provided in the vicinities of the active regions of the transistors 610 and 620. Therefore, the hydrogen has an effect of improving the reliability of the transistors 610 and 620. Meanwhile, hydrogen in insulating layers provided in the vicinity of the oxide semiconductor layer that is the active layer of the transistor 41 or the like causes generation of carriers in the oxide semiconductor layer, and thus may reduce the reliability of the transistor 41 or the like. For this reason, the insulating layer 80 having a function of preventing diffusion of hydrogen is preferably provided between one layer including the transistor using a silicon-based semiconductor material and another layer stacked thereover that includes the transistor using an oxide semiconductor. Hydrogen is confined in the one layer owing to the insulating layer 80, so that the reliability of the transistors 610 and 620 can be improved. Furthermore, diffusion of hydrogen from the one layer to the other layer is inhibited, leading to an improvement in the reliability of the transistor 41 or the like.

The insulating layer 80 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIG. 11A, a circuit (e.g., a driver circuit) formed in the silicon substrate 600, the transistor 41 and the like, and the photoelectric conversion element PD can overlap with each other; thus, the density of pixels can be increased. In other words, the resolution of the imaging device can be increased. Such a structure is suitable for an imaging device with, for example, 4K2K, 8K4K, or 16K8K pixels. Note that a structure may be employed in which Si transistors are formed as the transistors 43 and the like included in the pixels 20 so as to overlap with the transistors 41 and 42, the photoelectric conversion element PD, and the like.

Figure 20:
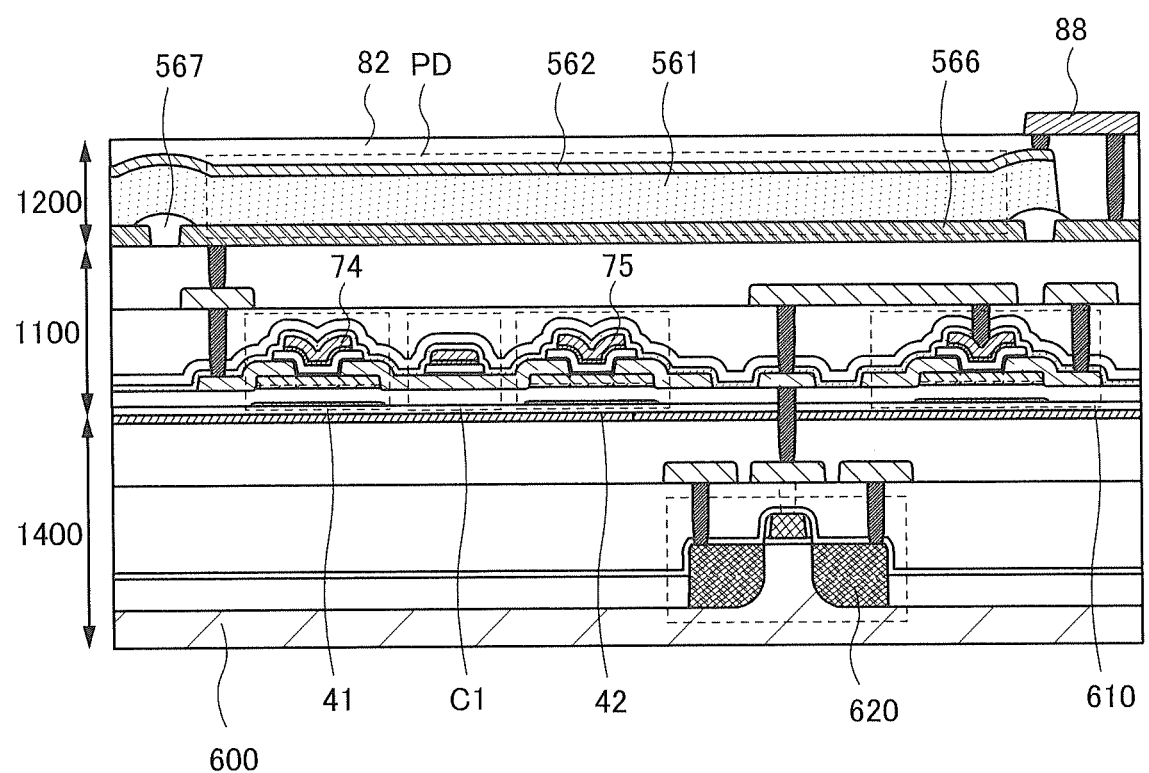
FIG. 20 is a cross-sectional view illustrating an imaging device.

The imaging device of one embodiment of the present invention can also have a structure in FIG. 20.

An imaging device in FIG. 20 is a modification example of the imaging device in FIG. 18A. A CMOS inverter is formed using an OS transistor and a Si transistor.

Here, the transistor 620 provided in the tier 1400 is a p-channel Si transistor, and the transistor 610 provided in the tier 1100 is an n-channel OS transistor. When only the p-channel transistor is provided in the silicon substrate 600, a step of forming a well, an n-type impurity layer, or the like can be omitted.

Although selenium or the like is used for the photoelectric conversion element PD in the imaging device in FIG. 20, a thin film PIN photodiode may be used as in FIG. 15.

In the imaging device in FIG. 20, the transistor 610 can be formed through the same process as the transistors 41 and 42 formed in the tier 1100. Thus, the manufacturing process of the imaging device can be simplified.

Figure 21:
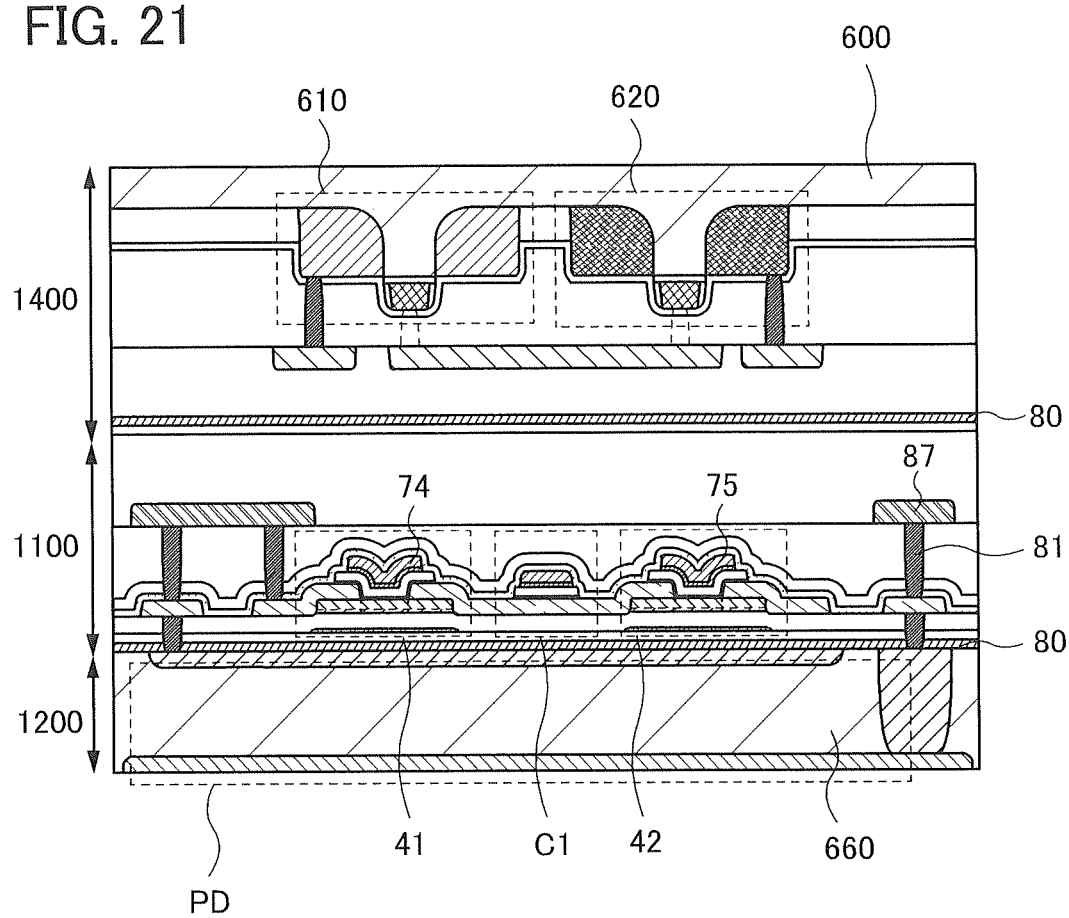
FIG. 21 is a cross-sectional view illustrating an imaging device.

As illustrated in FIG. 21, the imaging device of one embodiment of the present invention may have a structure where a pixel and the silicon substrate 600 in which a circuit is formed are attached to each other. Note that the pixel includes a photodiode formed in a silicon substrate 660 and OS transistors formed over the photodiode. Such a structure facilitates an increase in the effective area of the photodiode formed in the silicon substrate 660. Furthermore, when the integration degree of the circuit formed in the silicon substrate 600 is improved using miniaturized Si transistors, a high-performance semiconductor device can be provided.

Figure 22:
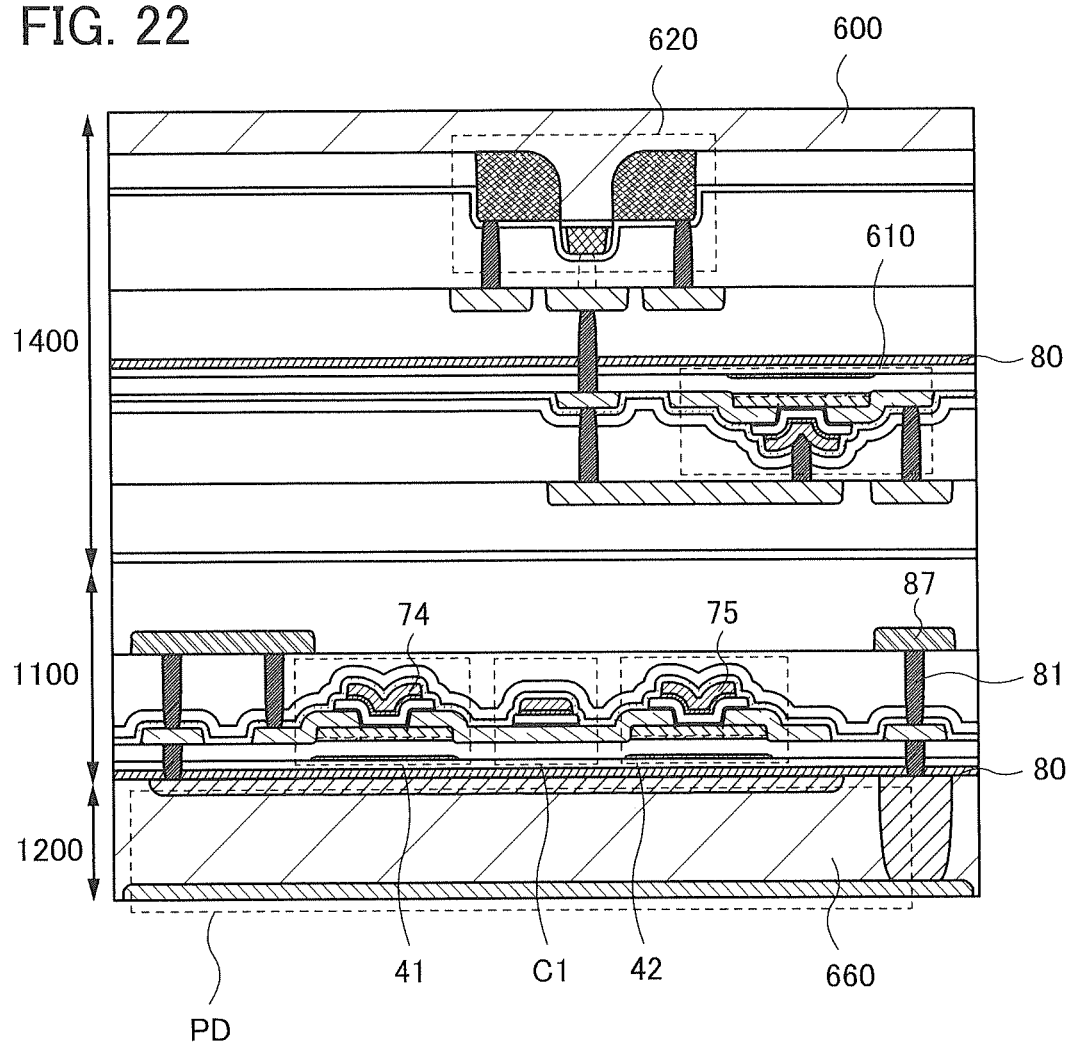
FIG. 22 is a cross-sectional view illustrating an imaging device.
Figure 23:
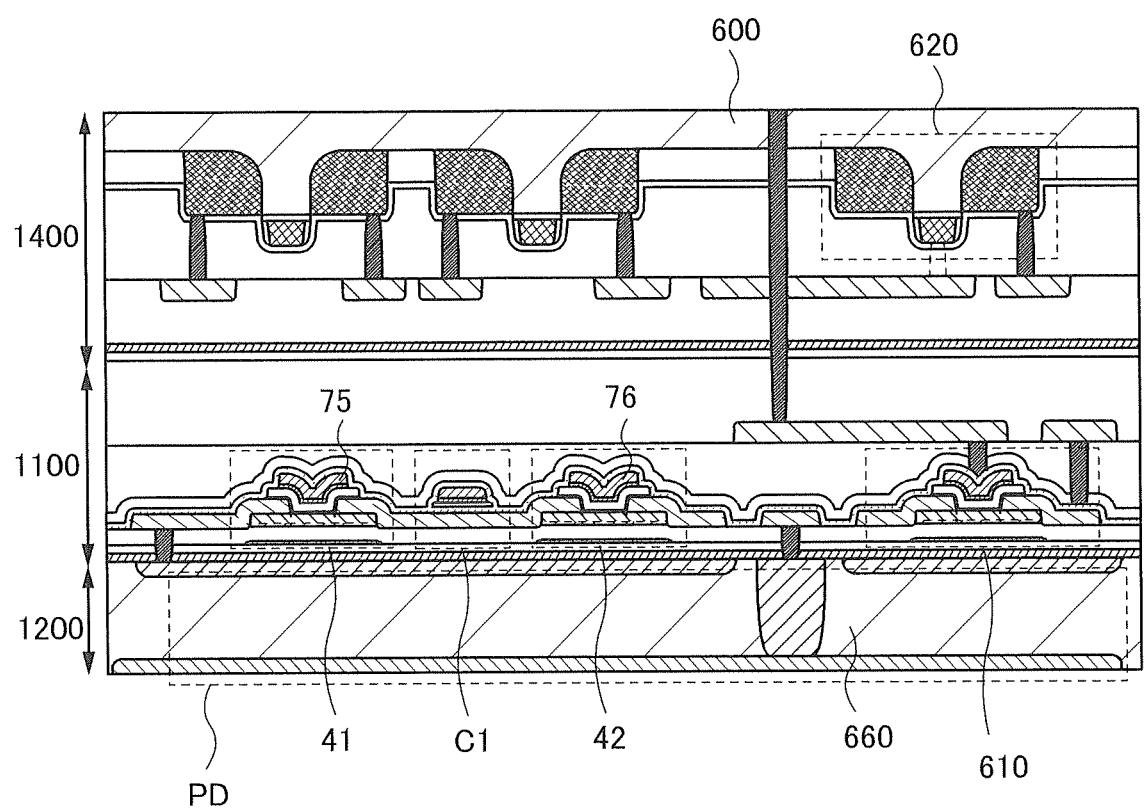
FIG. 23 is a cross-sectional view illustrating an imaging device.

FIG. 22 and FIG. 23 each show a modification example of FIG. 21, in which a circuit includes an OS transistor and a Si transistor. Such a structure facilitates an increase in the effective area of the photodiode formed in the silicon substrate 660. Furthermore, when the integration degree of the circuit formed in the silicon substrate 600 is improved using miniaturized Si transistors, a high-performance semiconductor device can be provided.

The structure illustrated in FIG. 22 is effective in the case of forming an image processing circuit or the like because a nonvolatile memory can be formed using an OS transistor and a Si transistor on the silicon substrate 600. In the case of the structure illustrated in FIG. 22, a CMOS circuit can be formed using the OS transistor and the Si transistor on the silicon substrate 600. Since the off-state current of the OS transistor is extremely low, the static leakage current of the CMOS circuit can be extremely low.

The structure illustrated in FIG. 23 is effective in the case of forming an image processing circuit or the like because a nonvolatile memory can be formed using an OS transistor over the silicon substrate 660 and a Si transistor on the silicon substrate 600. In the case of the structure illustrated in FIG. 23, a CMOS circuit can be formed using the OS transistor over the silicon substrate 660 and the Si transistor on the silicon substrate 600.

Note that the structures of the transistors and the photoelectric conversion elements included in the imaging devices described in this embodiment are only examples. Therefore, for example, one or more of the transistors 41 to 43 may include silicon or the like in an active region or an active layer. Furthermore, one of or both the transistors 610 and 620 may include an oxide semiconductor layer as an active layer.

Figure 24A:
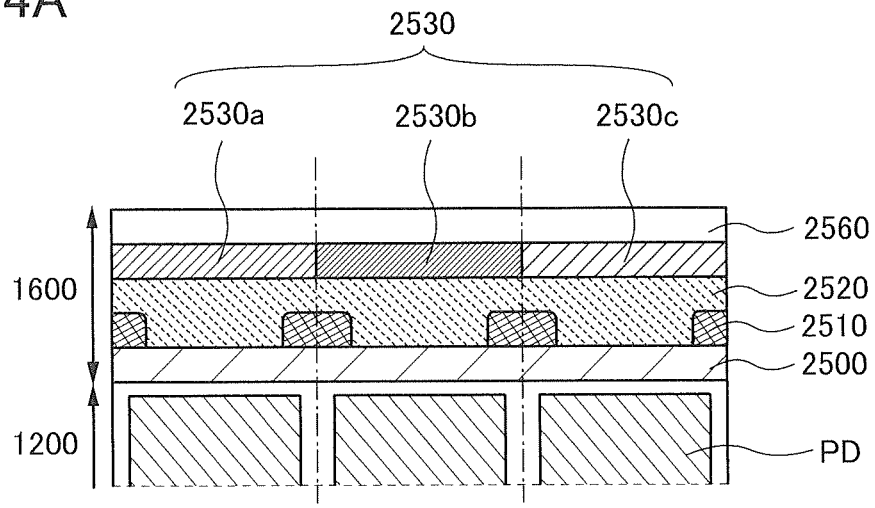
FIGS. 24A to 24C are cross-sectional views each illustrating a structure of an imaging device.

FIG. 24A is a cross-sectional view of an example of a mode in which a color filter and the like are added to the imaging device. The cross-sectional view illustrates part of a region including pixel circuits of three pixels. An insulating layer 2500 is formed over the tier 1200 where the photoelectric conversion element PD is formed. As the insulating layer 2500, a silicon oxide film or the like with a high visible-light transmitting property can be used. A silicon nitride film may be stacked as a passivation film. Furthermore, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the color filter. The light-blocking layer 2510 can be formed using a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 (a color filter 2530a, a color filter 2530b, or a color filter 2530c) is formed in each pixel. For example, the color filter 2530a, the color filter 2530b, and the color filter 2530c each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 24B:
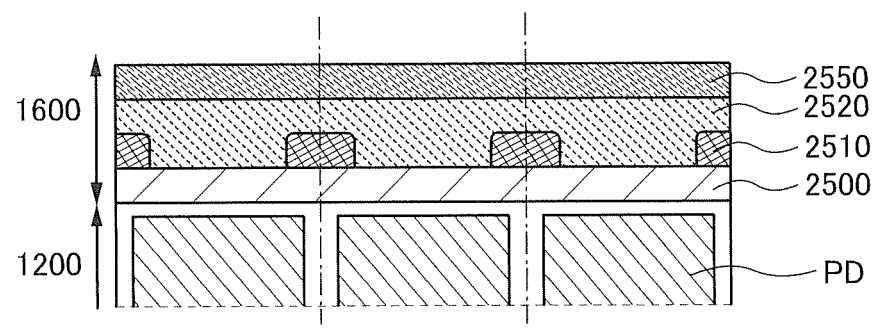

As illustrated in FIG. 24B, an optical conversion layer 2550 may be used instead of the color filter 2530. Such a structure enables the imaging device to take images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

When a scintillator is used for the optical conversion layer 2550, an imaging device that takes an image visualizing the intensity of radiation, which is used for an X-ray imaging device or the like, can be obtained. Radiation such as X-rays that passes through a subject to enter a scintillator is converted into light (fluorescence) such as visible light or ultraviolet light owing to a phenomenon known as photoluminescence. Then, the photoelectric conversion element PD detects the light to obtain image data. Furthermore, the imaging device having the structure may be used in a radiation detector or the like.

A scintillator is formed using a substance that, when irradiated with radiation such as X-rays or gamma-rays, absorbs energy of the radiation to emit visible light or ultraviolet light, or a material containing the substance. For example, materials such as $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO and a resin or ceramics in which any of the materials is dispersed can be used.

In the photoelectric conversion element PD containing a selenium-based material, radiation such as X-rays can be directly converted into charge; thus, the scintillator is unnecessary.

Figure 24C:
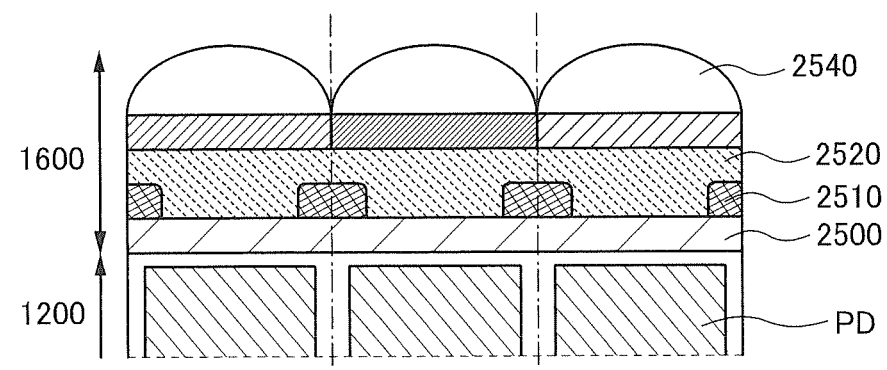

As illustrated in FIG. 24C, a microlens array 2540 may be provided over the color filters 2530a, 2530b, and 2530c. Light transmitting lenses included in the microlens array 2540 passes through the color filters positioned thereunder and enters the photoelectric conversion element PD. Note that a region other than the tier 1200 in FIGS. 24A to 24C is referred to as a layer 1600.

Figure 25:
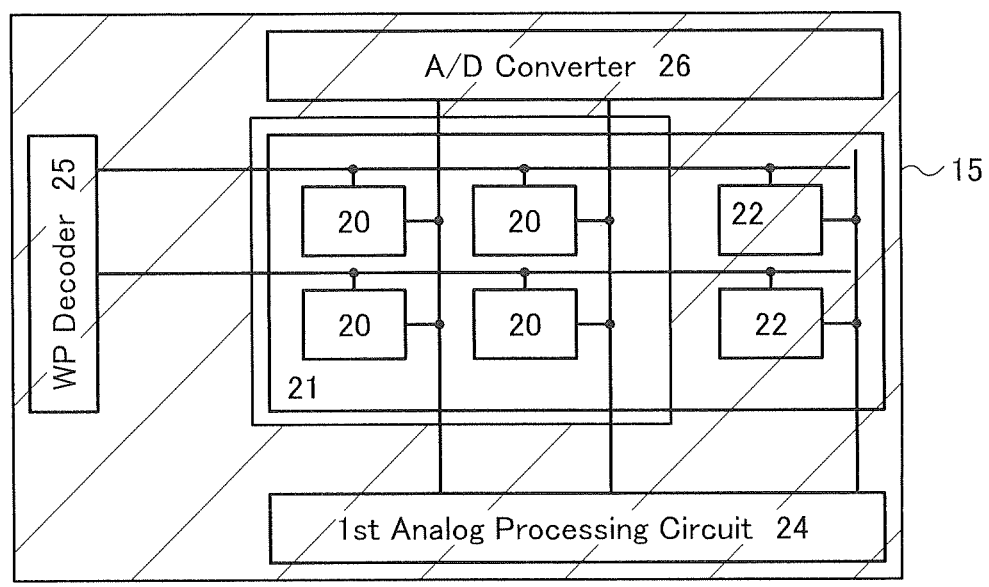
FIG. 25 is a block diagram illustrating an imaging device.
Figure 26:
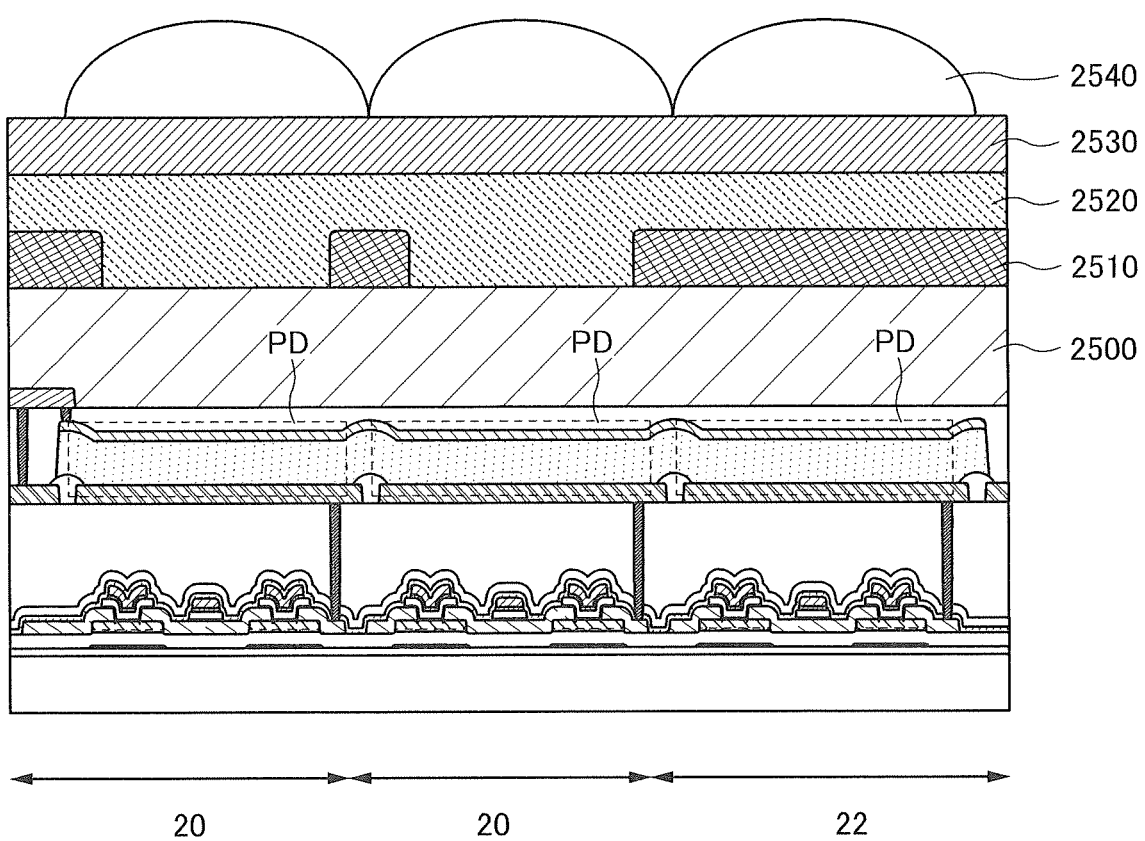
FIG. 26 is a cross-sectional view illustrating a structure of an imaging device.

Note that although FIG. 1 illustrates the configuration in which the light-blocking layer 15 shields the reference pixels 22 from light, the light-blocking layer 15 may cover the reference pixels 22, the analog processing circuit 24, the row decoder 25, and the A/D converter 26, as illustrated in FIG. 25, in which case deterioration of electrical characteristics of transistors due to light irradiation can be suppressed. FIG. 26 is a cross-sectional view illustrating the positional relationship among the pixels 20, the reference pixel 22, and the light-blocking layer 15. The light-blocking layer 15 may be provided, for example, above the microlens array 2540, or may be provided by extending the light-blocking layer 2510 of the reference pixel 22, as illustrated in FIG. 26.

Figure 27A:
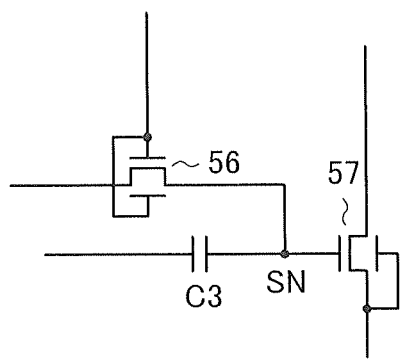
FIGS. 27A to 27D are circuit diagrams each illustrating a memory element.
Figure 27B:
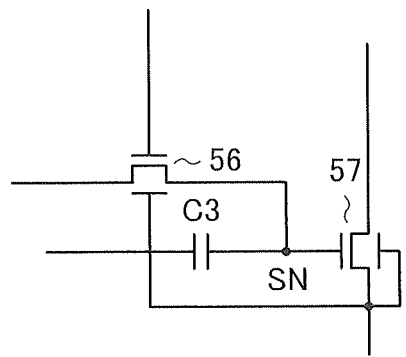

Note that the configurations of the circuits of the memory elements 30 and the reference memory elements 32 included in the arithmetic portion 11 are not limited to those illustrated in FIG. 4, and the transistors 56 and 57 may each include a back gate as illustrated in FIGS. 27A and 27B. FIG. 27A illustrates a configuration in which a front gate and a back gate of the transistor 56 have the same potential and a constant potential is applied to the back gate of the transistor 57. FIG. 27B illustrates a configuration in which a constant potential is applied to the back gates of the transistors 56 and 57. The configuration in which the back gates are supplied with the same potential as front gates enables an increase in on-state current. The configuration in which a constant potential is applied to the back gates enables control of the threshold voltage. A configuration in which the same potential is applied to a front gate and a back gate, a configuration in which a constant potential is applied to a back gate, and a configuration without a back gate may be optionally combined as necessary for the transistors included in one memory element.

Figure 27C:
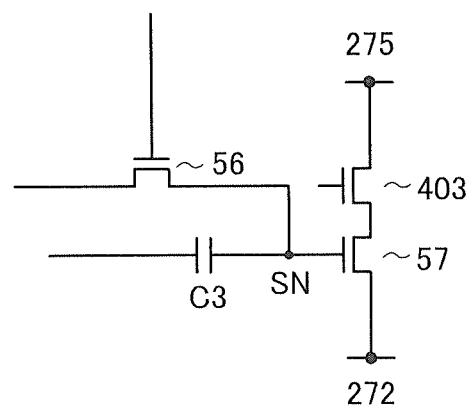
Figure 27D:
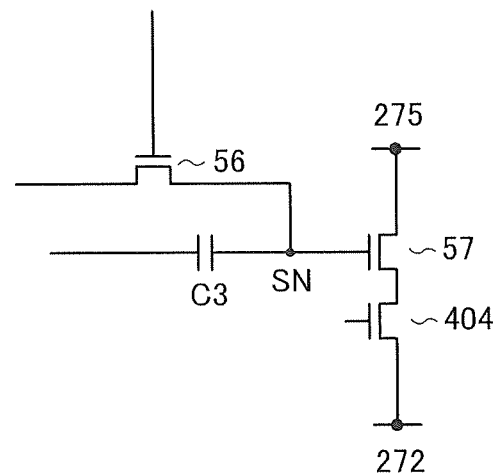

As illustrated in FIG. 27C, a transistor 403 having a switching function may be provided between the transistor 57 and the wiring 275. Alternatively, as illustrated in FIG. 27D, a transistor 404 having a switching function may be provided between the transistor 57 and the wiring 272.

Figure 28A:
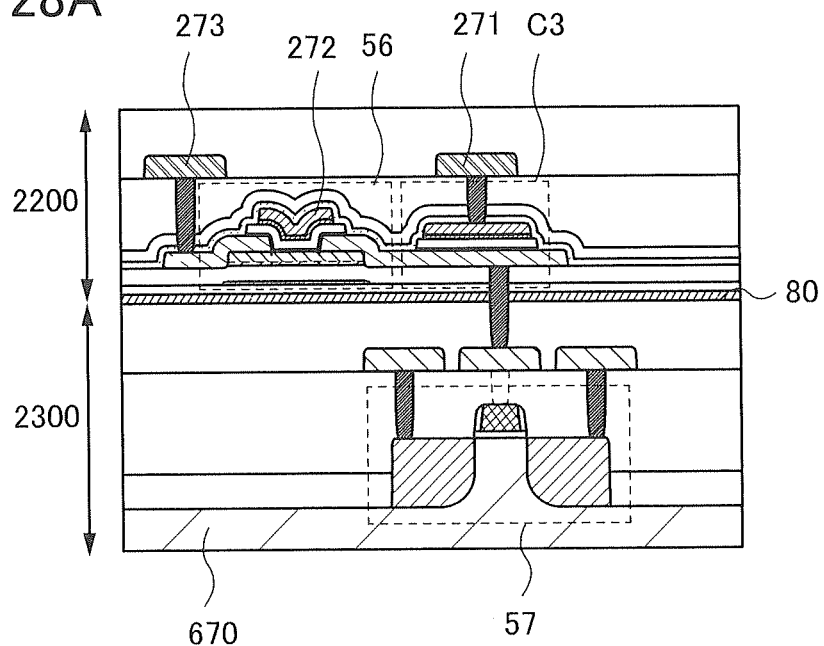
FIGS. 28A to 28C are cross-sectional views each illustrating a structure of a memory element.

FIG. 28A illustrates an example of a cross section of a region where the memory element 30 is formed. Note that each of the reference memory elements 32 can have a similar structure.

The memory elements 30 each include a tier 2200 including the transistor 56 containing an oxide semiconductor and the capacitor C3, and a tier 2300 including the transistor 57 formed in a silicon substrate 670.

Figure 28B:
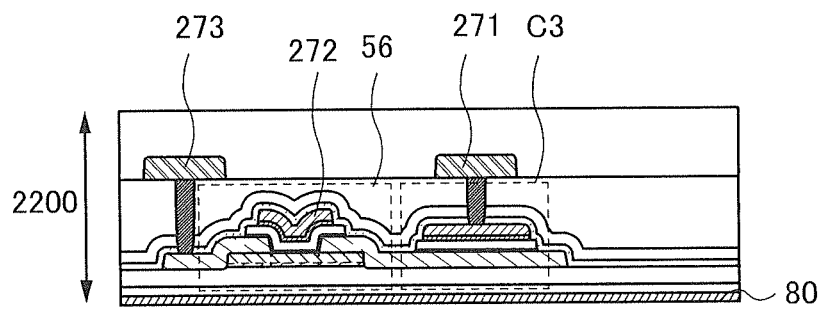

Note that although the transistor 56 includes a back gate in FIG. 28A, as illustrated in FIG. 28B, the transistor 56 does not necessarily include a back gate. The back gate might be electrically connected to a front gate of the transistor, which faces the back gate. Note that different fixed potentials might be supplied to the back gate and the front gate. The presence or absence of the back gate can also be applied to another circuit configuration described in this embodiment.

Typical examples of the silicon substrate 670 include a single crystal silicon substrate. Alternatively, the silicon substrate 670 can be a substrate made of germanium, silicon germanium, silicon carbide, gallium arsenide, aluminum gallium arsenide, indium phosphide, gallium nitride, or an organic semiconductor.

Figure 28C:
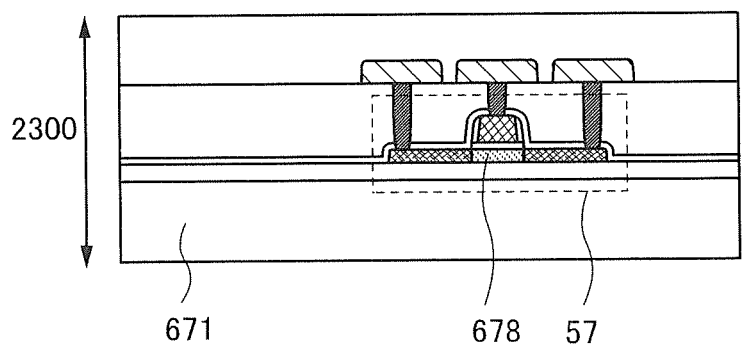

As illustrated in FIG. 28C, the transistor 57 may be a transistor including an active layer 678 formed using a silicon thin film. The active layer 678 can be formed using polycrystalline silicon or single crystal silicon of a silicon-on-insulator (SOI) structure. In such a structure, a substrate having an insulating surface, such as a glass substrate, can be used as a substrate 671. Instead of a fin type Si transistor in FIG. 28A, a planar type transistor may be used as in the case of the imaging portion (see FIG. 19A).

Since an OS transistor has extremely low off-state current, in the case where OS transistors are used as the transistors 56 of the memory elements 30, for example, a period during which charge can be held in the charge accumulation portion (FD) can be extremely long. Thus, the refresh frequency of written data can be low, and the power consumption of the semiconductor device can be reduced. Alternatively, the semiconductor device can be used as a substantially non-volatile memory device.

Since the OS transistor has higher drain breakdown voltage than the Si transistor, a highly reliable semiconductor device can be obtained.

Figure 29:
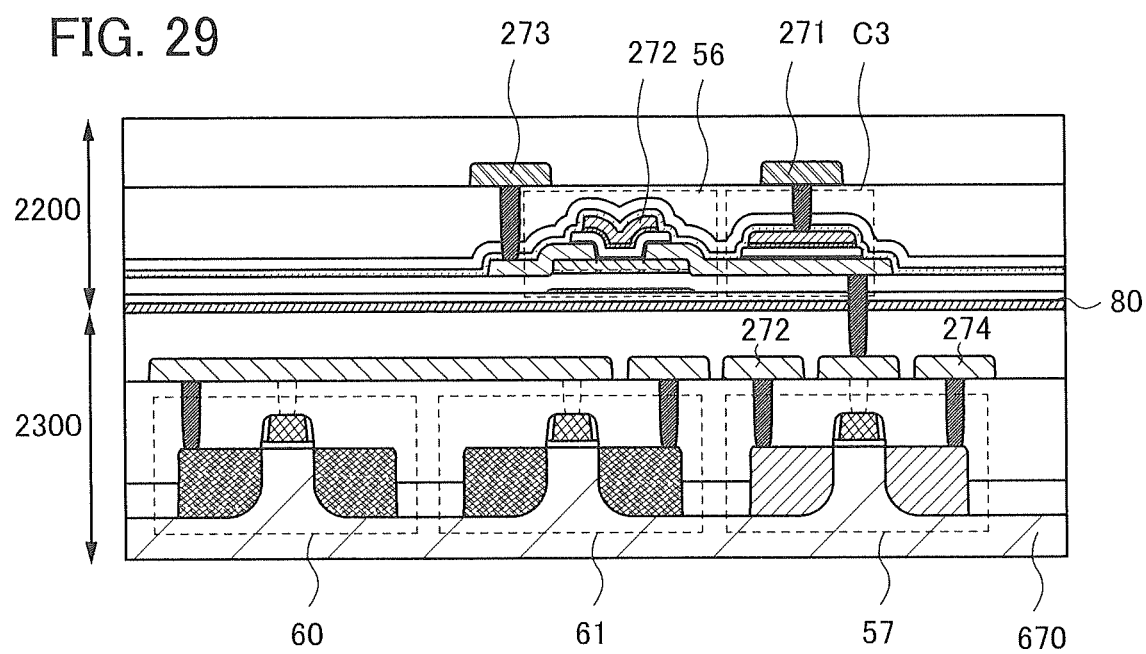
FIG. 29 is a cross-sectional view illustrating a structure of a memory element.

FIG. 29 illustrates a structure which is different from the structure illustrated in FIG. 28A in that the current mirror circuit included in the analog processing circuit 34 is provided in the silicon substrate 670. FIG. 29 illustrates the current mirror circuit formed using the transistors 69 and 61 included in the analog processing circuit 34 as an example; another transistor, any of the capacitors, or the like included in the imaging device of one embodiment of the present invention may be provided in the silicon substrate 670.

Each of the memory elements 30 can have a region where an OS transistor and a Si transistor overlap with each other, leading to a reduction in the size of the device.

The circuits included in the memory elements 30 in FIG. 4 are examples in each of which stored data can be retained even when power is not supplied and there is no limitation on the number of write cycles.

A transistor formed using an oxide semiconductor enables charge to be held for a long time owing to its electrical characteristics of extremely low off-state current. When voltage between a source and a drain is set to approximately 0.1 V, 5 V, or 10 V, for example, the off-state current standardized on the channel width of the transistor can be as low as several yoctoamperes per micrometer to several zeptoamperes per micrometer. In contrast, a transistor formed using a material other than an oxide semiconductor, such as crystal silicon, can operate at high speed easily. Thus, the combination of the transistors enables fabrication of a memory device that has high retention capability and operates at high speed.

Each of the circuits included in the memory elements 30 has a feature that the potential of the gate electrode of the transistor 57 can be held, and thus enables writing, retaining, and reading of data as follows.

Data writing and data retention are described. First, the potential of the wiring 272 (WW) is set to a potential at which the transistor 56 is turned on, so that the transistor 56 is turned on.

Accordingly, the potential of the wiring 273 (WD) is supplied to the gate electrode of the transistor 57 and the capacitor C3. That is, predetermined charge is supplied to the charge accumulation portion (SN) (writing). Here, charge for supplying either of two different potential levels (hereinafter referred to as low-level charge and high-level charge) is given.

After that, the potential of the wiring 272 (WW) is set to a potential at which the transistor 56 is turned off, so that the transistor 56 is turned off. Thus, the charge supplied to the charge accumulation portion (SN) is retained (retention). Since the off-state current of the transistor 56 is extremely low, the charge in the charge accumulation portion (SN) is held for a long time.

Next, data reading is described. An appropriate potential (reading potential) is supplied to the wiring 271 (RW) while a predetermined potential (constant potential) is supplied to the wiring 274 (VR), so that the potential of the wiring 275 (BM) varies depending on the amount of charge held in the charge accumulation portion (SN).

This is because in the case where the transistor 57 is an n-channel transistor, apparent threshold voltage $V_{th\_H}$ when high-level charge is supplied to the gate electrode of the transistor 57 (the charge accumulation portion (SN)) is usually lower than apparent threshold voltage $V_{th\_L}$ when low-level charge is supplied to the gate electrode of the transistor 57 (the charge accumulation portion (SN)).

Here, apparent threshold voltage refers to the potential of the wiring 271 (RW) that is needed to turn on the transistor 57. Thus, when the potential of the wiring 271 (RW) is set to a potential $V_0$ that is between $V_{th\_H}$ and $V_{th\_L}$, charge given to the gate electrode of the transistor 57 (the charge accumulation portion (SN)) can be determined.

In the case where the high-level charge is given in data writing, for example, the transistor 57 is turned on when the potential of the wiring 271 (RW) is $V_0$ ($>V_{th\_H}$). In the case where the low-level charge is given in data writing, the transistor 57 remains in an off state even when the potential of the wiring 271 (RW) is set to $V_0$ ($<V_{th\_L}$). Therefore, the retained data can be read by determining the potential of the wiring 275 (BM).

When the memory elements 30 in FIG. 4 each include a transistor having a channel formation region formed using an oxide semiconductor and having extremely low off-state current, stored data can be retained for an extremely long period. In other words, a refresh operation becomes unnecessary or the frequency of the refresh operation can be extremely low, leading to a sufficient reduction in power consumption. Moreover, stored data can be retained for a long period even when power is not supplied (note that a potential is preferably fixed). Power may be supplied while the stored data is retained.

The above driving method does not require high voltage for data writing to the charge accumulation portion (SN) and does not have the problem of deterioration of the transistor 57. For example, unlike a conventional nonvolatile memory, it is not necessary to inject and extract electrons into and from a floating gate by application of high voltage; thus, a problem such as deterioration of a gate insulating film of the transistor 57 does not arise. In other words, the semiconductor device of the disclosed invention does not have a limit on the number of write cycles, which is a problem in a conventional nonvolatile memory, and reliability thereof is drastically improved. Furthermore, data is written depending on the on state and the off state of the transistor, so that high-speed operation can be easily achieved.

Figure 30:
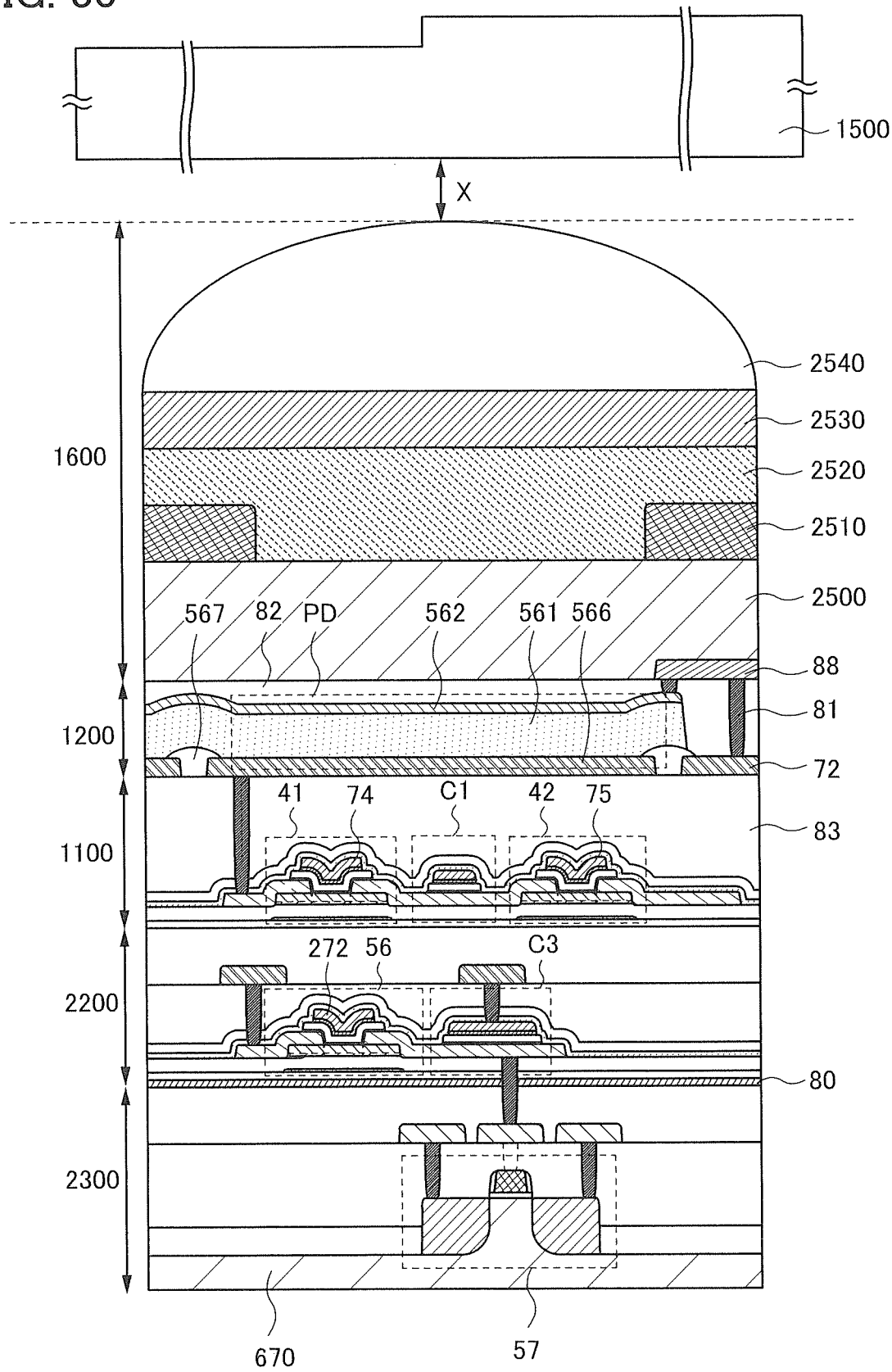
FIG. 30 is a cross-sectional view illustrating a structure of an imaging device.

FIG. 30 illustrates a specific example of a stacked-layer structure including the pixel 20 and the memory element 30 of one embodiment of the present invention and the microlens array 2540 illustrated in FIG. 24C, and the like. Note that the example illustrated in FIG. 30 includes the pixel 20 illustrated in FIG. 11A and the memory element 30 illustrated in FIG. 28A. In the case of using the pixel 20 illustrated in FIG. 17, a structure illustrated in FIG. 31 is employed.

Such a structure can have a region where the photoelectric conversion element PD, the transistor or the capacitor that forms the circuit in the pixel 20, and the transistor or the capacitor that forms the circuit in the memory element 30 overlap with each other, leading to a reduction in the size of the imaging device.

Figure 31:
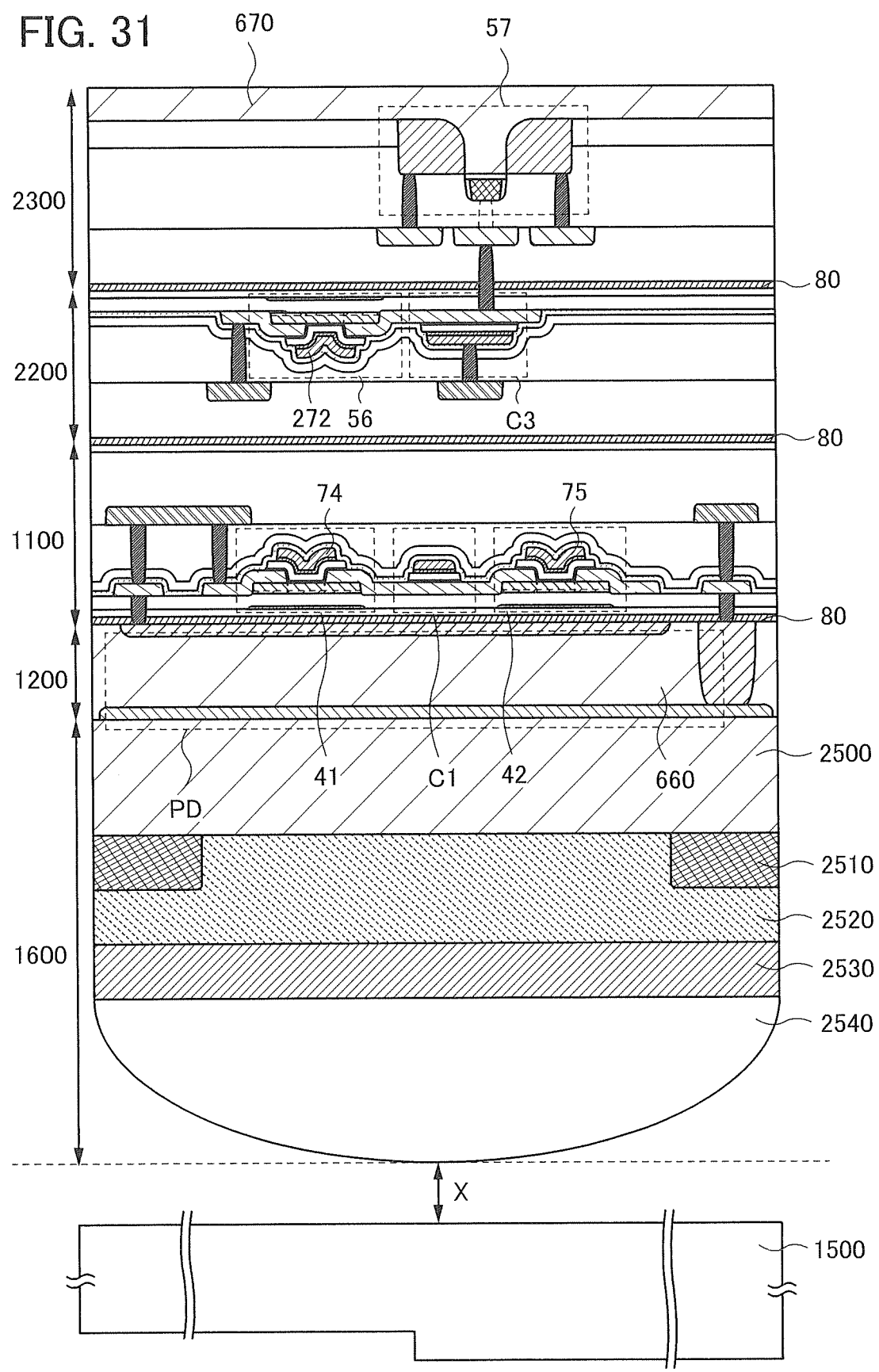
FIG. 31 is a cross-sectional view illustrating a structure of an imaging device.

As illustrated in FIG. 30 and FIG. 31, a diffraction grating 1500 may be provided above the microlens array 2540. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. For example, an inorganic insulating film such as a silicon oxide film or a silicon oxynitride film can be used. Alternatively, an organic insulating film such as an acrylic resin film or a polyimide resin film may be used. Further alternatively, a stack including the inorganic insulating film and the organic insulating film may be used.

The diffraction grating 1500 can be formed by a lithography process using a photosensitive resin or the like. Alternatively, the diffraction grating 1500 can be formed by a lithography process and an etching process. Further alternatively, the diffraction grating 1500 can be formed by nanoimprint lithography, laser scribing, or the like.

Note that a space X may be provided between the diffraction grating 1500 and the microlens array 2540. The space X can be less than or equal to 1 mm, and preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Further alternatively, a liquid such as silicone oil may be provided. Even in the case where the microlens array 2540 is not provided, the space X may be provided between the color filter 2530 and the diffraction grating 1500.

As illustrated in FIGS. 32A1 and 32B1, the imaging device may be bent. FIG. 32A1 illustrates a state in which the imaging device is bent in the direction of dashed-two dotted line X1-X2. FIG. 32A2 is a cross-sectional view illustrating a portion indicated by dashed-two dotted line X1-X2 in FIG. 32A1. FIG. 32A3 is a cross-sectional view illustrating a portion indicated by dashed-two dotted line Y1-Y2 in FIG. 32A1.

FIG. 32B1 illustrates a state where the imaging device is bent in the direction of dashed-two dotted line X3-X4 and the direction of dashed-two dotted line Y3-Y4. FIG. 32B2 is a cross-sectional view illustrating a portion indicated by dashed-two dotted line X3-X4 in FIG. 32B1. FIG. 32B3 is a cross-sectional view illustrating a portion indicated by dashed-two dotted line Y3-Y4 in FIG. 32B1.

Bending the imaging device can reduce field curvature and astigmatism. Thus, the optical design of a lens or the like, which is used in combination of the imaging device, can be facilitated. For example, the number of lenses used for aberration correction can be reduced; accordingly, the size or weight of semiconductor device or the like including the imaging device can be easily reduced. In addition, the quality of a captured image can be improved.

In Embodiment 1, one embodiment of the present invention has been described. Other embodiments of the present invention will be described in Embodiments 2 to 6. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

This embodiment can be implemented in appropriate combination with any of the structures described in the other embodiments.

Embodiment 2

In this embodiment, a transistor containing an oxide semiconductor that can be used in one embodiment of the present invention will be described with reference to drawings. In the drawings in this embodiment, some components are enlarged, reduced in size, or omitted for easy understanding.

Figure 33A:
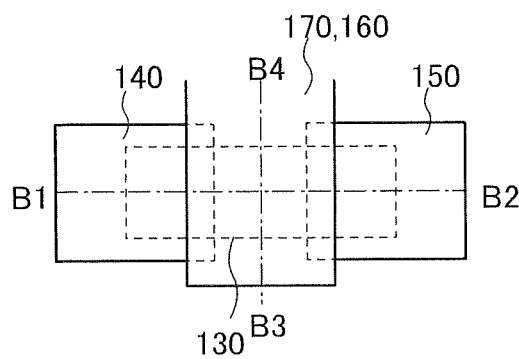
FIGS. 33A to 33F are top views and cross-sectional views illustrating transistors.
Figure 33B:
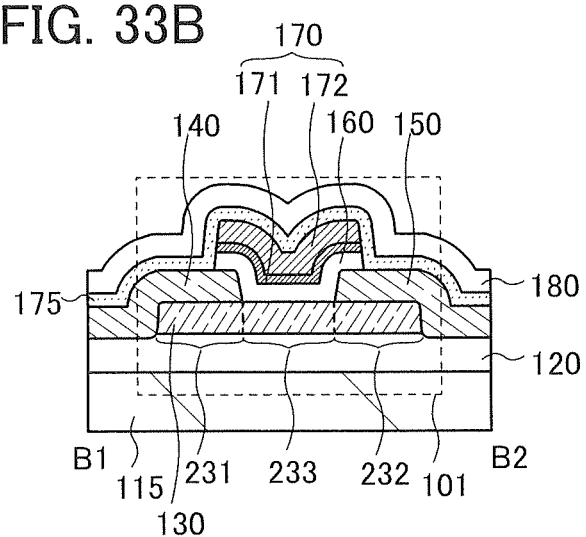
Figure 35A:
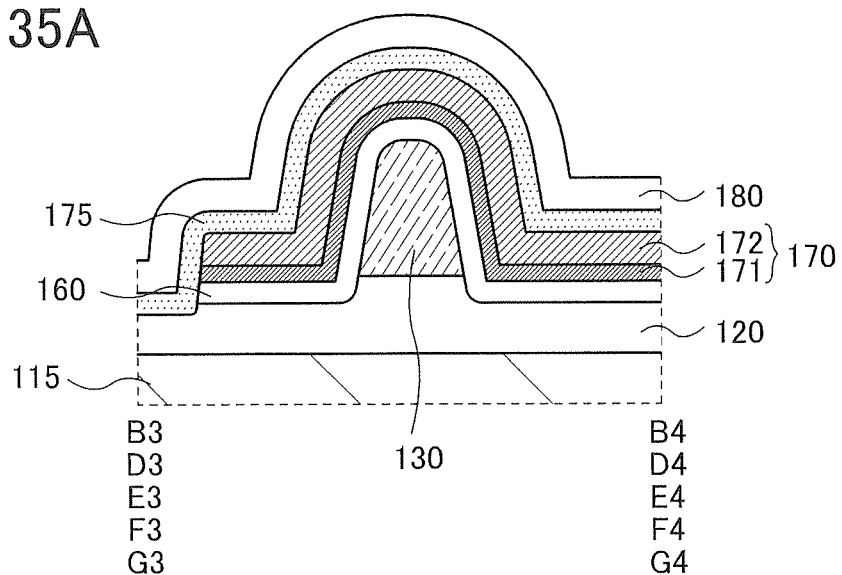
FIGS. 35A to 35D each illustrate a cross section of a transistor in a channel width direction.

FIGS. 33A and 33B are a top view and a cross-sectional view illustrating a transistor 101 of one embodiment of the present invention. FIG. 33A is the top view, and FIG. 33B illustrates a cross section taken along dashed-dotted line B1-B2 in FIG. 33A. A cross section in the direction of dashed-dotted line B3-B4 in FIG. 33A is illustrated in FIG. 35A. The direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

The conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 33B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of an opposite conductivity type is used or when the direction of current flow is changed in circuit operation, for example. Therefore, the terms "source" and "drain" can be interchanged with each other in this specification. In addition, the term "electrode layer" can be replaced with the term "wiring".

The conductive layer 170 includes two layers, a conductive layer 171 and a conductive layer 172, in the drawing, but also may be a single layer or a stack of three or more layers. The same applies to other transistors described in this embodiment.

Each of the conductive layers 140 and 150 is a single layer in the drawing, but also may be a stack of two or more layers. The same applies to other transistors described in this embodiment.

Figure 33C:
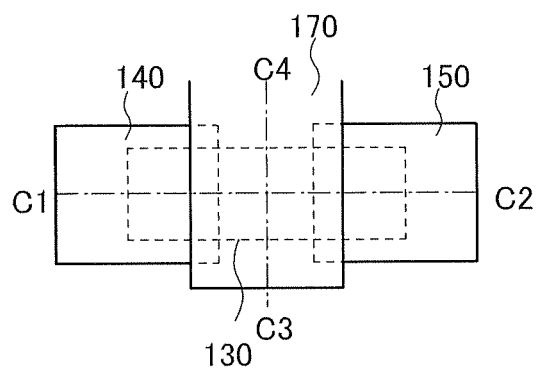
Figure 33D:
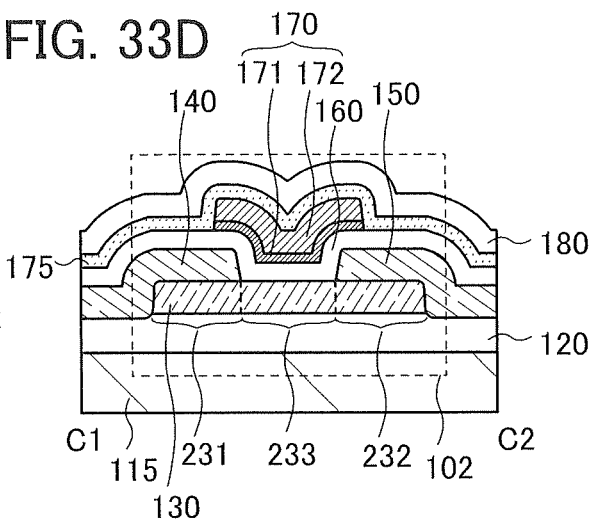
Figure 35B:
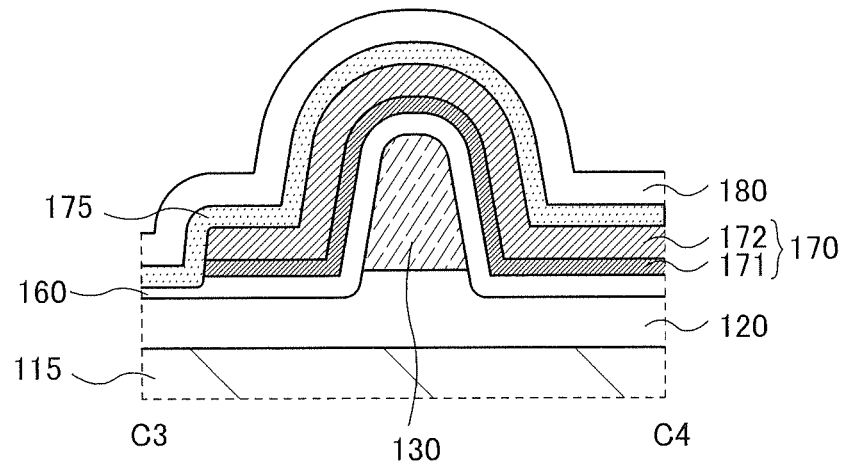

The transistor in one embodiment of the present invention may have a structure illustrated in FIGS. 33C and 33D. FIG. 33C is a top view of a transistor 102. A cross section in the direction of dashed-dotted line C1-C2 in FIG. 33C is illustrated in FIG. 33D. A cross section in the direction of dashed-dotted line C3-C4 in FIG. 33C is illustrated in FIG. 35B. The direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has a feature of low gate leakage current.

The transistors 101 and 102 each have a top-gate structure including regions where the conductive layer 170 overlaps with the conductive layers 140 and 150. To reduce parasitic capacitance, the width of each of the regions in the channel length direction is preferably greater than or equal to 3 nm and less than 300 nm. Since an offset region is not formed in the oxide semiconductor layer 130 in this structure, a transistor with a high on-state current can be easily formed.

Figure 33E:
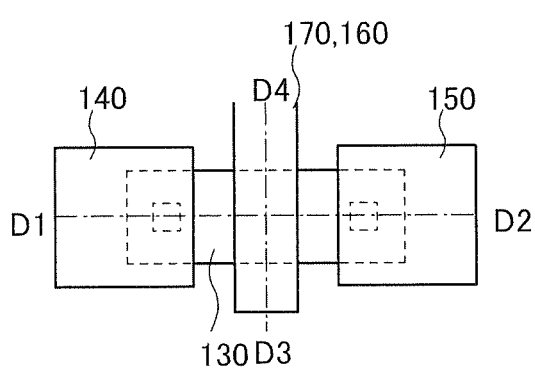
Figure 33F:
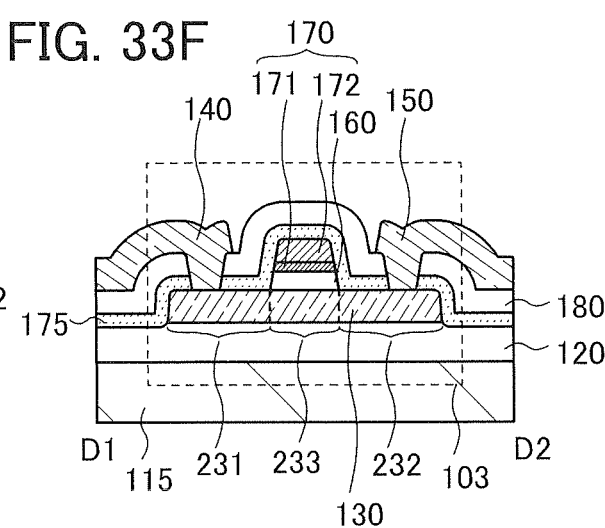

The transistor in one embodiment of the present invention may have a structure illustrated in FIGS. 33E and 33F. FIG. 33E is a top view of a transistor 103. A cross section in the direction of dashed-dotted line D1-D2 in FIG. 33E is illustrated in FIG. 33F. A cross section in the direction of dashed-dotted line D3-D4 in FIG. 33E is illustrated in FIG. 35A. The direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

The conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 33F can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

The transistor in one embodiment of the present invention may have a structure illustrated in FIGS. 34A and 34B. FIG. 34A is a top view of a transistor 104. A cross section in the direction of dashed-dotted line E1-E2 in FIG. 34A is illustrated in FIG. 34B. A cross section in the direction of dashed-dotted line E3-E4 in FIG. 34A is illustrated in FIG. 35A. The direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 in contact with the oxide semiconductor layer 130 cover end portions of the oxide semiconductor layer 130.

In FIG. 34B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of each of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include regions where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

The transistor in one embodiment of the present invention may have a structure illustrated in FIGS. 34C and 34D. FIG. 34C is a top view of a transistor 105. A cross section in the direction of dashed-dotted line F1-F2 in FIG. 34C is illustrated in FIG. 34D. A cross section in the direction of dashed-dotted line F3-F4 in FIG. 34C is illustrated in FIG. 35A. The direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

The conductive layers 141 and 151 are in contact with the top surface of the oxide semiconductor layer 130 and are not in contact with a side surface of the oxide semiconductor layer 130.

The transistor 105 has the same structure as the transistor 101 except that the conductive layers 141 and 151 are provided, that openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

The transistor in one embodiment of the present invention may have a structure illustrated in FIGS. 34E and 34F. FIG. 34E is a top view of a transistor 106. A cross section in the direction of dashed-dotted line G1-G2 in FIG. 34E is illustrated in FIG. 34F. A cross section in the direction of dashed-dotted line G3-G4 in FIG. 34E is illustrated in FIG. 35A. The direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

The conductive layers 141 and 151 are in contact with the top surface of the oxide semiconductor layer 130 and are not in contact with a side surface of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is forming. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 35C:
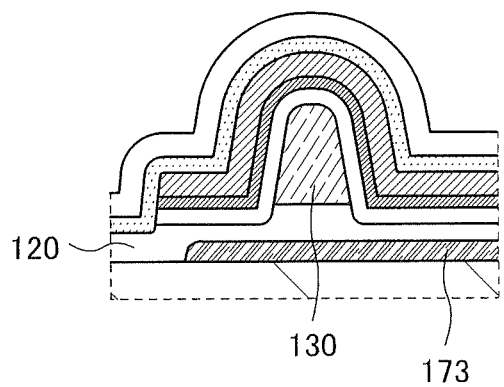
Figure 35D:
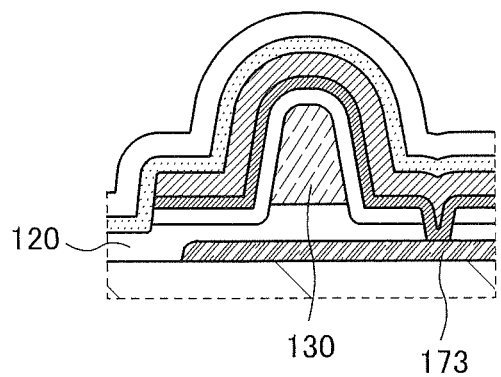
Figure 36A:
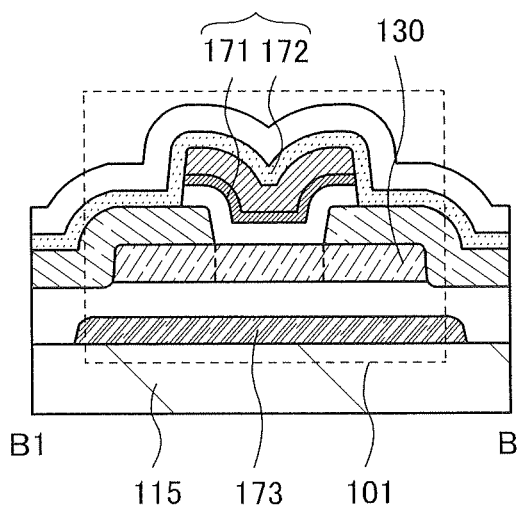
FIGS. 36A to 36F each illustrate a cross section of a transistor in a channel length direction.
Figure 36B:
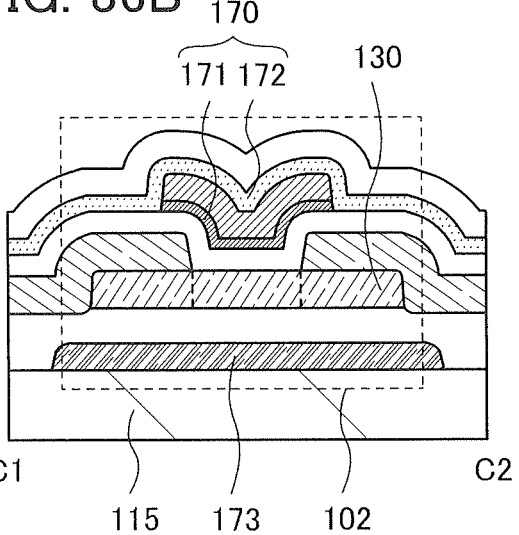
Figure 36C:
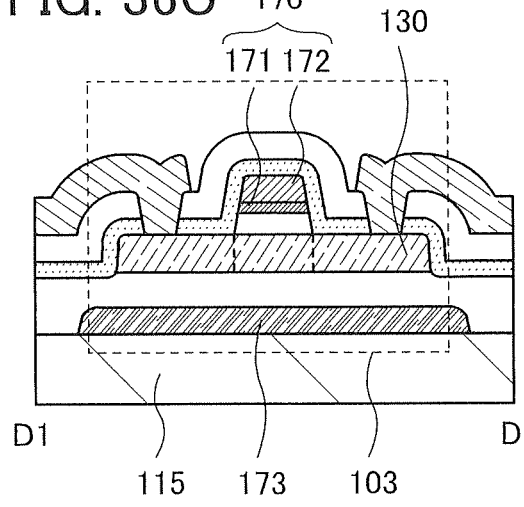
Figure 36D:
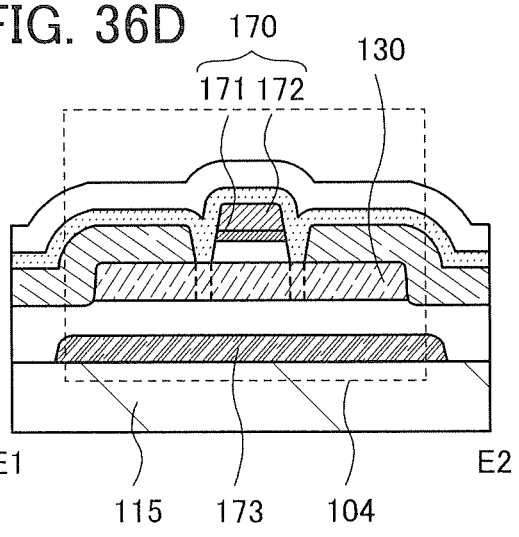
Figure 36E:
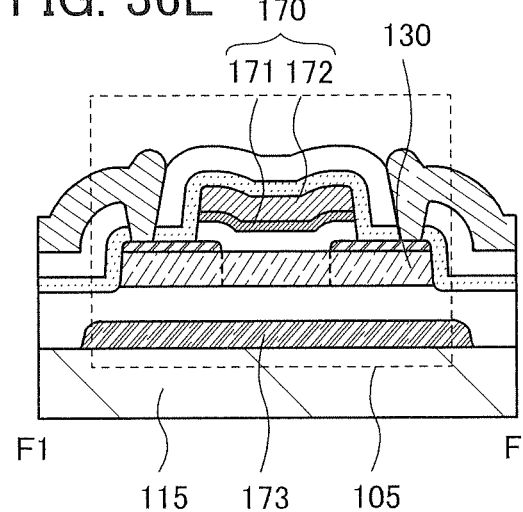
Figure 36F:
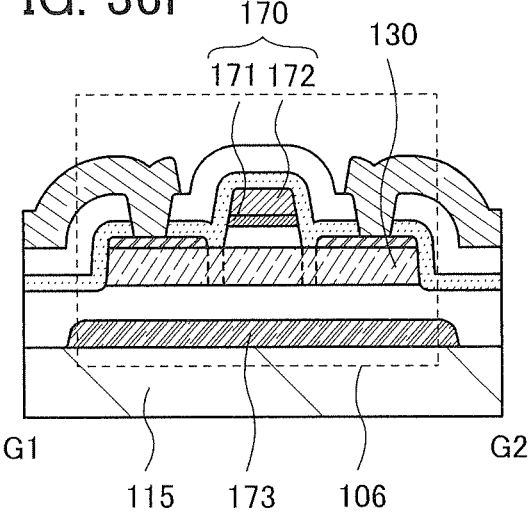

The transistor in one embodiment of the present invention may include a conductive layer 173 between the oxide semiconductor layer 130 and the substrate 115 as illustrated in cross-sectional views in the channel length direction in FIGS. 36A to 36F and cross-sectional views in the channel width direction in FIGS. 35C and 35D. When the conductive layer is used as a second gate electrode layer (back gate), the on-state current can be increased or the threshold voltage can be controlled. In the cross-sectional views in FIGS. 36A to 36F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 35D, the conductive layers 170 and 173 may be electrically connected to each other through a contact hole.

Although the transistors 101 to 106 in FIGS. 33A to 33F and FIGS. 34A to 34F are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIGS. 37B and 37C or FIGS. 37D and 37E.

Figure 37A:
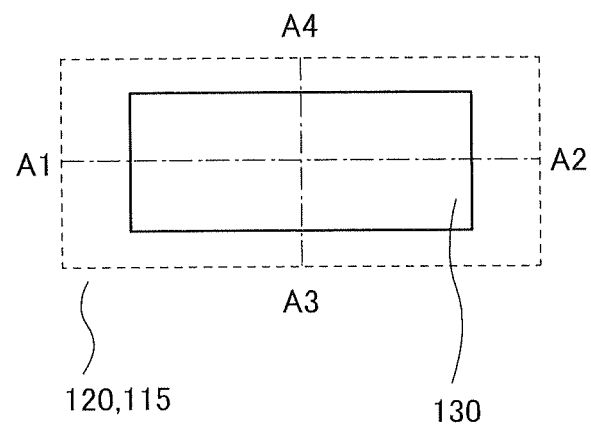
FIGS. 37A to 37E are a top view and cross-sectional views illustrating semiconductor layers.
Figure 37B:
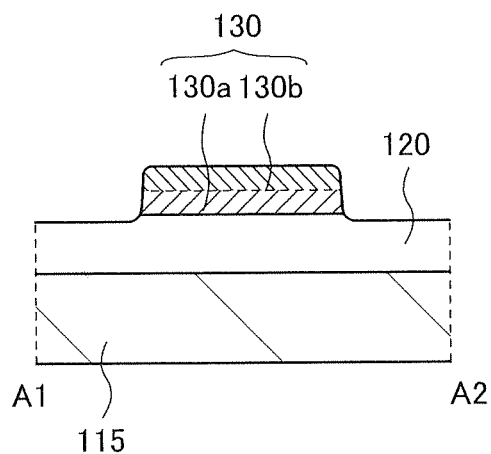
Figure 37D:
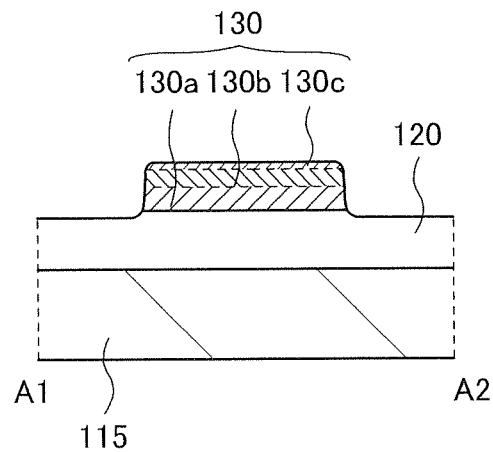
Figure 37C:
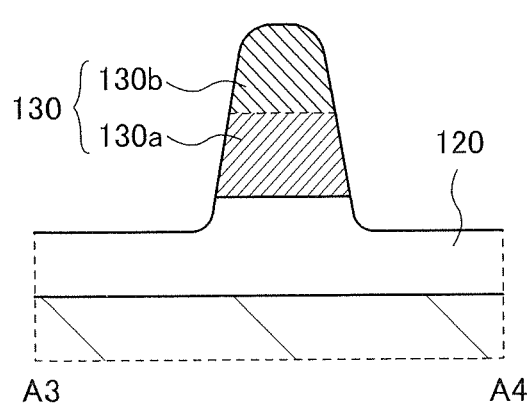
Figure 37E:
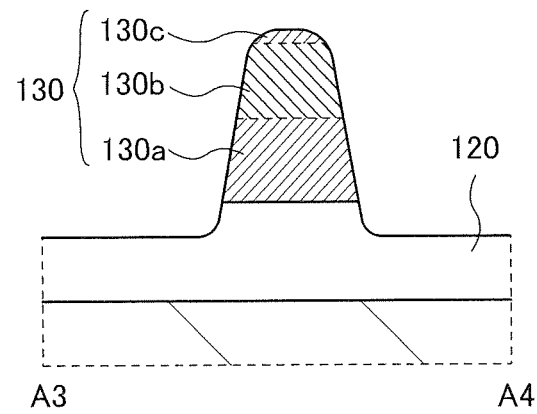

FIG. 37A is a top view of the oxide semiconductor layer 130, and FIGS. 37B and 37C are cross-sectional views of the oxide semiconductor layer 130 with a two-layer structure. FIGS. 37D and 37E are cross-sectional views of the oxide semiconductor layer 130 with a three-layer structure.

Oxide semiconductor layers with different compositions, for example, can be used as an oxide semiconductor layer 130a, an oxide semiconductor layer 130b, and an oxide semiconductor layer 130c.

Figure 38A:
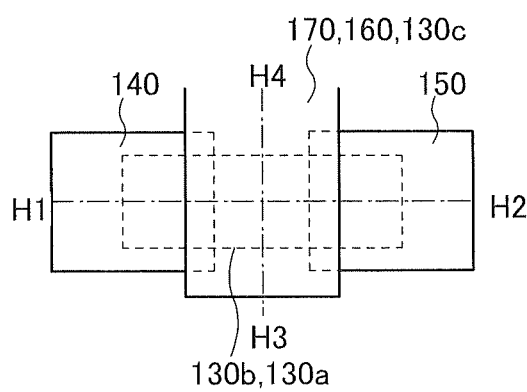
FIGS. 38A to 38F are top views and cross-sectional views illustrating transistors.
Figure 38B:
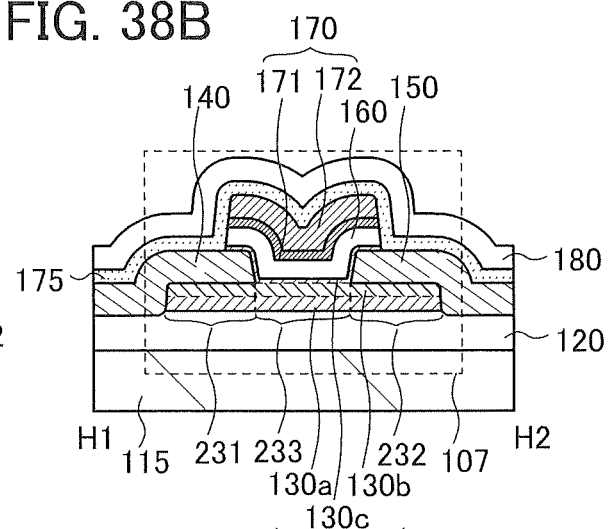

The transistor in one embodiment of the present invention may have a structure illustrated in FIGS. 38A and 38B. FIG. 38A is a top view of a transistor 107. A cross section in the direction of dashed-dotted line H1-H2 in FIG. 38A is illustrated in FIG. 38B. A cross section in the direction of dashed-dotted line H3-H4 in FIG. 38A is illustrated in FIG. 40A. The direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 38C:
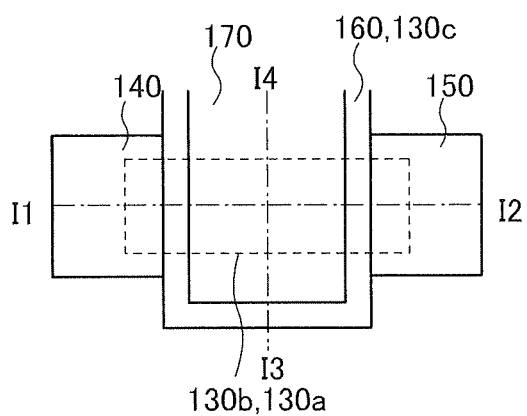
Figure 38D:
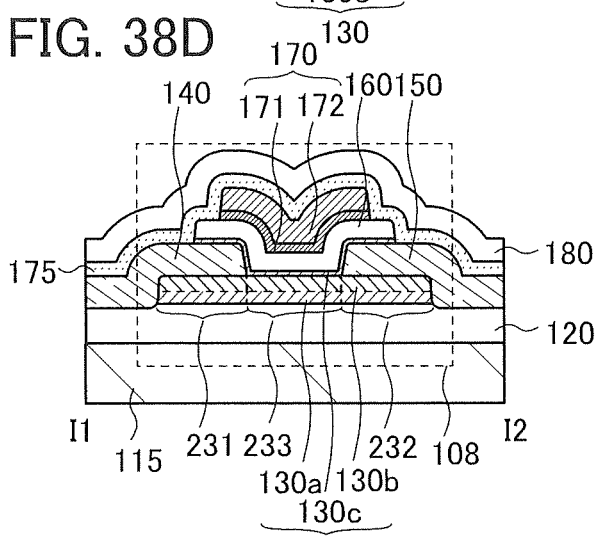

The transistor in one embodiment of the present invention may have a structure illustrated in FIGS. 38C and 38D. FIG. 38C is a top view of a transistor 108. A cross section in the direction of dashed-dotted line I1-I2 in FIG. 38C is illustrated in FIG. 38D. A cross section in the direction of dashed-dotted line I3-I4 in FIG. 38C is illustrated in FIG. 40B. The direction of dashed-dotted line I1-I2 is referred to as a channel length direction, and the direction of dashed-dotted line I3-I4 is referred to as a channel width direction.

The transistor 108 differs from the transistor 107 in that end portions of the insulating layer 160 and the oxide semiconductor layer 130c are not aligned with an end portion of the conductive layer 170.

Figure 38E:
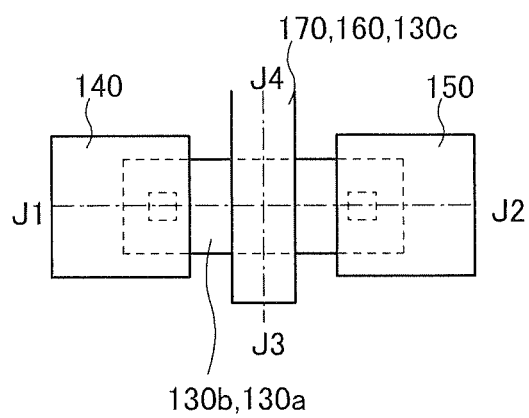
Figure 38F:
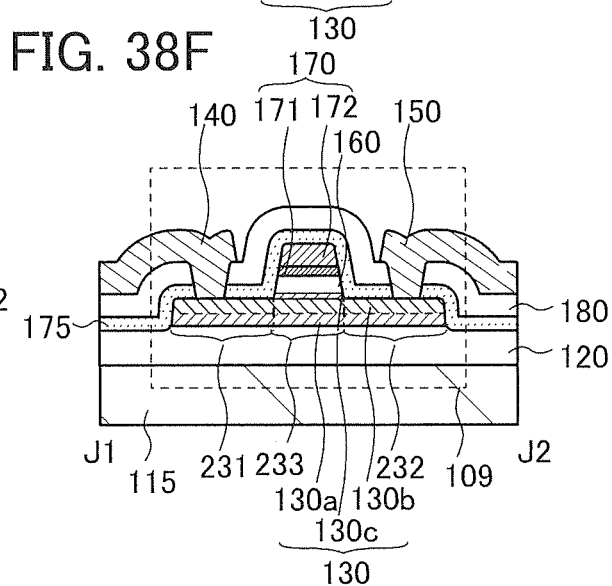

The transistor in one embodiment of the present invention may have a structure illustrated in FIGS. 38E and 38F. FIG. 38E is a top view of a transistor 109. A cross section in the direction of dashed-dotted line J1-J2 in FIG. 38E is illustrated in FIG. 38F. A cross section in the direction of dashed-dotted line J3-J4 in FIG. 38E is illustrated in FIG. 40A. The direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 39A:
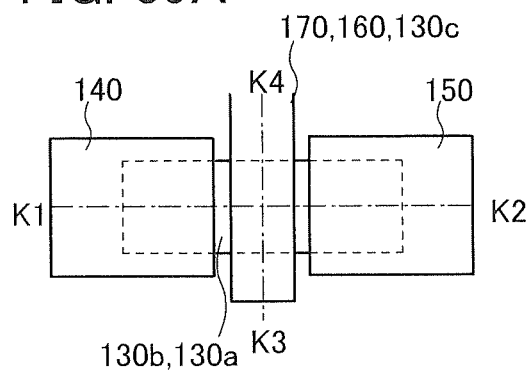
FIGS. 39A to 39F are top views and cross-sectional views illustrating transistors.
Figure 39B:
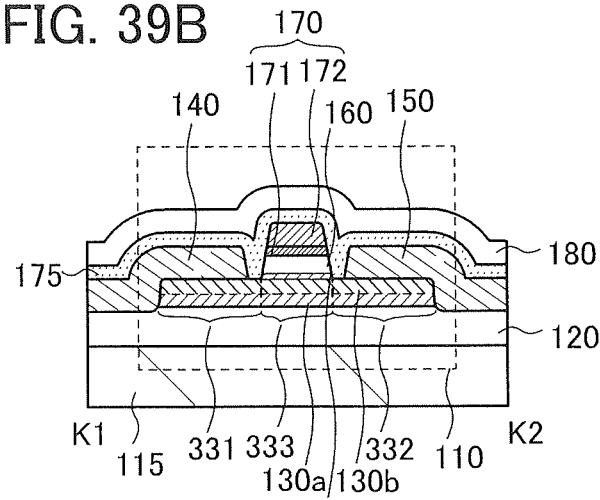

The transistor in one embodiment of the present invention may have a structure illustrated in FIGS. 39A and 39B. FIG. 39A is a top view of a transistor 110. A cross section in the direction of dashed-dotted line K1-K2 in FIG. 39A is illustrated in FIG. 39B. A cross section in the direction of dashed-dotted line K3-K4 in FIG. 39A is illustrated in FIG. 40A. The direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 331 and 332 and that the oxide semiconductor layer 130 includes three layers (the oxide semiconductor layers 130a to 130c) in the region 333.

Figure 39C:
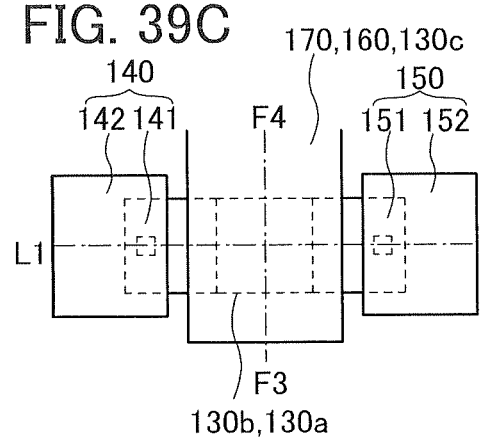
Figure 39D:
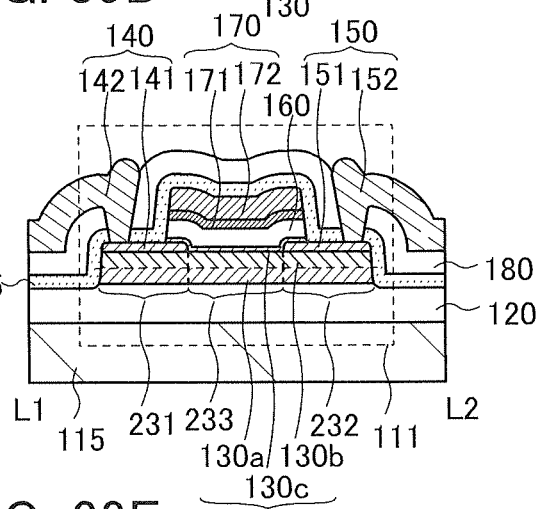

The transistor in one embodiment of the present invention may have a structure illustrated in FIGS. 39C and 39D. FIG. 39C is a top view of a transistor 111. A cross section in the direction of dashed-dotted line L1-L2 in FIG. 39C is illustrated in FIG. 39D. A cross section in the direction of dashed-dotted line L3-L4 in FIG. 39C is illustrated in FIG. 40A. The direction of dashed-dotted line L1-L2 is referred to as a channel length direction, and the direction of dashed-dotted line L3-L4 is referred to as a channel width direction.

The transistor 111 includes the insulating layer 120 in contact with the substrate 115; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

Figure 39E:
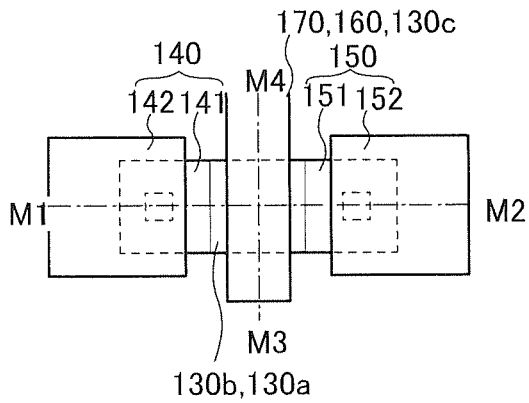
Figure 39F:
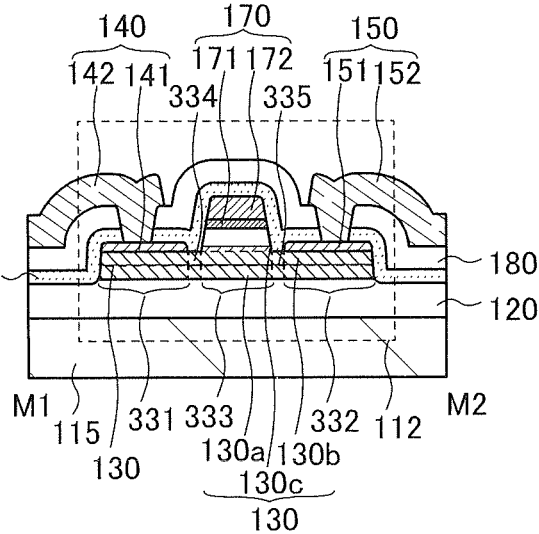
Figure 41A:
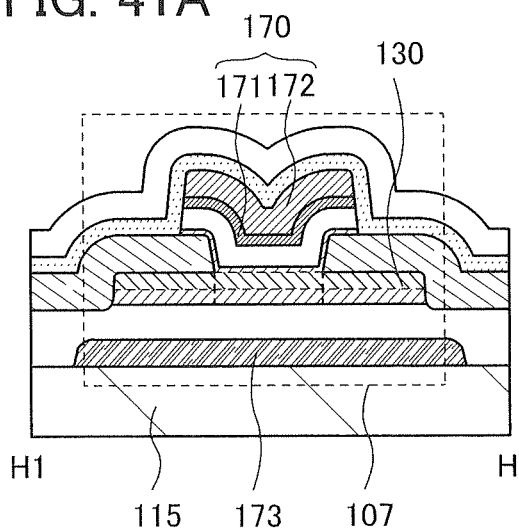
FIGS. 41A to 41F each illustrate a cross section of a transistor in a channel length direction.
Figure 41B:
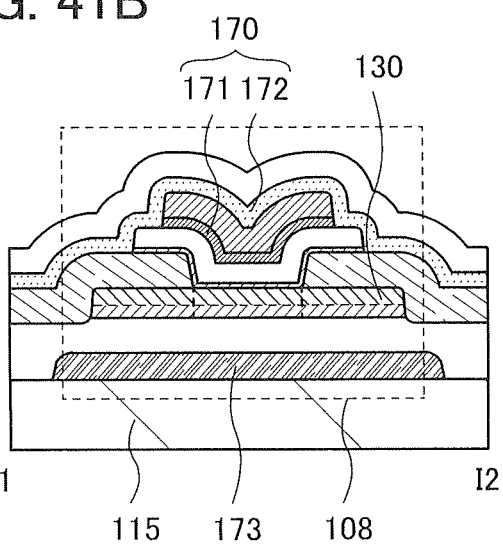
Figure 41C:
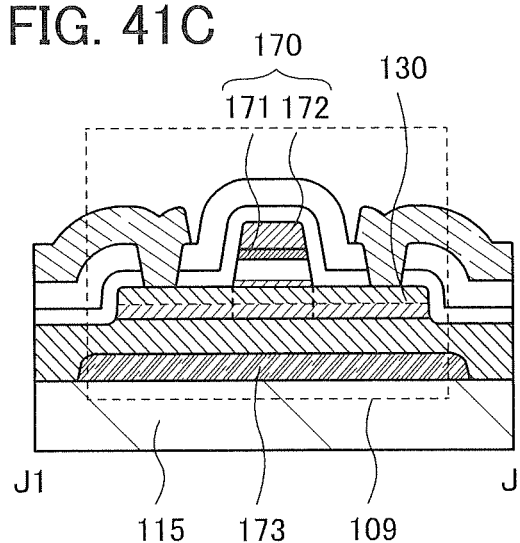
Figure 41D:
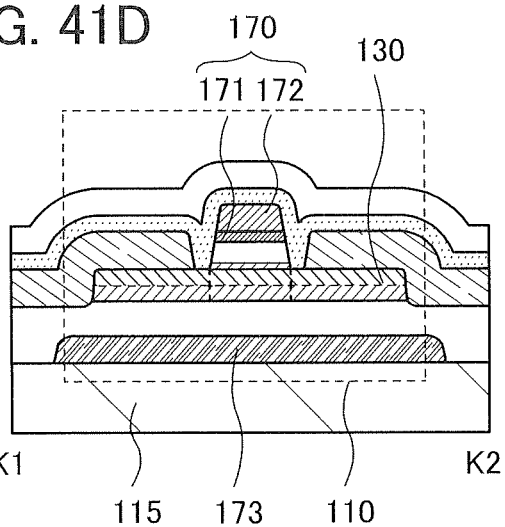
Figure 41E:
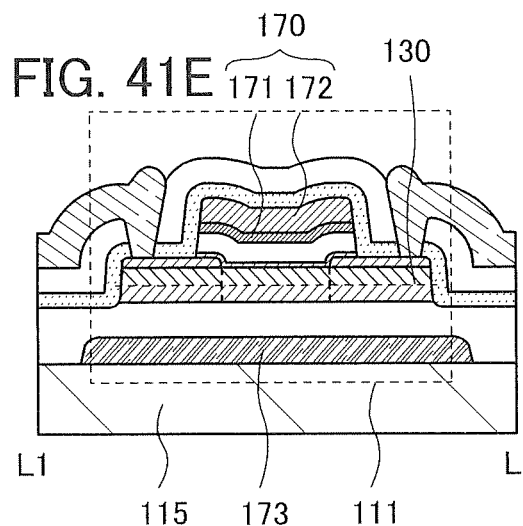
Figure 41F:
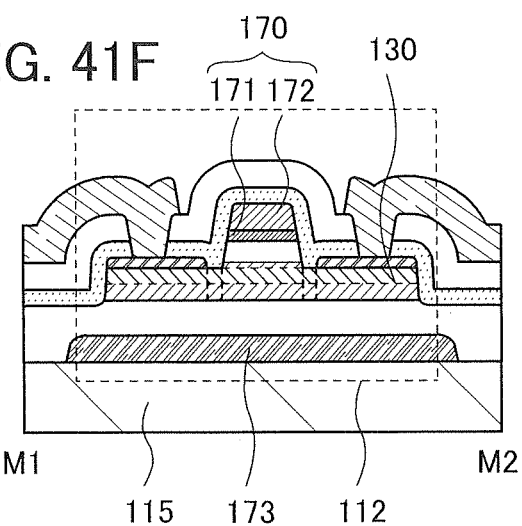

The transistor in one embodiment of the present invention may have a structure illustrated in FIGS. 39E and 39F. FIG. 39E is a top view of a transistor 112. A cross section in the direction of dashed-dotted line M1-M2 in FIG. 39E is illustrated in FIG. 39F. A cross section in the direction of dashed-dotted line M3-M4 in FIG. 39E is illustrated in FIG. 40A. The direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

The transistor in one embodiment of the present invention may include the conductive layer 173 between the oxide semiconductor layer 130 and the substrate 115 as illustrated in cross-sectional views in the channel length direction in FIGS. 41A to 41F and cross-sectional views in the channel width direction in FIGS. 40C and 40D. When the conductive layer is used as a second gate electrode layer (back gate), the on-state current can be increased or the threshold voltage can be controlled. In the cross-sectional views in FIGS. 41A to 41F, the width of the conductive layer 173 may be shorter than that of the oxide semiconductor layer 130. Moreover, the width of the conductive layer 173 may be shorter than that of the conductive layer 170.

Figure 42A:
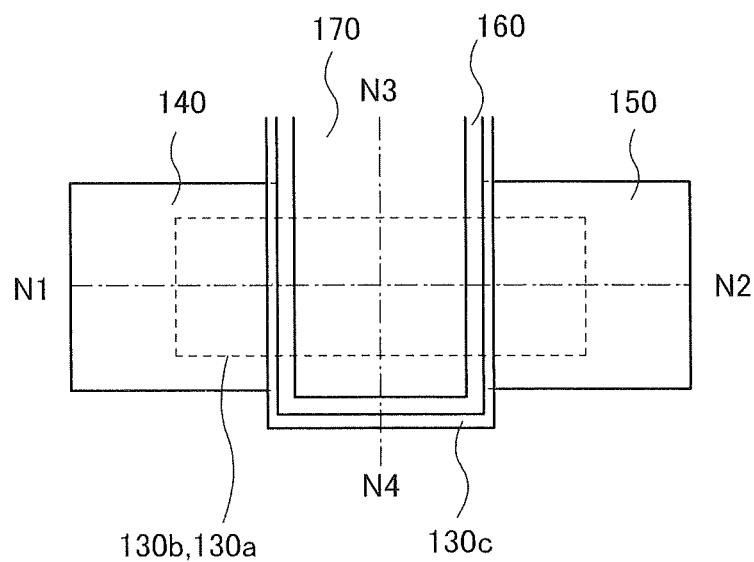
FIGS. 42A and 42B are a top view and cross-sectional views illustrating a transistor.
Figure 42B:
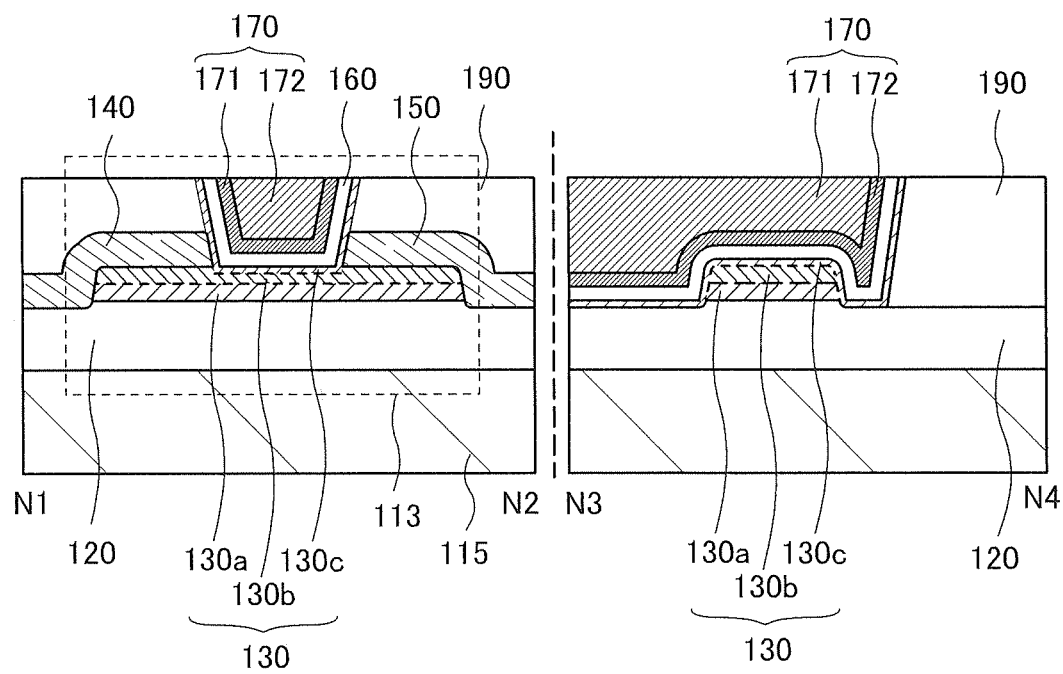

The transistor in one embodiment of the present invention may have a structure illustrated in FIGS. 42A and 42B. FIG. 42A is a top view and FIG. 42B illustrates cross-sectional views taken along dashed-dotted line N1-N2 and dashed-dotted line N3 N4 in FIG. 42A. Note that for simplification of the drawing, some components are not illustrated in the top view in FIG. 42A.

A transistor 113 illustrated in FIGS. 42A and 42B includes the substrate 115, the insulating layer 120 over the substrate 115, the oxide semiconductor layer 130 (the oxide semiconductor layer 130a, the oxide semiconductor layer 130b, and the oxide semiconductor layer 130c) over the insulating layer 120, the conductive layers 140 and 150 which are in contact with the oxide semiconductor layer 130 and are apart from each other, the insulating layer 160 in contact with the oxide semiconductor layer 130c, and the conductive layer 170 in contact with the insulating layer 160. Note that the oxide semiconductor layer 130c, the insulating layer 160, and the conductive layer 170 are provided in an opening which is provided in an insulating layer 190 over the transistor 113 and reaches the oxide semiconductor layers 130a and 130b and the insulating layer 120.

In the transistor 113, a region where a conductor serving as a source electrode or a drain electrode overlaps with a conductor serving as a gate electrode is smaller than that in any other transistors described above; thus, the parasitic capacitance in the transistor 113 can be reduced. Accordingly, the transistor 113 is suitable for a component of a circuit that requires high-speed operation. As illustrated in FIG. 42B, the transistor 113 is preferably subjected to a chemical mechanical polishing (CMP) method or the like to have a flat top surface, although not necessarily.

Figure 43A:
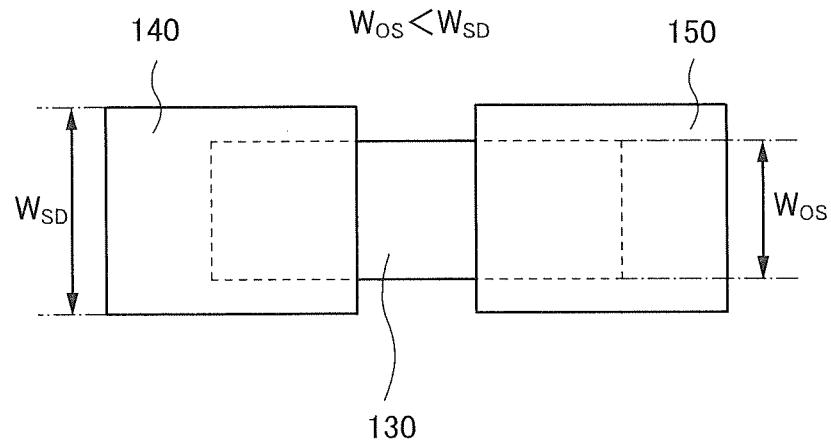
FIGS. 43A to 43C are top views each illustrating a transistor.
Figure 43B:
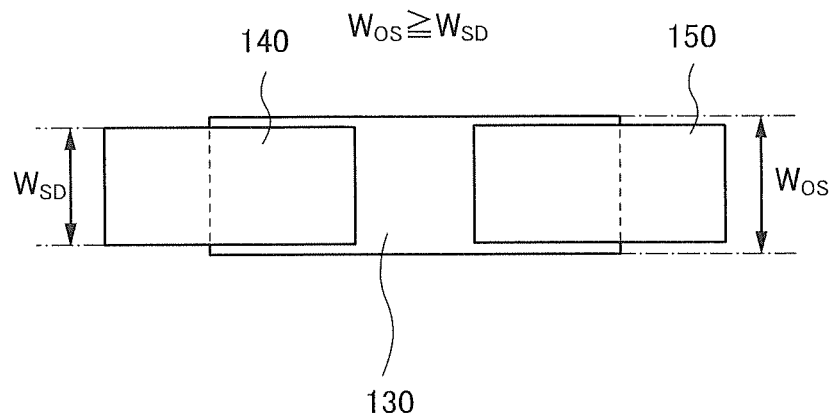
Figure 43C:
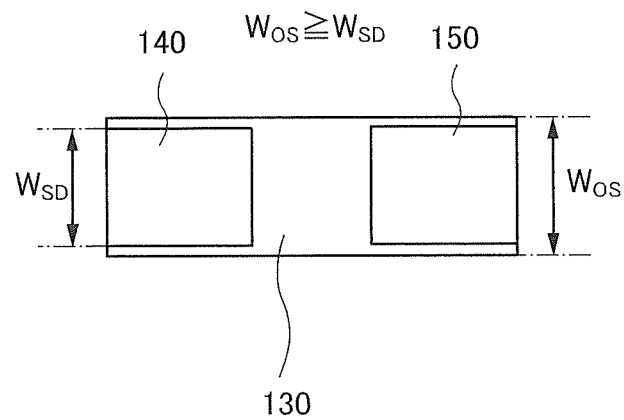

The conductive layer 140 (source electrode layer) and the conductive layer 150 (drain electrode layer) in the transistor of one embodiment of the present invention may each have a width ($W_{SD}$) longer than or shorter than the width ($W_{OS}$) of the oxide semiconductor layer 130 as illustrated in the top views in FIGS. 43A and 43B (showing only the oxide semiconductor layer 130, the conductive layer 140, and the conductive layer 150). When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved. As illustrated in FIG. 43C, the conductive layers 140 and 150 may be formed only in regions overlapping with the oxide semiconductor layer 130.

In the transistor in one embodiment of the present invention (any of the transistors 101 to 113), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 makes current flow to the oxide semiconductor layer 130b. Since current flows to the oxide semiconductor layer 130b, the current is hardly influenced by interface scattering, leading to high on-state current. Thus, increasing the thickness of the oxide semiconductor layer 130b improves the on-state current in some cases.

A semiconductor device including a transistor with any of the above structures can have favorable electrical characteristics.

The structures described in this embodiment can be used in appropriate combination with any of the structures described in the other embodiments.

Embodiment 3

In this embodiment, components of the transistors described in Embodiment 2 will be described in detail.

As the substrate 115, a glass substrate, a quartz substrate, a semiconductor substrate, a ceramic substrate, a metal substrate with an insulated surface, or the like can be used. Alternatively, a silicon substrate provided with a transistor, a photodiode, or the like can be used, and an insulating layer, a wiring, a conductor functioning as a contact plug, and the like may be provided over the silicon substrate. Note that when p-channel transistors are formed using the silicon substrate, a silicon substrate with $n^-$-type conductivity is preferably used. Alternatively, an SOI substrate including an $n^-$-type or i-type silicon layer may be used. In the case where a p-channel transistor is formed in the silicon substrate, it is preferable to use a silicon substrate in which a plane where the transistor is formed is a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and further preferably, the insulating layer 120 is an insulating film containing oxygen in which the oxygen content is higher than that in the stoichiometric composition. The insulating layer 120 is a film in which the amount of released oxygen when converted into oxygen atoms is preferably greater than or equal to $1.0 \times 10^{19}$ atoms/cm$^3$ in TDS analysis. In the TDS analysis, the film surface temperature is higher than or equal to 100° C. and lower than or equal to 700° C., or higher than or equal to 100° C. and lower than or equal to 500° C. In the case where the substrate 115 is provided with another device, the insulating layer 120 also functions as an interlayer insulating film. In that case, the insulating layer 120 is preferably subjected to planarization treatment such as chemical mechanical polishing (CMP) treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

In this embodiment, detailed description is given mainly on the case where the oxide semiconductor layer 130 of the transistor has a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which layers corresponding to the oxide semiconductor layer 130a and the oxide semiconductor layer 130b described in this embodiment are sequentially stacked from the insulating layer 120 side is used. In such a case, the oxide semiconductor layers 130a and 130b can be replaced with each other.

In the case where the oxide semiconductor layer 130 has a layered structure of four or more layers, for example, a structure in which another oxide semiconductor layer is added to the three-layer stack of the oxide semiconductor layer 130 described in this embodiment can be employed.

For the oxide semiconductor layer 130b, for example, an oxide semiconductor whose electron affinity (an energy difference between a vacuum level and the conduction band minimum) is higher than those of the oxide semiconductor layers 130a and 130c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 130a and 130c each contain one or more kinds of metal elements contained in the oxide semiconductor layer 130b. For example, the oxide semiconductor layers 130a and 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

Furthermore, since the oxide semiconductor layer 130a contains one or more kinds of metal elements contained in the oxide semiconductor layer 130b, an interface state is unlikely to be formed at the interface between the oxide semiconductor layers 130a and 130b, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, variations in electrical characteristics of the transistor, such as a threshold voltage, can be reduced. Moreover, the reliability of the transistor can be improved.

Since the oxide semiconductor layer 130c contains one or more kinds of metal elements contained in the oxide semiconductor layer 130b, scattering of carriers is unlikely to occur at the interface between the oxide semiconductor layers 130b and 130c, compared with the interface between the oxide semiconductor layer 130b and the gate insulating film (the insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layers 130a and 130c, for example, a material containing Al, Ti, Ga, Ge, Y, Zr, Sn, La, Ce, or Hf with a higher atomic ratio than that used for the oxide semiconductor layer 130b can be used. Specifically, the atomic ratio of any of the above metal elements in the oxide semiconductor layers 130a and 130c is 1.5 times or more, preferably 2 times or more, further preferably 3 times or more as large as that in the oxide semiconductor layer 130b. Any of the above metal elements is strongly bonded to oxygen and thus has a function of suppressing generation of an oxygen vacancy in the oxide semiconductor layers 130a and 130c. That is, an oxygen vacancy is less likely to be generated in the oxide semiconductor layers 130a and 130c than in the oxide semiconductor layer 130b.

An oxide semiconductor that can be used for each of the oxide semiconductor layers 130a to 130c preferably contains at least In or Zn. Both In and Zn are preferably contained. In order to reduce variations in electrical characteristics of the transistor containing the oxide semiconductor, the oxide semiconductor preferably contains a stabilizer in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, more preferably greater than or equal to 5 nm and less than or equal to 25 nm. The thickness of the oxide semiconductor layer 130b is greater than or equal to 3 nm and less than or equal to 200 nm, preferably greater than or equal to 5 nm and less than or equal to 150 nm, more preferably greater than or equal to 10 nm and less than or equal to 100 nm. The thickness of the oxide semiconductor layer 130c is greater than or equal to 1 nm and less than or equal to 50 nm, preferably greater than or equal to 2 nm and less than or equal to 30 nm, more preferably greater than or equal to 3 nm and less than or equal to 15 nm. In addition, the oxide semiconductor layer 130b is preferably thicker than the oxide semiconductor layer 130c.

In order that a transistor in which a channel is formed in an oxide semiconductor layer have stable electrical characteristics, it is effective to make the oxide semiconductor layer intrinsic or substantially intrinsic by reducing the concentration of impurities in the oxide semiconductor layer. The term "substantially intrinsic" refers to a state where an oxide semiconductor layer has a carrier density lower than $1\times10^{19}/cm^3$, lower than $1\times10^{15}/cm^3$, lower than $1\times10^{13}/cm^3$, or lower than $1\times10^8$ $cm^3$, and is higher than or equal to $1\times10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 130a to 130c and at interfaces between the oxide semiconductor layers.

In order to make the oxide semiconductor layer intrinsic or substantially intrinsic, the oxide semiconductor layer is controlled to have a region in which the concentration of hydrogen estimated by secondary ion mass spectrometry (SIMS) is lower than or equal to $2\times10^{20}$ atoms/$cm^3$, preferably lower than or equal to $5\times10^{19}$ atoms/$cm^3$, more preferably lower than or equal to $1\times10^{19}$ atoms/$cm^3$, still more preferably and lower than or equal to $5\times10^{18}$ atoms/$cm^3$ and is higher than or equal to $1\times10^{17}$ atoms/$cm^3$. In addition, the oxide semiconductor layer is controlled to have a region in which the concentration of nitrogen is lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$ and is higher than or equal to $5 \times 10^{16}$ atoms/cm$^3$.

The high concentration of silicon or carbon might reduce the crystallinity of the oxide semiconductor layer. In order not to lower the crystallinity of the oxide semiconductor layer, the oxide semiconductor layer is controlled to have a region in which the concentration of silicon is lower than $1 \times 10^{19}$ atoms/cm$^3$, preferably lower than $5 \times 10^{18}$ atoms/cm$^3$ and is higher than or equal to $1 \times 10^{18}$ atoms/cm$^3$. Furthermore, the oxide semiconductor layer is controlled to have a region in which the concentration of carbon is lower than $1 \times 10^{19}$ atoms/cm$^3$, preferably lower than $5 \times 10^{18}$ atoms/cm$^3$, more preferably lower than $1 \times 10^{18}$ atoms/cm$^3$ and is higher than or equal to $6 \times 10^{17}$ atoms/cm$^3$.

As described above, a transistor in which a highly purified oxide semiconductor layer is used for a channel formation region exhibits an extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating film of the transistor, an insulating film containing silicon is used in many cases; thus, it is preferable that, as in the transistor of one embodiment of the present invention, a region of the oxide semiconductor layer that serves as a channel not be in contact with the gate insulating film for the above reason. In the case where a channel is formed at the interface between the gate insulating film and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating film.

Accordingly, with the oxide semiconductor layer 130 having a layered structure including the oxide semiconductor layers 130a to 130c, a channel can be formed in the oxide semiconductor layer 130b; thus, the transistor can have high field-effect mobility and stable electrical characteristics.

In a band structure, the conduction band minimums of the oxide semiconductor layers 130a to 130c are continuous. This can be understood also from the fact that the compositions of the oxide semiconductor layers 130a to 130c are close to one another and oxygen is easily diffused among the oxide semiconductor layers 130a to 130c. Thus, the oxide semiconductor layers 130a to 130c have a continuous physical property though they have different compositions and form a stack. In the drawings, interfaces between the oxide semiconductor layers of the stack are indicated by dotted lines.

The oxide semiconductor layer 130 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear because of a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layers 130a and 130c, and an In—Ga—Zn oxide whose atomic ratio of In to Ga and Zn is 1:1:1, 2:1:3, 5:5:6, or 3:1:2 can be used for the oxide semiconductor layer 130b. In each of the oxide semiconductor layers 130a to 130c, the proportion of each atom in the atomic ratio varies within a range of ±40% as a margin.

The oxide semiconductor layer 130b of the oxide semiconductor layer 130 serves as a well, so that a channel is formed in the oxide semiconductor layer 130b. Since the conduction band minimums are continuous, the oxide semiconductor layer 130 can also be referred to as a U-shaped well. Furthermore, a channel formed to have such a structure can also be referred to as a buried channel.

Note that trap levels due to impurities or defects might be formed in the vicinity of the interface between an insulating layer such as a silicon oxide film and each of the oxide semiconductor layers 130a and 130c. The oxide semiconductor layer 130b can be distanced away from the trap levels owing to the existence of the oxide semiconductor layers 130a and 130c.

However, when the energy differences between the conduction band minimum of the oxide semiconductor layer 130b and the conduction band minimum of each of the oxide semiconductor layers 130a and 130c are small, an electron in the oxide semiconductor layer 130b might reach the trap level by passing over the energy differences. When the electron is trapped in the trap level, negative charge is generated at the interface with the insulating layer, so that the threshold voltage of the transistor is shifted in the positive direction.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. It is preferable to use Ti, which is particularly easily bonded to oxygen, or W, which has a high melting point and thus allows subsequent processes to be performed at relatively high temperatures, as a typical example. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor layer. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a layered structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have larger thickness than the insulating layer 160 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to these examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide increases in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typified by greater than or equal to $1 \times 10^{18}$ molecules/cm$^3$ and less than or equal to $5 \times 10^{19}$ molecules/cm$^3$. Note that the amount of released ammonia is the amount of ammonia released by heat treatment with which the surface temperature of the film becomes higher than or equal to 50° C. and lower than or equal to 650° C., and preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. As a typical example, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 2, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 2. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120. Furthermore, oxygen contained in the aluminum oxide film can be diffused into the oxide semiconductor layer.

Furthermore, the insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 107 to 112 in one embodiment of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and an effective channel width is increased, leading to a further increase in on-state current.

Furthermore, in the transistor in one embodiment of the present invention in which the oxide semiconductor layer 130 has a two-layer structure or a three-layer structure, since the oxide semiconductor layer 130b where a channel is formed is provided over the oxide semiconductor layer 130a, an interface state is less likely to be formed. In the transistor in one embodiment of the present invention in which the oxide semiconductor layer 130 has a three-layer structure, since the oxide semiconductor layer 130b is positioned at the middle of the three-layer structure, the influence of an impurity that enters from upper and lower layers on the oxide semiconductor layer 130b can also be eliminated. Therefore, the transistor can achieve not only the increase in on-state current but also stabilization of the threshold voltage and a reduction in S value (subthreshold value). Thus, current at a gate voltage VG of 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced CVD, such films may be formed by another method such as thermal CVD. Examples of the thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is absorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed with a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed with a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed with a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed with a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor film, e.g., an In—Ga—Zn—O film is formed with a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed using these gases. Although an $H_2O$ gas which is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

The structures described in this embodiment can be used in appropriate combination with any of the structures described in the other embodiments.

Embodiment 4

A structure of an oxide semiconductor film that can be used in one embodiment of the present invention will be described below.

In this specification, the term "parallel" indicates that the angle formed between two straight lines is greater than or equal to −10° and less than or equal to 10°, and accordingly also includes the case where the angle is greater than or equal to −5° and less than or equal to 5°. Furthermore, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

An oxide semiconductor film is classified roughly into a single crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer has a configuration reflecting unevenness of a surface over which the CAAC-OS film is formed (hereinafter, the surface is referred to as a formation surface) or a top surface of the CAAC-OS film, and is arranged parallel to the formation surface or the top surface of the CAAC-OS film.

While in the high-resolution planar TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that in structural analysis of the CAAC-OS film including an InGaZnO$_4$ crystal by an out-of-plane method, another peak may appear when 2θ is around 36°, in addition to the peak at 2θ of around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film with a low impurity concentration. The impurity is an element other than the main components of the oxide semiconductor film, such as hydrogen, carbon, silicon, or a transition metal element. An element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. A heavy metal such as iron or nickel, argon, carbon dioxide, or the like has a large atomic radius (or molecular radius), and thus disturbs the atomic arrangement of the oxide semiconductor film and decreases crystallinity. Additionally, the impurity contained in the oxide semiconductor film might serve as a carrier trap or a carrier generation source.

The CAAC-OS film is an oxide semiconductor film having a low density of defect states. For example, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have low carrier density. Thus, a transistor including the oxide semiconductor film rarely has a negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. An electric charge trapped by the carrier traps in the oxide semiconductor film takes a long time to be released. The trapped electric charge may behave like a fixed electric charge. Thus, the transistor which includes the oxide semiconductor film having a high impurity concentration and a high density of defect states might have unstable electrical characteristics.

In a transistor using the CAAC-OS film, change in electric characteristics of the transistor due to irradiation with visible light or ultraviolet light is small.

Next, a microcrystalline oxide semiconductor film is described.

A microcrystalline oxide semiconductor film has a region in which a crystal part is observed and a region in which a crystal part is not observed clearly in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS, for example, a crystal grain boundary is not clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is analyzed by an out-of-plane method with an XRD apparatus using an X-ray beam having a diameter larger than the size of a crystal part, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a crystal part (the electron diffraction is also referred to as selected-area electron diffraction). Meanwhile, spots appear in a nanobeam electron diffraction pattern of the nc-OS film when an electron beam having a probe diameter close to or smaller than the size of a crystal part is applied. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film is described.

The amorphous oxide semiconductor film is an oxide semiconductor film having disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

An oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In some cases, growth of the crystal part occurs due to the crystallization of the a-like OS film, which is induced by a slight amount of electron beam employed in the TEM observation. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes having a distance therebetween of from 0.28 nm to 0.30 nm is regarded as corresponding to the a-b plane of the $InGaZnO_4$ crystal, focusing on the lattice fringes in the high-resolution TEM image.

Note that an oxide semiconductor film may be a stacked film including two or more films of an amorphous oxide semiconductor film, an a-like OS film, a microcrystalline oxide semiconductor film, and a CAAC-OS film, for example.

The structures described in this embodiment can be used in appropriate combination with any of the structures described in the other embodiments.

Embodiment 5

In this embodiment, an example of a package including the imaging device of one embodiment of the present invention will be described.

Figure 44A:
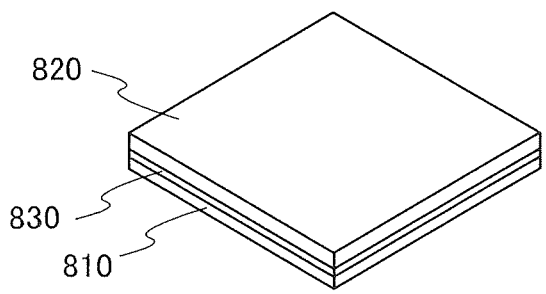
FIGS. 44A to 44D are perspective views and a cross-sectional view illustrating a package including an imaging device.

FIG. 44A is an external perspective view of the package including the imaging device of one embodiment of the present invention. The package includes an interposer 810 to which the imaging device is fixed, a cover glass 820, and an adhesive 830 for bonding the interposer 810 and the cover glass 820.

Figure 44B:
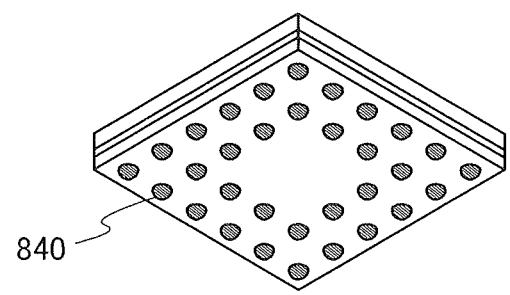

FIG. 44B is an external perspective view of a rear surface side of the package. The package has what is called a ball grid array (BGA) structure including solder balls as bumps 840 on the rear surface side. Instead of the BGA, a land grid array (LGA), a pin grid array (PGA), or the like may be employed.

Figure 44C:
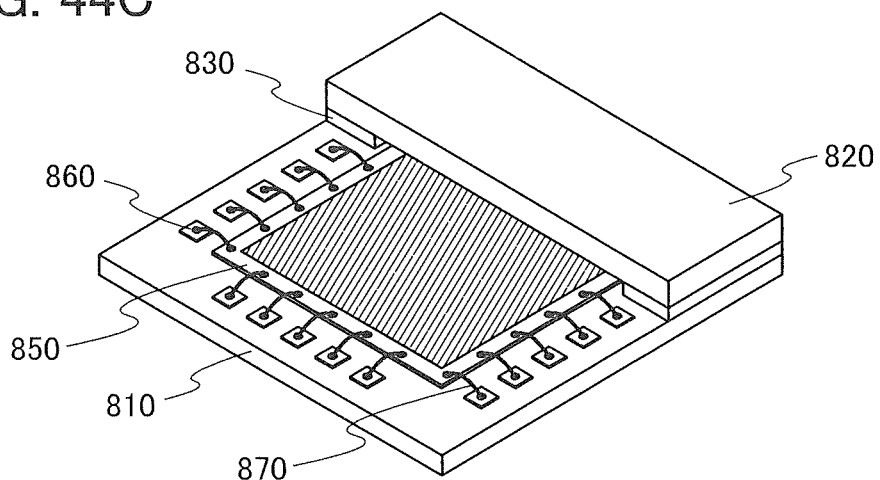
Figure 44D:
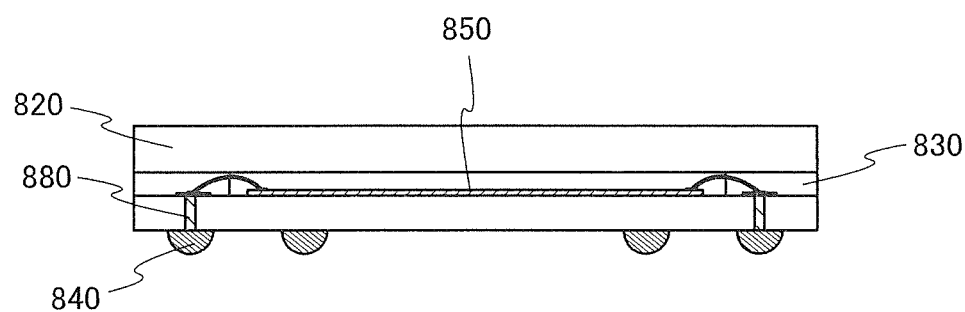

FIG. 44C is a perspective view of the package in which the cover glass 820 and the adhesive 830 are partly omitted. FIG. 44D is a cross sectional view of a given position parallel to a side of the package. Electrode pads 860 are formed over the interposer 810, and the electrode pads 860 and the bumps 840 are electrically connected via through holes 880 formed in the interposer 810. The electrode pads 860 are each electrically connected to an electrode of an imaging device 850 by a wire 870.

The use of the imaging device of one embodiment of the present invention for a package with the above-described structure allows easy mounting; thus, the imaging device can be incorporated in various electronic devices.

The structures described in this embodiment can be used in appropriate combination with any of the structures described in the other embodiments.

Embodiment 6

An imaging device of one embodiment of the present invention or a semiconductor device including the imaging device can be used for display devices, personal computers, or image reproducing devices provided with recording media (typically, devices that reproduce the content of recording media such as digital versatile discs (DVD) and have displays for displaying the reproduced images). Furthermore, as electronic devices that can include the imaging device of one embodiment of the present invention or the semiconductor device including the imaging device, cellular phones, game machines including portable game machines, portable information e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 45A to 45F illustrate specific examples of these electronic devices.

Figure 45A:
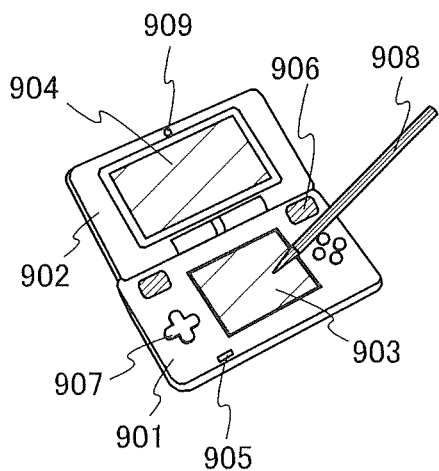
FIGS. 45A to 45F each illustrate an electronic device.

FIG. 45A illustrates a portable game machine, which includes a housing 901, a housing 902, a display portion 903, a display portion 904, a microphone 905, speakers 906, an operation key 907, a stylus 908, a camera 909, and the like. Although the portable game machine in FIG. 45A has the two display portions 903 and 904, the number of display portions in the portable game machine is not limited to two. The imaging device of one embodiment of the present invention can be used for the camera 909.

Figure 45B:
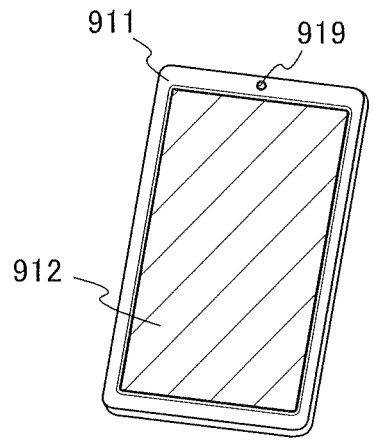

FIG. 45B illustrates a portable information terminal, which includes a housing 911, a display portion 912, a camera 919, and the like. The touch panel function of the display portion 912 enables input and output of information. The imaging device of one embodiment of the present invention can be used for the camera 919.

Figure 45C:
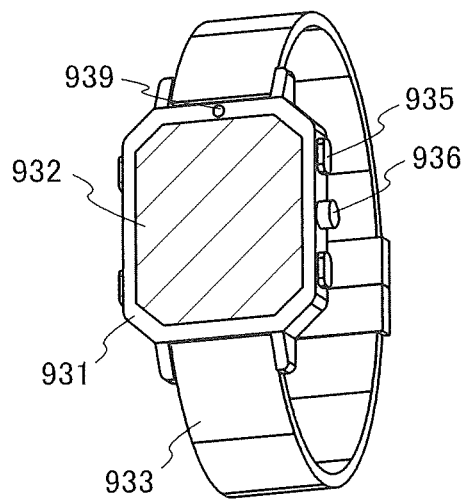

FIG. 45C illustrates a wrist-watch-type information terminal which includes a housing 931, a display portion 932, a wristband 933, an operation button 935, a crown 936, a camera 939, and the like. The display portion 932 may be a touch panel. The imaging device of one embodiment of the present invention can be used for the camera 939.

Figure 45D:
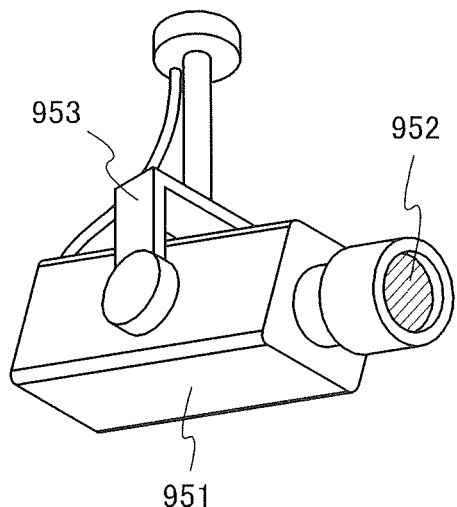

FIG. 45D illustrates a monitoring camera, which includes a housing 951, a lens 952, a support portion 953, and the like. The imaging device of one embodiment of the present invention can be provided in a focus position of the lens 952.

Figure 45E:
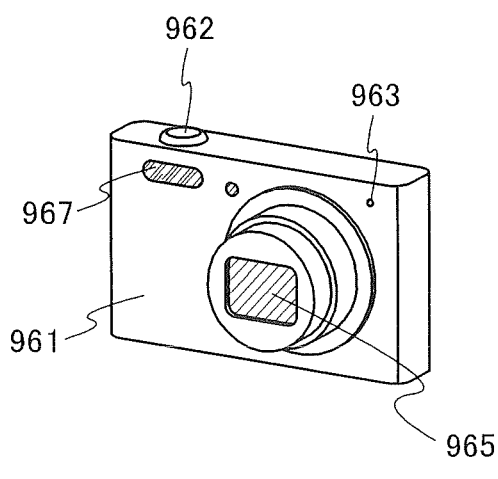

FIG. 45E illustrates a digital camera, which includes a housing 961, a shutter button 962, a microphone 963, a light-emitting portion 967, a lens 965, and the like. The imaging device of one embodiment of the present invention can be provided in a focus position of the lens 965.

Figure 45F:
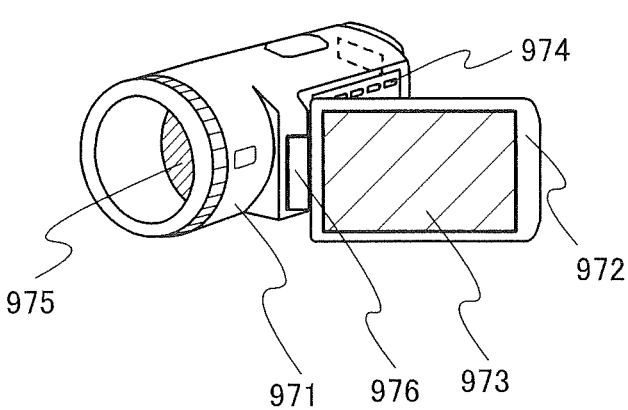

FIG. 45F illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The first housing 971 and the second housing 972 are connected to each other with the joint 976, and an angle between the first housing 971 and the second housing 972 can be changed with the joint 976. Images displayed on the display portion 973 may be switched in accordance with the angle between the first housing 971 and the second housing 972 at the joint 976. The imaging device of one embodiment of the present invention can be provided in a focus position of the lens 975.

This embodiment can be combined with any of the other embodiments in this specification as appropriate.

This application is based on Japanese Patent Application serial no. 2015-080201 filed with Japan Patent Office on Apr. 9, 2015, the entire contents of which are hereby incorporated by reference.

What is claimed is:

1. An imaging device comprising:
a first layer comprising a pixel array comprising a first pixel and a second pixel;
a second layer comprising:
a memory array comprising a first memory element and a second memory element;
a first analog processing circuit; and
a second analog processing circuit,
wherein the first pixel and the second pixel are electrically connected to the first analog processing circuit through a first wiring,
wherein the first memory element and the second memory element are electrically connected to the first analog processing circuit through a second wiring,
wherein the first memory element is electrically connected to the second analog processing circuit through a third wiring,
wherein the second memory element is electrically connected to the second analog processing circuit through a fourth wiring, and
wherein the first layer and the second layer overlap each other.

2. The imaging device according to claim 1,
wherein the first pixel and the second pixel each comprise a first transistor, a second transistor, a third transistor, a first capacitor, and a photoelectric conversion element,
wherein one electrode of the photoelectric conversion element is electrically connected to one of a source electrode and a drain electrode of the first transistor,
wherein the other of the source electrode and the drain electrode of the first transistor is electrically connected to one of a source electrode and a drain electrode of the second transistor,
wherein the other of the source electrode and the drain electrode of the first transistor is electrically connected to a gate electrode of the third transistor, and
wherein the other of the source electrode and the drain electrode of the first transistor is electrically connected to one electrode of the first capacitor.

3. The imaging device according to claim 2,
wherein the first memory element and the second memory element each comprise a fourth transistor, a fifth transistor, and a second capacitor,
wherein one of a source electrode and a drain electrode of the fourth transistor is electrically connected to a gate electrode of the fifth transistor, and
wherein the gate electrode of the fifth transistor is electrically connected to one electrode of the second capacitor.

4. The imaging device according to claim 3,
wherein the first transistor, the second transistor, the third transistor, and the fourth transistor each comprise an oxide semiconductor in a channel formation region,
wherein the oxide semiconductor comprises In, Zn, and M, and
wherein M is Al, Ti, Ga, Sn, Y, Zr, La, Ce, Nd, or Hf.

5. The imaging device according to claim 1,
wherein the first analog processing circuit comprises a first transistor,
wherein the second analog processing circuit comprises a second transistor, and
wherein each of the first transistor and the second transistor comprises an oxide semiconductor in a channel formation region.

6. The imaging device according to claim 1, further comprising a photoelectric conversion element in each of the first pixel and the second pixel,
wherein the photoelectric conversion element comprises selenium or a compound containing selenium in a photoelectric conversion layer.

7. The imaging device according to claim 1, wherein the first analog processing circuit is shielded from light by a light-blocking layer.

8. The imaging device according to claim 1, further comprising an insulating layer,
wherein the insulating layer comprises any one of aluminum oxide, aluminum oxynitride, gallium oxide, gallium oxynitride, yttrium oxide, yttrium oxynitride, hafnium oxide, hafnium oxynitride, and yttria-stabilized zirconia.

9. An electronic device comprising:
the imaging device according to claim 1; and
a display device.

10. An imaging device comprising:
a first layer comprising:
 a pixel array comprising a first pixel and a second pixel; and
 a first row decoder;
a second layer comprising:
 a memory array comprising a first memory element and a second memory element;
 a first analog processing circuit;
 a second analog processing circuit; and
 a second row decoder,
wherein the first pixel and the second pixel are electrically connected to the first row decoder,
wherein the first memory element and the second memory element are electrically connected to the second row decoder,
wherein the first pixel and the second pixel are electrically connected to the first analog processing circuit through a first wiring,
wherein the first memory element and the second memory element are electrically connected to the first analog processing circuit through a second wiring,
wherein the first memory element is electrically connected to the second analog processing circuit through a third wiring,
wherein the second memory element is electrically connected to the second analog processing circuit through a fourth wiring, and
wherein the first layer and the second layer overlap each other.

11. The imaging device according to claim 10,
wherein the first pixel and the second pixel each comprise a first transistor, a second transistor, a third transistor, a first capacitor, and a photoelectric conversion element,
wherein one electrode of the photoelectric conversion element is electrically connected to one of a source electrode and a drain electrode of the first transistor,
wherein the other of the source electrode and the drain electrode of the first transistor is electrically connected to one of a source electrode and a drain electrode of the second transistor,
wherein the other of the source electrode and the drain electrode of the first transistor is electrically connected to a gate electrode of the third transistor, and
wherein the other of the source electrode and the drain electrode of the first transistor is electrically connected to one electrode of the first capacitor.

12. The imaging device according to claim 11,
wherein the first memory element and the second memory element each comprise a fourth transistor, a fifth transistor, and a second capacitor,
wherein one of a source electrode and a drain electrode of the fourth transistor electrically connected to a gate electrode of the fifth transistor, and
wherein the gate electrode of the fifth transistor is electrically connected to one electrode of the second capacitor.

13. The imaging device according to claim 12,
wherein the first transistor, the second transistor, the third transistor, and the fourth transistor each comprise an oxide semiconductor in a channel formation region,
wherein the oxide semiconductor comprises In, Zn, and M, and
wherein M is Al, Ti, Ga, Sn, Y, Zr, La, Ce, Nd, or Hf.

14. The imaging device according to claim 10,
wherein the first analog processing circuit comprises a first transistor,
wherein the second analog processing circuit comprises a second transistor, and
wherein each of the first transistor and the second transistor comprises an oxide semiconductor in a channel formation region.

15. The imaging device according to claim 10, further comprising a photoelectric conversion element in each of the first pixel and the second pixel,
wherein the photoelectric conversion element comprises selenium or a compound containing selenium in a photoelectric conversion layer.

16. The imaging device according to claim 10, wherein the first analog processing circuit is shielded from light by a light-blocking layer.

17. The imaging device according to claim 10, further comprising an insulating layer,
wherein the insulating layer comprises any one of aluminum oxide, aluminum oxynitride, gallium oxide, gallium oxynitride, yttrium oxide, yttrium oxynitride, hafnium oxide, hafnium oxynitride, and yttria-stabilized zirconia.

18. An electronic device comprising:
the imaging device according to claim 10; and
a display device.

* * * * *